(12) United States Patent
Enda et al.

(10) Patent No.: US 7,539,055 B2
(45) Date of Patent: May 26, 2009

(54) NON-VOLATILE SEMICONDUCTOR MEMORY AND METHOD FOR CONTROLLING A NON-VOLATILE SEMICONDUCTOR MEMORY

(75) Inventors: Toshiyuki Enda, Zushi (JP); Hiroyoshi Tanimoto, Yokohama (JP); Naoki Kusunoki, Fuchu (JP); Nobutoshi Aoki, Yokohama (JP); Fumitaka Arai, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/763,204

(22) Filed: Jun. 14, 2007

(65) Prior Publication Data

US 2007/0237002 A1 Oct. 11, 2007

Related U.S. Application Data

(62) Division of application No. 11/396,507, filed on Apr. 5, 2006.

(30) Foreign Application Priority Data

| Apr. 6, 2005 | (JP) | ............................ P2005-110373 |
| Apr. 12, 2005 | (JP) | ............................ P2005-115013 |

(51) Int. Cl.
  *G11C 16/04* (2006.01)
(52) U.S. Cl. ............................ 365/185.18; 365/185.17; 365/185.27
(58) Field of Classification Search ............ 365/185.18, 365/185.17, 185.22, 185.27, 185.29
See application file for complete search history.

(56) References Cited

U.S. PATENT DOCUMENTS

| 5,760,442 | A | 6/1998 | Shigyo et al. |
| 6,051,452 | A * | 4/2000 | Shigyo et al. ............... 438/151 |
| 6,525,968 | B2 * | 2/2003 | Saeki et al. ............ 365/185.22 |
| 6,784,006 | B2 | 8/2004 | Tanimoto et al. |
| 6,953,965 | B2 * | 10/2005 | Goda et al. ................. 257/316 |
| 7,079,437 | B2 * | 7/2006 | Hazama et al. ........ 365/210.12 |
| 2005/0179079 | A1 * | 8/2005 | Wu ............................ 257/316 |
| 2005/0265079 | A1 * | 12/2005 | Shirota ................. 365/185.21 |
| 2008/0048237 | A1 * | 2/2008 | Iwata ......................... 257/314 |

FOREIGN PATENT DOCUMENTS

| JP | 7-94612 | 4/1995 |
| JP | 8-153880 | 6/1996 |
| JP | 9-260617 | 10/1997 |
| JP | 2003-121489 | 4/2003 |

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A non-volatile semiconductor memory includes a plurality of memory cell transistors, each of the plurality of memory cell transistors includes: a source region having a first conductivity type and in contact with a buried insulating layer on a supporting substrate; a drain region having the first conductivity type and in contact with the buried insulating layer; and a channel region having the first conductivity type and provided between the source region and the drain region so as to contact the buried insulating layer, wherein a thickness of the channel region is more than one nm and not more than a value obtained by adding seven nm to a half value of a gate length of the memory cell transistor.

6 Claims, 56 Drawing Sheets

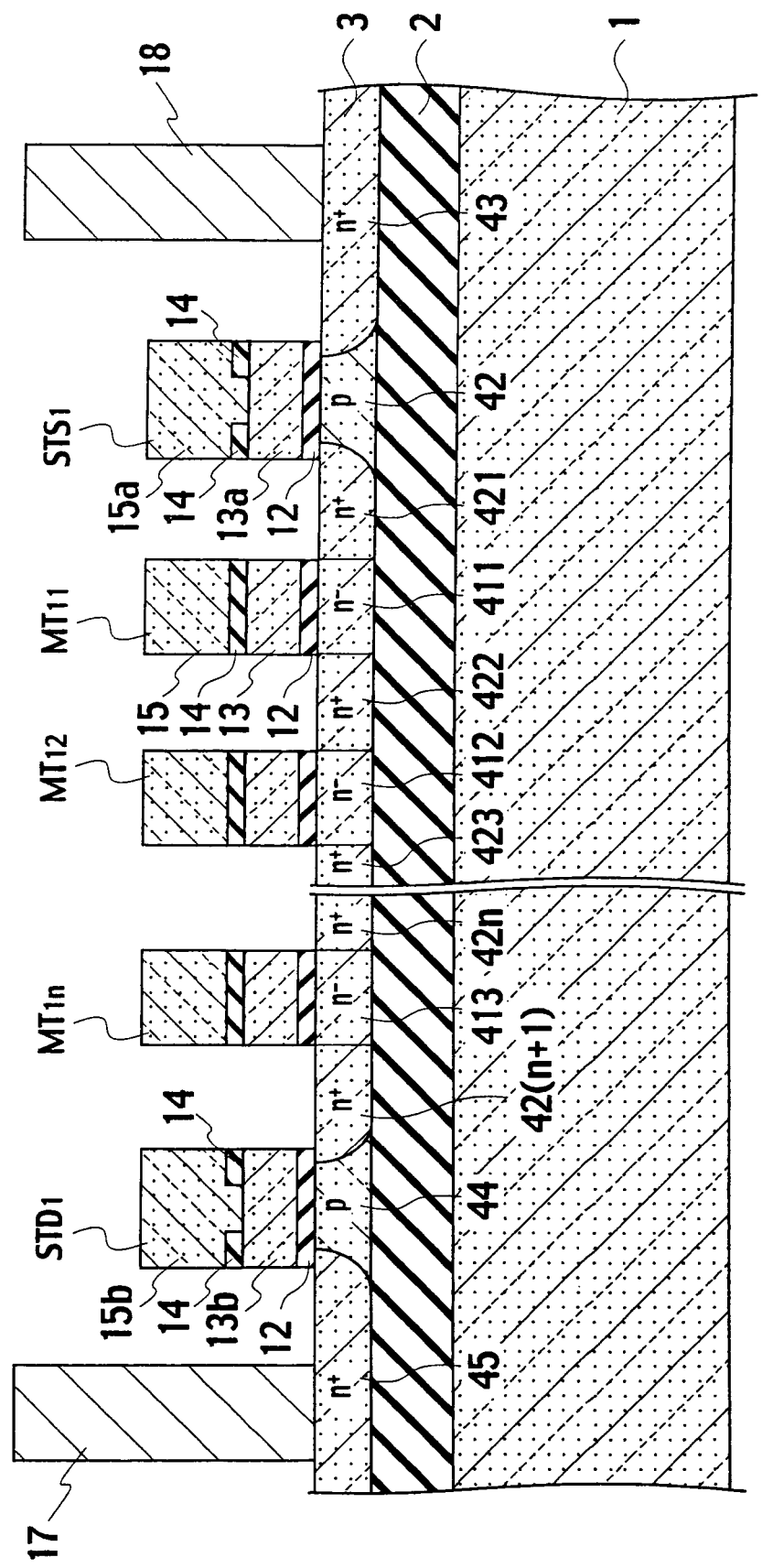

NON-VOLATILE SEMICONDUCTOR MEMORY AND METHOD FOR CONTROLLING A NON-VOLATILE SEMICONDUCTOR MEMORY

CROSS REFERENCE TO RELATED APPLICATIONS

The application is a divisional of and claims the benefit of priority under 35 USC § 120 from U.S. Ser. No. 11/396,507, filed Apr. 5, 2006, and claims the benefit of priority from the prior Japanese Patent Applications No. P2005-110373, filed on Apr. 6, 2005 and No. P2005-115013, filed on Apr. 12, 2005; the entire contents of which are incorporated herein by reference.

BACKGROUND OF THE INVENTION

1. Field of the Invention

This present invention relates to a non-volatile semiconductor memory, more particularly, to a non-volatile semiconductor memory and a method for controlling a non-volatile semiconductor memory using Silicon On Insulator (SOI) technology.

2. Description of the Related Art

A NAND type flash electrically erasable programmable read-only memory (EEPROM) is known as a type of non-volatile semiconductor memory. The NAND type flash EEPROM experiences fluctuations in gate threshold voltage, due to the influence of parasitic capacitance, in the element isolation region between memory cell transistors and parasitic capacitance between an interconnect and a substrate, and the like.

In order to reduce the fluctuation in the gate threshold voltage due to the influence of the parasitic capacitance in the element isolation region and the parasitic capacitance between the interconnect and the substrate, a NAND flash EEPROM has been investigated which employs SOI technology. In this technology, a semiconductor layer (SOI layer) is arranged on a buried insulating layer (buried oxide (BOX) layer), and serves as an active layer.

According to the NAND flash EEPROM employing the SOI technology, the memory cell transistors adjacent to one another in the row direction are isolated from one another by an element isolation insulating film which is buried as deep as the buried insulating layer. This structure reduces the parasitic capacitance in the element isolation region.

In addition, since the SOI layer is formed on the buried insulating layer, the parasitic capacitance between the interconnect and the substrate can be reduced, and hence, the fluctuation in the gate threshold voltage can be reduced.

As memory cell transistors have been miniaturized, an interval between the source region and the drain region of such a memory cell transistor has become so narrower that influence of the short channel effect has increased in the NAND flash EEPROM employing the SOI technology.

SUMMARY OF THE INVENTION

An aspect of the present invention inheres in a non-volatile semiconductor memory including a plurality of memory cell transistors, each of the plurality of memory cell transistors including: a source region having a first conductivity type and in contact with a buried insulating layer on a supporting substrate; a drain region having the first conductivity type and in contact with the buried insulating layer; and a channel region having the first conductivity type and provided between the source region and the drain region so as to contact the buried insulating layer, wherein a thickness of the channel region is more than one nm and not more than a value obtained by adding seven nm to a half value of a gate length of the memory cell transistor.

Another aspect of the present invention inheres in a non-volatile semiconductor memory including: a buried insulating layer; a plurality of memory cell transistors provided in a column direction, each of the memory cell transistors including a channel region having a first conductivity type and in contact with the buried insulating layer; a first select gate transistor coupled with a first end of a arrangement of the plurality of memory cell transistors, the first select gate transistor including: a channel region in contact with the buried insulating layer and having a second conductivity type; and a source region in contact with the buried insulating layer and having the first conductivity type; a source line contact region electrically connected to the channel region of the first select gate transistor and having an impurity concentration of the second conductivity type that is higher than the channel region of the first select gate transistor; and a source line contact plug electrically connected to the source region and the source line contact region.

Further aspect of the present invention inheres in a method for controlling a non-volatile semiconductor memory including a plurality of memory cell transistors including: a source region in contact with a buried insulating layer on a supporting substrate; a drain region in contact with the buried insulating layer and having a conductivity type that is the same as the source region; and a channel region provided between the source region and the drain region so as to contact the buried insulating layer and having the conductivity type that is the same as the source region, the method including: applying a substrate voltage less than 0 V to the supporting substrate during a reading operation if the channel region has n-type; and applying another substrate voltage more than 0V to the supporting substrate during the reading operation if the channel region has p-type.

Still further aspect of the present invention inheres in a method for controlling a non-volatile semiconductor memory including a plurality of memory cell transistors and first and second select gate transistors coupled with both ends of an arrangement of the plurality of memory cell transistors, each of the plurality of memory cell transistors and first and second select gate transistors including a channel region in contact with a buried insulating layer provided on a supporting substrate, the method including: applying a voltage to a plurality of select gate lines respectively connected to the first and second select gate transistors, that is higher than a voltage applied to a plurality of word lines respectively connected to the plurality of memory cell transistors and applying a voltage to a bit line and a source line respectively connected to the first and second select gate transistors, respectively, that is higher than the voltage applied to the select gate lines during an erasing operation, if the channel regions of the first and second select gate transistors have p-type; or applying a voltage to the plurality of select gate lines that is lower than a voltage applied to the word lines and applying a voltage to the bit line and source line, respectively, that is lower than the voltage applied to the select gate lines during the erasing operation, if the channel regions of the first and second select gate transistors have n-type.

Still further aspect of the present invention inheres in a method for controlling a non-volatile semiconductor memory including a plurality of memory cell transistors and first and second select gate transistors couple with both ends of an arrangement of the plurality of memory cell transistors, each of the plurality of memory cell transistors and first and second select gate transistors including a channel region in contact with a buried insulating layer provided on a supporting substrate, the method including: applying a voltage to a bit line and a source line electrically connected to the plurality of memory cell transistors, respectively, that is higher than a voltage applied to plurality of a word lines respectively connected to the plurality of memory cell transistors and applying a voltage to the supporting substrate that is higher than the voltage applied to the bit line and source line during an erasing operation, if the channel regions of the plurality of memory cell transistors have n-type; or applying a voltage to the bit line and source line that is lower than a voltage applied to the word lines and applying a voltage to the supporting substrate that is lower than the voltage applied to the bit line and source line during the erasing operation, if the channel regions of the plurality of memory cell transistors have p-type.

BRIEF DESCRIPTION OF DRAWINGS

FIG. 60 is is a cross-sectional view in a column direction showing a cell array of a non-volatile semiconductor memory according to a relative example.

DETAILED DESCRIPTION OF THE INVENTION

Figure 1:
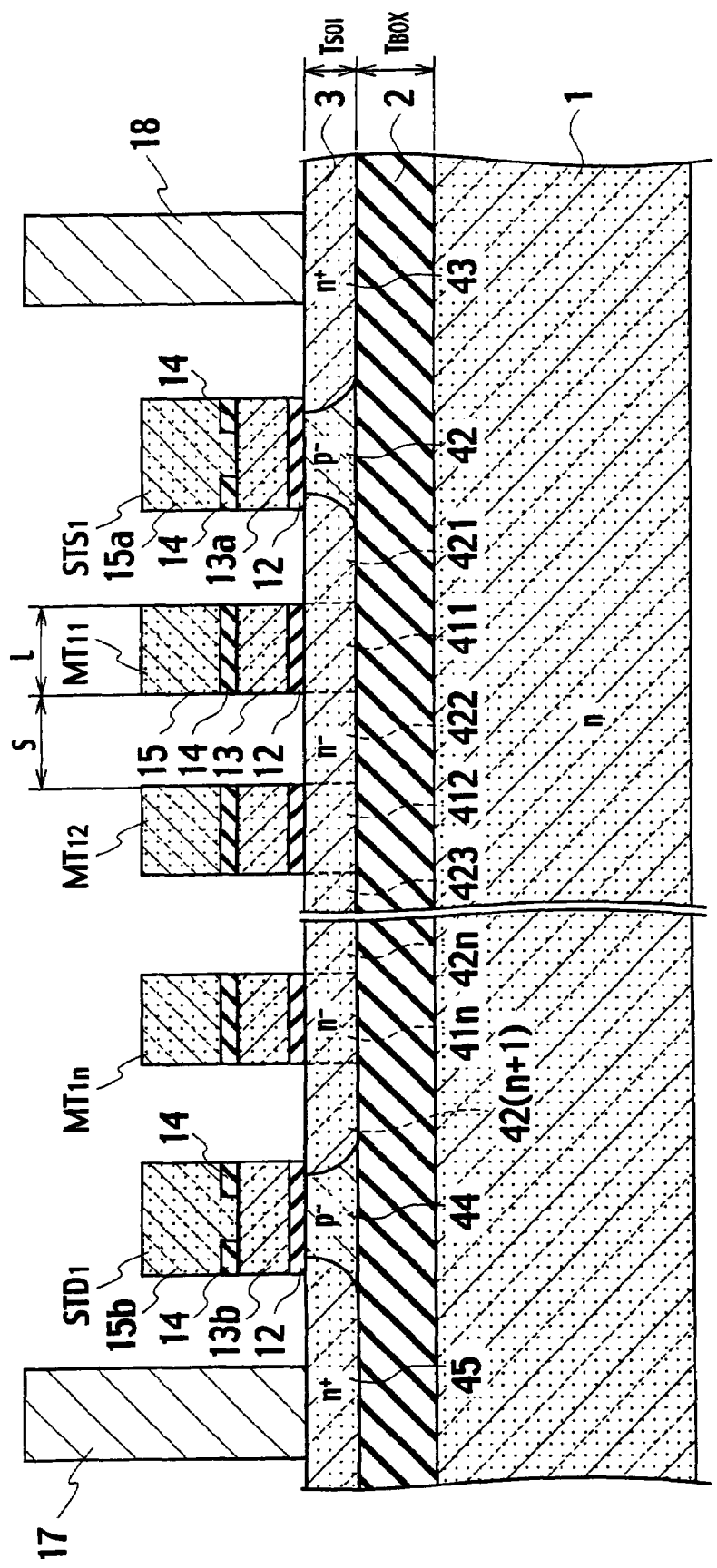
FIG. 1 is a cross-sectional view in a column direction showing an example of a cell array of a non-volatile semiconductor memory according to a first embodiment of the present invention.

In a NAND flash memory manufactured using SOI technology, consideration has been given to the use of depletion mode (D-mode) MIS transistors as memory cell transistors. By use of the depletion mode MIS transistors, channels thereof are in a depletion state when electrons are stored in floating gate electrodes. As a result the influence of short channel effects can be reduced.

However, structure parameters and values of operation voltages have not been regulated in each non-volatile semiconductor memory. For this reason, writing, reading and erasing operations are not performed properly in some cases, depending on structure parameters and operation voltages.

The simultaneous erasing is an essential function for a NAND flash memory. In the NAND flash memory using a bulk substrate, when a positive voltage (for example, 18 V) is applied to each p-type well, bit lines and a source line, the potentials in channel region portions of memory cells become equalized. In this regard, a strong electric field is applied between each floating gate electrode and each channel region. As a result, electrons stored in the floating gate electrode move to the channel region. Accordingly, memory signals are simultaneouslly erased.

On the other hand, a NAND flash memory having a SOI structure does not include electrodes corresponding to p-type wells, as in the case of the NAND flash memory using a bulk substrate. Accordingly, it is not possible to carry out similar simultaneous erasing as in the case of the NAND flash memory using a bulk substrate. In the case of the NAND flash memory having a SOI structure, even though a positive voltage (for example, 18 V) is applied to each of the bit and source lines, an opposite bias is applied to a pn junction between an n-type semiconductor region, which is connected to a bit line or a source line, and a p-type channel region of a select gate transistor. Accordingly, in some cases, a positive voltage applied to the bit line or the source line does not reach each of the channel regions of the memory cells. In other words, with respect to the NAND flash memory having a SOI structure, it has been difficult to carry out simultaneous erasing since a strong electric field is incapable of being applied to a channel region and a floating gate electrode of a memory cell.

Various embodiments of the present invention will be described below with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the following descriptions, numerous specific details are set fourth such as specific signal values, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

In the following first and second embodiments of the present invention, the "first conductivity type" and "second conductivity type" are mutual opposites. In other words, when the first conductivity type is an n-type then the second conductivity type will be a p-type, and vice versa. In the following descriptions, the first conductivity type as an n-type and the second conductivity type as a p-type will be described. However, the first conductivity type as a p-type and the second conductivity type as n-type is also contemplated. When n-type and p-type conductivities are changed to the opposite type, reference characters of applied voltage are also opposite and therefore a mutual relationship of voltage become oposite.

FIRST EMBODIMENT

A non-volatile semiconductor memory according to a first embodiment of the present invention is a NAND flash memory including memory cell transistors $MT_{11}$ to $MT_{1n}$ which include source regions 421 to 42n, drain regions 422 to 42(n+1), and channel regions 411 to 41n. All of the foregoing regions are single conductivity type ($n^-$-type) regions, as shown in FIG. 1. Each of the source, drain and channel regions are provided in a semiconductor layer (SOI layer) 3 on a buried insulating layer (BOX layer) 2 on a supporting substrate 1 so that these regions are in contact with the buried insulating layer 2.

The thickness $T_{SOI}$ of each of the channel regions 411 to 41n is more than one nm and not more than a value obtained by adding seven nm to a half thickness value of the gate length L of the memory cell transistors $MT_{11}$ to $MT_{1n}$.

Figure 2:
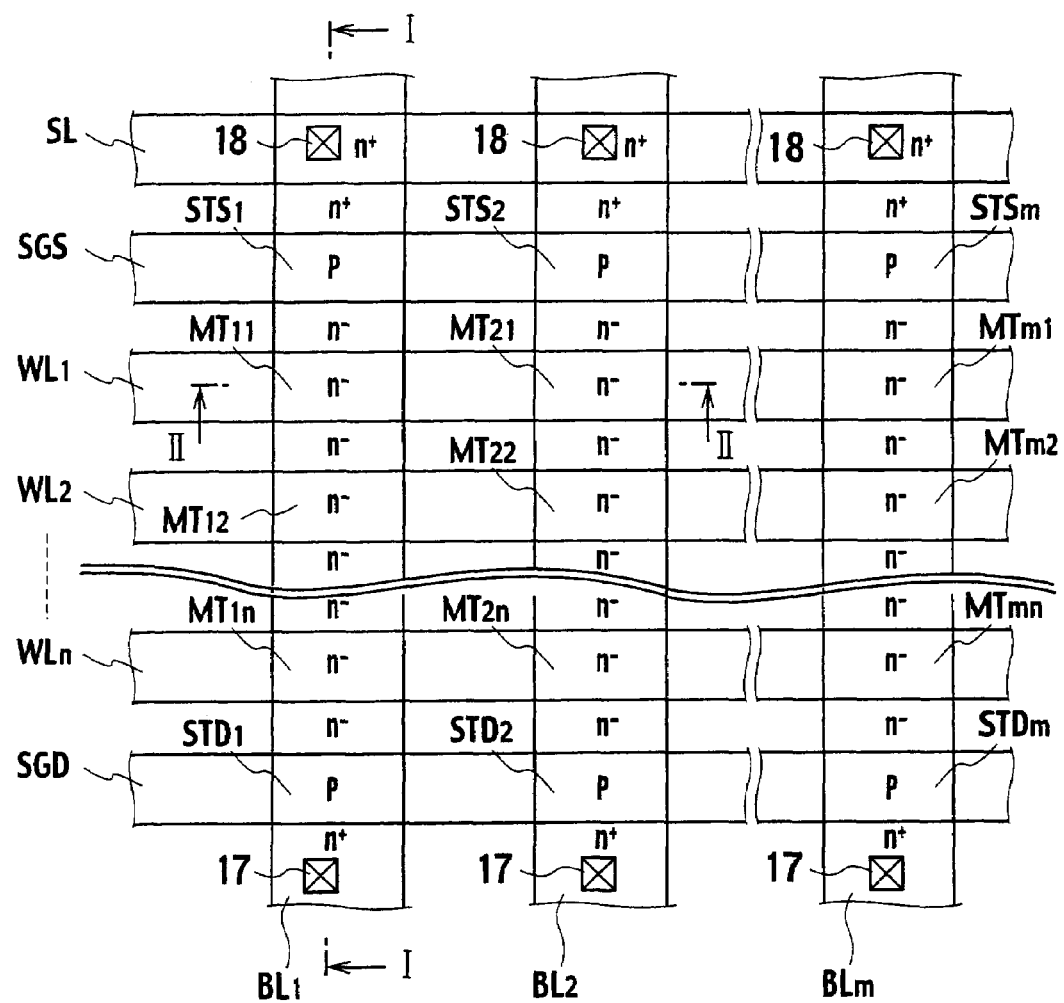
FIG. 2 is a plan view showing an example of the cell array of the non-volatile semiconductor memory according to the first embodiment of the present invention.

FIG. 1 shows a cross-sectional view of a surface of the non-volatile semiconductor memory cut along the I-I line in a column direction in FIG. 2. In FIG. 1, for example, n (n is an integer) memory cell transistors $MT_{11}$ to $MT_{1n}$ are adjacently arranged in the column direction. The memory cell transistors $MT_{11}$ to $MT_{1n}$ include a stacked gate structure in which a floating gate electrode 13 and a control gate electrode 15 are stacked, and a depletion mode MIS transistor is an example thereof.

The memory cell transistors $MT_{11}$ to $MT_{1n}$ include first conductivity type ($n^-$-type) source and drain regions 421 to 42(n+1) respectively. The source and drain regions are shared by the memory cell transistors $MT_{11}$ to $MT_{1n}$, adjacent to each other in the column direction. "Shared region" refers to a common region which functions in a way that a source region for a memory cell transistor serves as a drain region for an adjacent memory cell transistor.

For example, the drain region 422 of one memory cell transistor $MT_{11}$ serves as the source region 422 of an adjacent memory cell transistor $MT_{12}$. The source regions 421 to 42n, the channel regions 411 to 41n, and the drain regions 422 to 42(n+1) extend sequentially in a single column direction, and a plurality of columns thereof is arrayed in parallel. Source regions, channel regions, and drain regions in one column are separated from those in the other adjacent columns of the memory cell transistors.

A floating gate electrode 13 is disposed on each of the channel regions 411 to 41n, which are interposed between the adjacent source and drain regions 421 to 42(n+1), with a gate insulating film (tunnel oxide film) 12 interposed there between. A control gate electrode 15 is disposed on each of the floating gate electrodes 13 with an interelectrode insulating film 14 interposed there between.

A silicon oxide film ($SiO_2$ film), silicon nitride ($Si_3N_4$), tantalum oxide ($Ta_2O_5$), titanium oxide ($TiO_2$), alumina ($Al_2O_3$), zirconium oxide ($ZrO_2$) and the like can be used as a material for the gate insulating film 12.

$Si_3N_4$, $Ta_2O_5$, $TiO_2$, $Al_2O_3$, $ZrO_2$, oxide/nitride/oxide (ONO), phosphor silicate glass (PSG), boron phosphor silicate glass (BPSG), silicon oxide nitride (SiON), barium titanate ($BaTiO_3$), silicon oxide fluoride ($SiO_xF_x$), and organic resins such as polyimide can be used as materials for the inter-electrode insulating film 14.

As a material for the buried insulating layer 2 to provide an SOI structure, $SiO_2$, sapphire ($Al_2O_3$) or the like can be used. In addition, with SON (Silicon On Nothing) technology, it does not matter that the buried insulating layer 2 is hollow (air), which serves as an insulating layer.

As a material for the semiconductor layer (SOI layer) 3, monocrystalline silicon, silicon germanium (SiGe) or the like can be used. A thickness $T_{BOX}$ of the buried insulating layer 2 may be, for example, approximately ten to 20 nm, and herein, the thickness is approximately 40 nm. A thickness $T_{SOI}$ of the SOI layer 3 may be, for example, approximately ten to 30 nm, and herein, the thickness is approximately 20 nm. The supporting substrate 1, such as n-type silicon (Si), is disposed under the buried insulating layer 2.

Each of a select gate transistor (first select gate transistor) $STS_1$ and a select gate transistor (second select gate transistor) $STD_1$ is arranged in, and adjacent to, each end of the column direction of the memory cell transistors $MT_{11}$ to $MT_{1n}$. Each of the select gate transistors $STS_1$ and $STD_1$ is an enhancement MIS transistor.

The select gate transistor $STS_1$ includes an $n^+$ drain region 421 which is common to a source region 421 of the memory cell transistor $MT_{11}$ positioned in one end of the arrangement in the column direction; a channel region 42 with a second conductivity (p) type arranged so as to be adjacent to the drain region 421; an $n^+$ source region 43 arranged so as to be adjacent to the channel region 42; and, select gate electrodes 13a and 15a arranged above the channel region 42 with the gate insulating film 12 interposed between the channel region 42 and the set of select gate electrodes 13a and 15a. The drain region 421, the channel region 42 and the source region 43 are arranged in the SOI layer 3. A source line contact plug 18 is arranged on the source region 43 so that the source line contact plug 18 is adjacent to the select gate transistor $STS_1$.

The select gate transistor $STD_1$ includes an $n^+$ source region 42(n+1) which is common to a drain region 42(n+1) of the memory cell transistor $MT_{1n}$ positioned in another end of the arrangement in the column direction; a channel region 44 with a second conductivity type (p) arranged so as to be adjacent to the source region 42(n+1); an $n^+$ drain region 45 arranged so as to be adjacent to the channel region 44; and, select gate electrodes 13b and 15b arranged above the channel region 44 with the gate insulating film 12 interposed between the channel region 44 and the set of select gate electrodes 13b and 15b. The source region 42(n+1), the channel region 44 and the drain region 45 are arranged in the SOI layer 3. A bit line contact plug 17 is arranged on the drain region 45 so that the bit line contact plug 17 is adjacent to the select gate transistor $STD_1$.

As shown in FIG. 2, for example, m×n (m is an integrer) memory cell transistors $MT_{11}$ to $MT_{1n}$, $MT_{21}$ to $MT_{2n}$, ..., $MT_{m1}$ to $MT_{mn}$, which are depletion-type MIS transistors, are arranged in a matrix. A common source line SL, which is connected with source line contact plug 18 of each of the lines, a select gate line SGS, which is connected with select gate electrodes 13a and 15a of each of the select gate transistors $STS_1$ to $STS_m$, word lines $WL_1$ to $WL_n$, which are connected with the control electrode 15 of the memory cell transistors $MT_{11}$ to $MT_{m1}$, $MT_{12}$ to $MT_{m2}$, ..., $MT_{1n}$ to $MT_{mn}$, and select gate line SGD, which is connected with the select gate electrodes 13b and 15b of each of the select gate transistors $STD_1$ to $STD_m$, are arranged in the column direction of the cell array. Bit lines $BL_1$, $BL_2$, ..., $BL_m$, which are respectively connected to each of the bit line contact plugs 17 in each of the arrangements, are arranged in the row direction.

Figure 3:
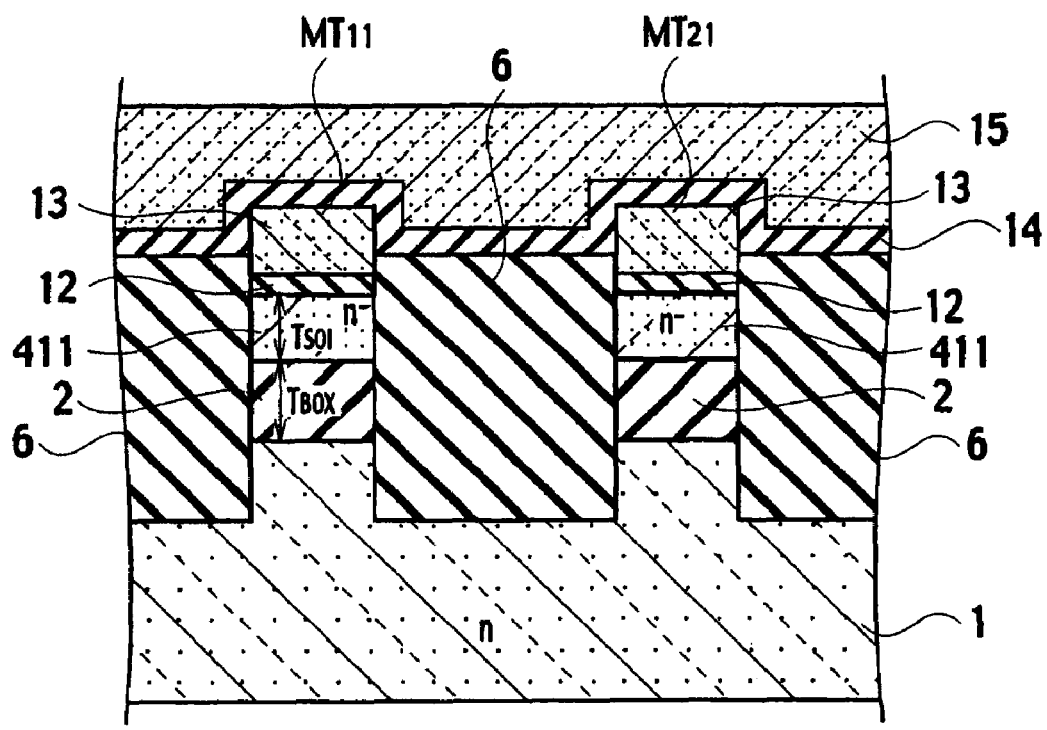
FIG. 3 is a cross-sectional view in a row direction showing an example of the cell array of the non-volatile semiconductor memory according to the first embodiment of the present invention.

FIG. 3 is a cross-sectional view of the non-volatile semiconductor memory taken along the II-II line in the row direction shown in FIG. 2. As shown in FIG. 3, an element isolation insulating film 6 is buried between the floating gate electrode 13 and the channel region 411 of each of the memory cell transistors $MT_{11}$ and $MT_{21}$, which are adjacent to one another in the row direction. Elements of the respective memory cell transistors $MT_{11}$, and $MT_{21}$, which are adjacent to one another in the row direction, are completely isolated from one another.

Figure 4:
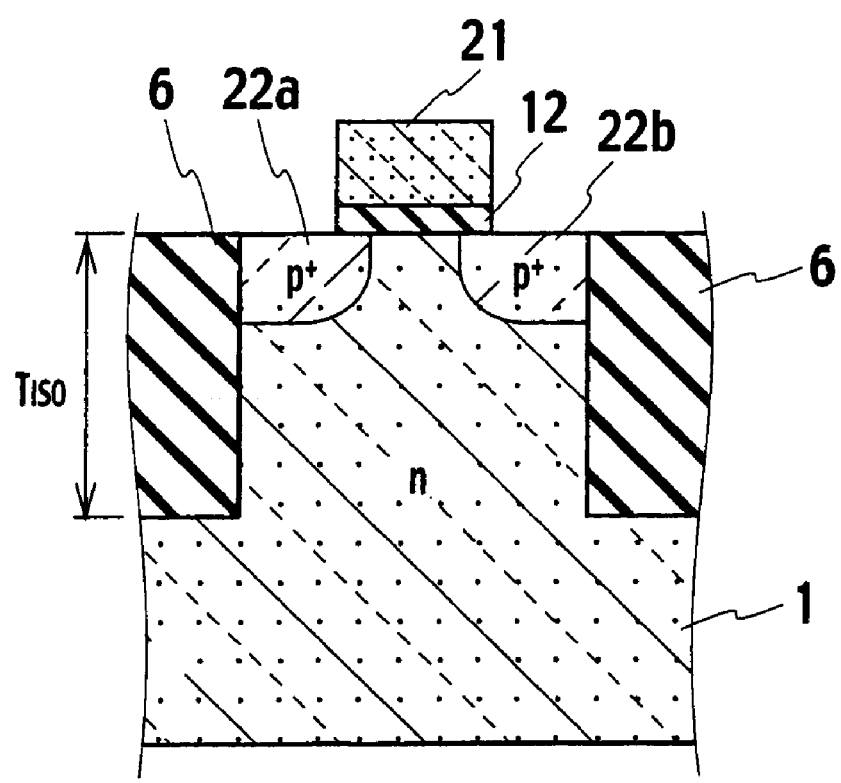
FIG. 4 is a cross-sectional view showing an example of a peripheral circuit region of the non-volatile semiconductor memory according to the first embodiment of the present invention.

The non-volatile semiconductor memory according to the first embodiment of the present invention further includes peripheral circuits disposed on an upper portion of the supporting substrate 1 around the cell arrays configured by the plurality of transistors $MT_{11}$ to $MT_{1n}$, $MT_{21}$ to $MT_{2n}$, ..., and $MT_{m1}$ to $MT_{mn}$. For example, as shown in FIG. 4, an element (MIS transistor) in a peripheral circuit region includes source and drain regions 22a and 22b disposed in the upper part of a supporting substrate 1. The element also includes a gate electrode 21 disposed above a channel region between the source and drain regions 22a and 22b with the gate insulating film 12 interposed there between. In the peripheral circuit region, adjacent elements are separated from one another by the element isolation insulating film 6. The element isolation insulating film 6 is different from the buried insulating layer 2. A thickness $T_{ISO}$ of the element isolation insulating film 6 is more than the thickness $T_{BOX}$ of the buried insulating layer 2, shown in FIGS. 1 and 3. FIG. 4 shows a partial SOI structure where the element is formed in a bulk region. However, note that each of the elements in the peripheral circuit region may also include the SOI structure.

Figure 5:
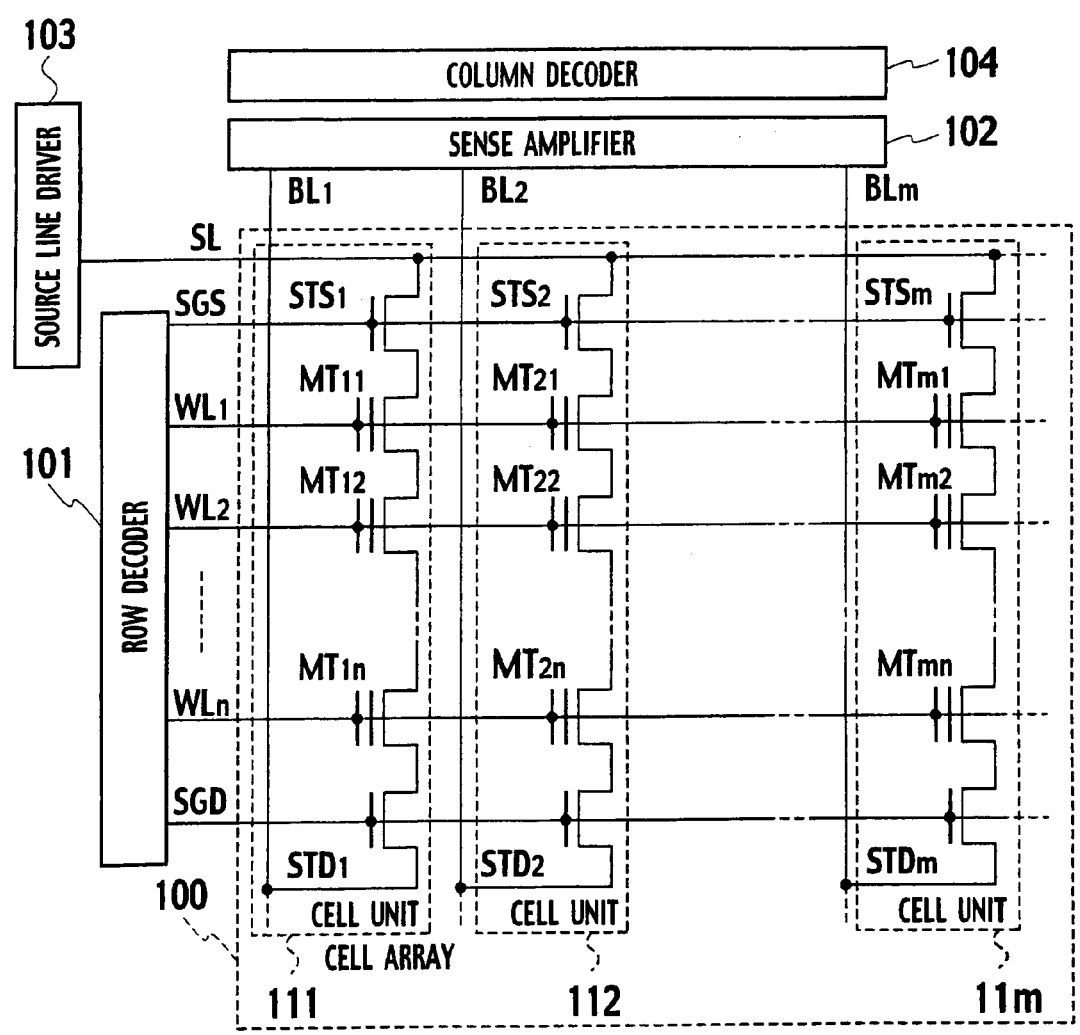
FIG. 5 is an equivalent circuit diagram showing an example of the cell array of the non-volatile semiconductor memory according to the first embodiment of the present invention.

An equivalent circuit of the non-volatile semiconductor memory according to the embodiment shown in FIGS. 1 to 4 is shown in FIG. 5. As shown in FIG. 5, a cell array 100 includes m×n memory cell transistors $MT_{11}$ to $MT_{1n}$, $MT_{21}$ to $MT_{2n}$, ..., $MT_{m1}$ to $MT_{mn}$ which are depletion mode MIS transistors. In the cell array 100, a plurality of memory cell transistors $MT_{11}$ to $MT_{1n}$ are arranged as a group in a column; a plurality of memory cell transistors $MT_{21}$ to $MT_{2n}$ are arranged as a group in another column, ...; and a plurality of memory cell transistors $MT_{m1}$ to $MT_{mn}$ are arranged as a group in the other column. In addition, the group of memory cell transistors $MT_{11}$ to $MT_{1n}$, the group of memory cell transistors $MT_{21}$ to $MT_{2n}$, ..., and the group of memory cell transistors $MT_{m1}$ to $MT_{mn}$ are arranged in the row direction. In this way, the plurality of memory cell transistors $MT_{11}$ to $MT_{1n}$, $MT_{21}$ to $MT_{2n}$, ..., $MT_{m1}$ to $MT_{mn}$ are arranged in a matrix.

The memory cell transistors $MT_{11}$ to $MT_{1n}$, and the select gate transistors $STS_1$ and $STD_1$ are connected in series, thereby including a cell unit 11₁. The drain region of the enhancement mode select gate transistor $STS_1$, which selects one out of the memory cell transistors $MT_{11}$ to $MT_{1n}$, is connected to the source region of the memory cell transistor $MT_{11}$ positioned at one end of the arrangement in which the group of memory cell transistors $MT_{11}$ to $MT_{1n}$ are connected in series. The source region of the enhancement select gate transistor $STD_1$, which selects one out of the memory cell transistors $MT_{11}$ to $MT_{1n}$, is connected to the drain region of the memory cell transistor $MT_{1n}$ positioned at the other end of the arrangement in which the group of memory cell transistors $MT_{11}$ to $MT_{1n}$ are connected in series. The select gate transistor $STS_2$, the memory cell transistors $MT_{21}$ to $MT_{2n}$ and the select gate transistor $STD_2$ are also connected in series, thereby including a cell unit 11₂, ...; the select gate transistor $STS_m$, the memory cell transistors $MT_{m1}$ to $MT_{mn}$ and the select gate transistor $STD_m$ are also connected in series, thereby including a cell unit 11m.

The source regions of the respective select gate transistors $STS_1$ to $STS_m$ are connected with the source line SL common to the source regions. A source line driver 103, which supplies voltage to the source line SL, is connected to the source line SL. The following are connected to a row decoder 101: a select gate line SGS common to the select gate transistors $STS_1$ to $STS_m$; a select gate line SGD common to the select gate transistors $STD_1$ to $STD_m$; a word line $WL_1$ common to the memory cell transistors $MT_{11}$, $MT_{21}$, ..., $MT_{m1}$; a word line $WL_2$ common to the memory cell transistors $MT_{12}$, $MT_{22}$, ..., $MT_{m2}$; ...; and a word line $WL_n$ common to the memory cell transistors $MT_{1n}$, $MT_{2n}$, ..., $MT_{mn}$. The row decoder 101 obtains a row address decoded signal by decoding a row address signal, and supplies operation voltage to the word lines $WL_1$ to $WL_m$ and the select gate lines SGS and SGD, in a selective manner. Each of bit lines $BL_1$ to $BL_m$ is connected to the drain region of each of the select gate transistors $STD_1$ to $STD_m$. A sense amplifier 102 and a column decoder 104 are connected to the bit lines $BL_1$ to $BL_m$. The column decoder 104 obtains a column address decoded signal by decoding a column address signal, and selects one out of the bit lines $BL_1$ to $BL_m$, based on the column address decoded signal. The sense amplifier 102 amplifies memory signals, which have been read from a memory cell transistor selected by the row decoder 101 and the column decoder 104.

In the non-volatile semiconductor memory shown in FIG. 1, the gate length L of the floating gate electrodes 13 aligned adjacently in the column direction and the gate interval S therebetween are approximately the same. The gate length L is, for example, approximately 10 to 50 nm. As shown by an area marked with diagonal lines in FIG. 6, it suffices that the thickness $T_{SOI}$ of the channel regions 411 to 41n (the thickness of the SOI layer 3) is not less than one nm and is not more than a value obtained by adding seven nm to a half value of the gate length L.

$$1 \leq T_{SOI} \leq T_{SOIMAX} = 0.5*L + 7 \quad (1)$$

In this regard, $T_{SOIMAX}$ is the maximum film thickness of the SOI layer 3 which can be obtained with respect to the gate length L. In reading operations, an inversion layer is formed in an area of about one nm deep, from a surface of the channel regions 411 to 41n, directly below the gates of the memory cell transistors $MT_{11}$ to $MT_{1n}$, shown in FIG. 1. Therefore, if the thickness $T_{SOI}$ of the channel regions 411 to 41n is smaller than one nm, carrier surface density of the inversion layer rapidly decreases and a bit line current $I_B$ is reduced. Accordingly, the reading operations become difficult.

On the other hand, in order to carry out the reading operations properly, it is a required condition that the bit line current $I_B$ can be minimized so as to determine to substantially interrupt the bit line current $I_B$ in the reading operations. In a case where the value of the thickness $T_{SOI}$ is not larger than the value obtained by adding seven nm to the half value of the gate length L and satisfies Formula (1), the bit line current $I_B$ can be minimized as small as possible.

Formula (1) is experimentally derived, by device simulation, from measuring the bit line current $I_B$ in a case where the gate length L and the thickness $T_{SOI}$ of the SOI layer 3 are respectively varied. With respect to structure parameters which are set for deriving Formula 1, the thickness $T_{BOX}$ of the buried insulating layer 2 is 40 nm; the thickness of the gate insulating film 12 is nine nm; an n-type impurity impurity concentration of the source and drain regions 421 to 42(n+1) and channel regions 411 to 41n of the memory cell transistors $MT_{11}$ to $MT_{1n}$ is $1\times10^{15}$ $cm^{-3}$; a p-type impurity concentration of the channel regions 42 and 44 of the select gate transistors $STS_1$ and $STD_1$ is $3\times10^{14}$ $cm^{-3}$; and the n-type impurity concentration of the supporting substrate 1 is $1\times10^{18}$ $cm^{-3}$. With regard to the operation voltages, 4.0V as an on-voltage and 0.0V as an off-voltage are respectively applied to the word line so as to be in the read state.

Figure 7:
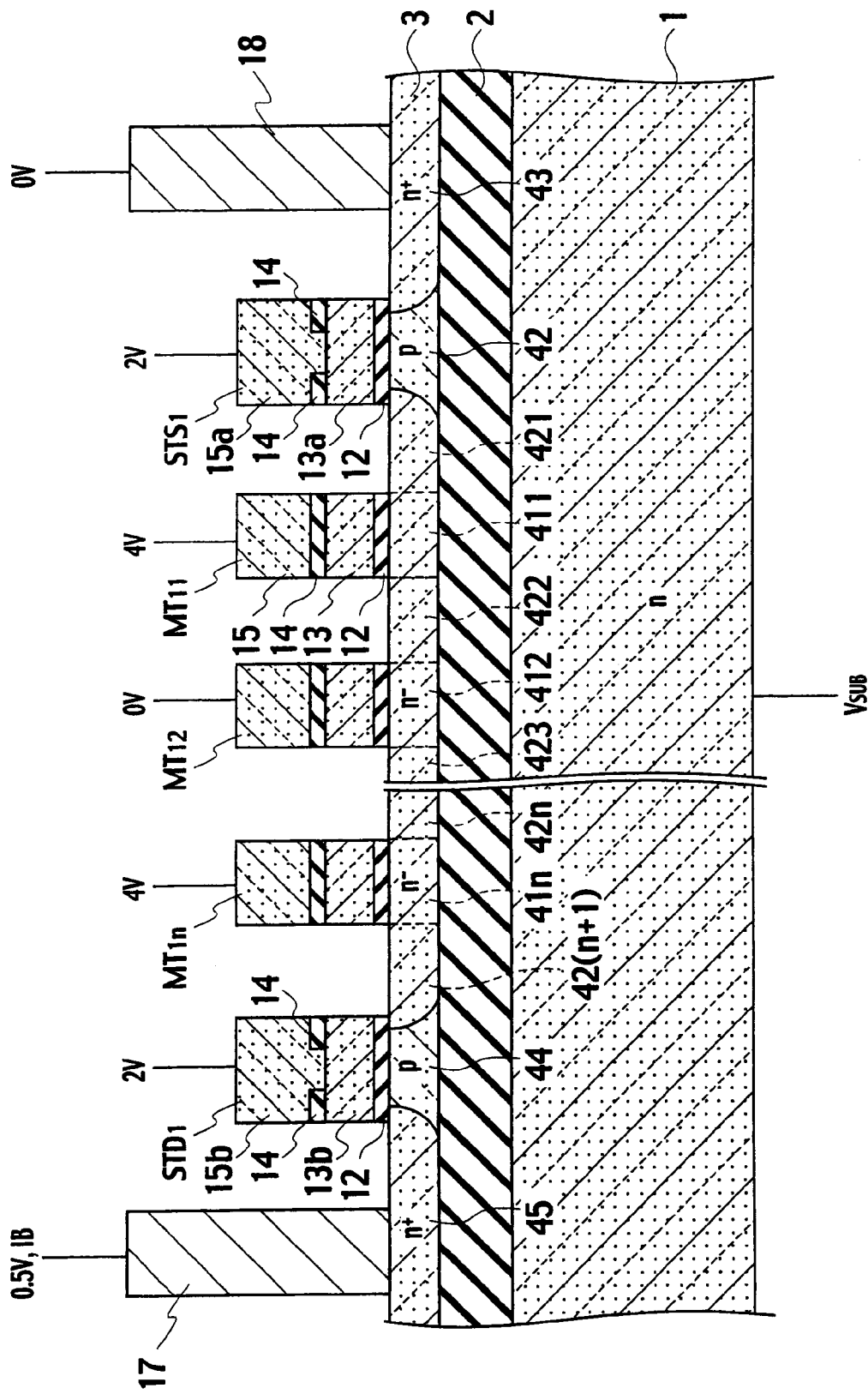
FIG. 7 is a cross-sectional view for explaining an evaluation of an electrical characteristic of the non-volatile semiconductor memory according to the first embodiment of the present invention.

As shown in FIG. 7, 0.5V is applied to the bit line $BL_1$ connected to the bit line contact plug 17; 0V is applied to the source line SL connected to the source contact plug 18; 0V is applied to the selected word line $WL_2$ connected to the memory cell transistor $MT_{12}$; and 4V is applied to each of the non-selected word lines $WL_1$ and $WL_3$ to $WL_n$ respectively connected to the memory cell transistors $MT_{11}$ and $MT_{13}$ to $MT_{1n}$; and a substrate voltage $V_{SUB}$ applied to the supporting substrate 1 is varied. A bit line current $I_B$ is measured under such a condition.

Figure 8:
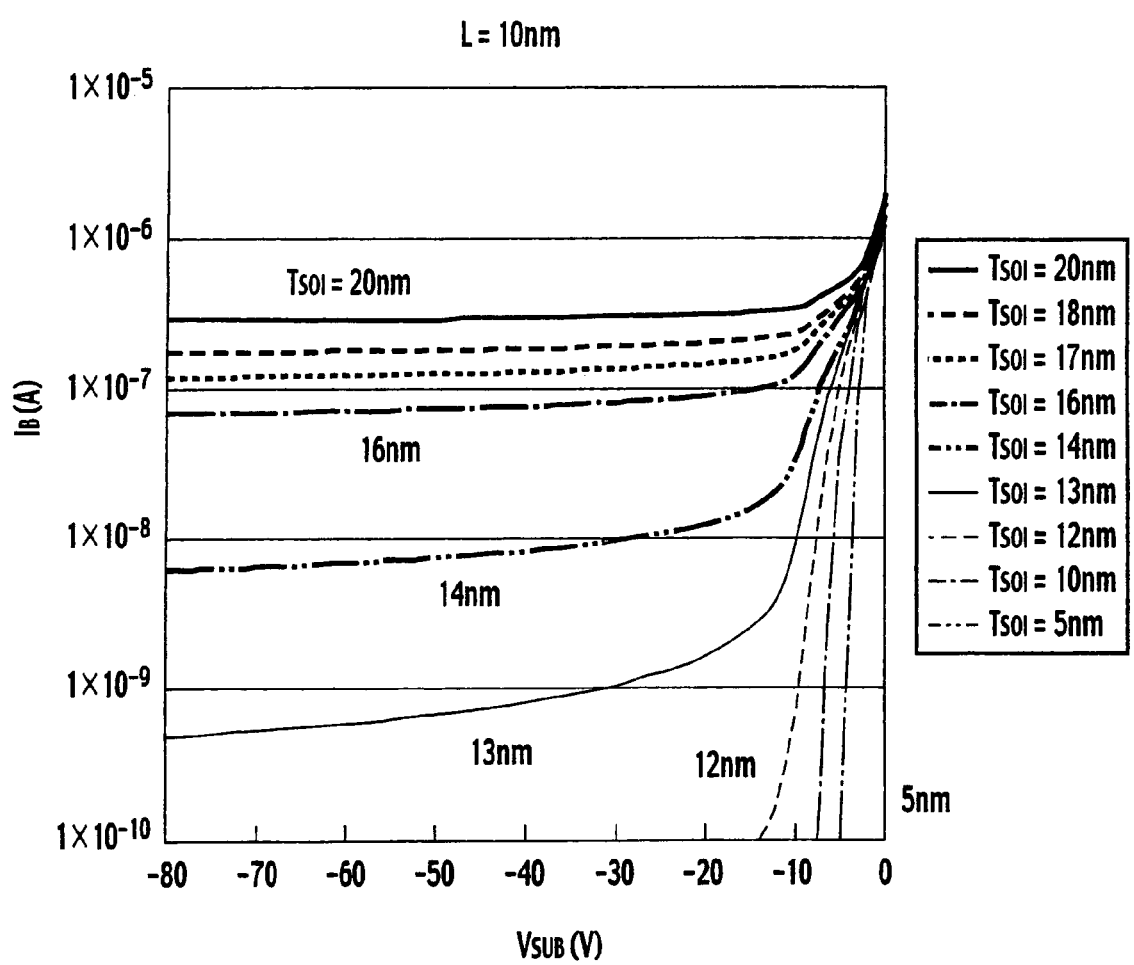
FIG. 8 is a graph showing a relationship between a substrate voltage and a bit line current of the non-volatile semiconductor memory according to the first embodiment of the present invention, when the gate length of the memory cell transistors is ten nm.
Figure 9:
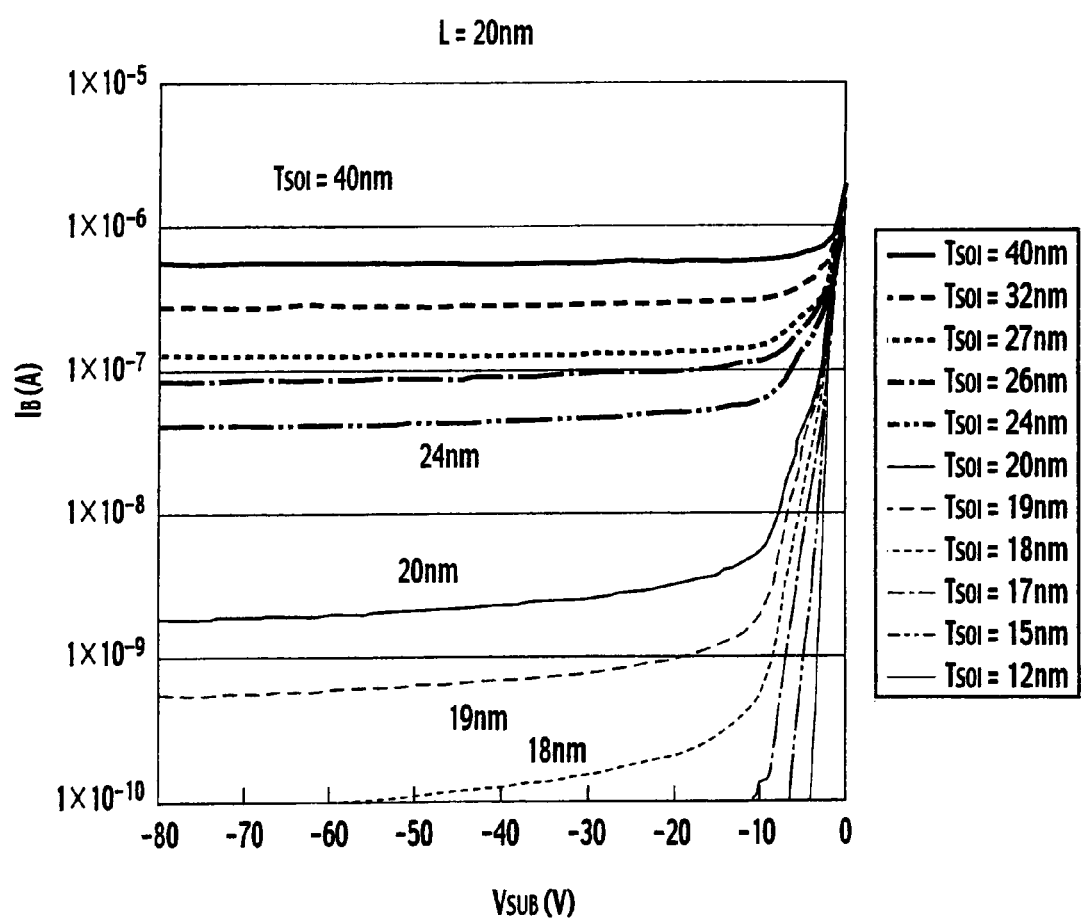
FIG. 9 is a graph showing a relationship between the substrate voltage and the bit line current of the non-volatile semiconductor memory according to the first embodiment of the present invention, when the gate length of the memory cell transistors is 20 nm.
Figure 10:
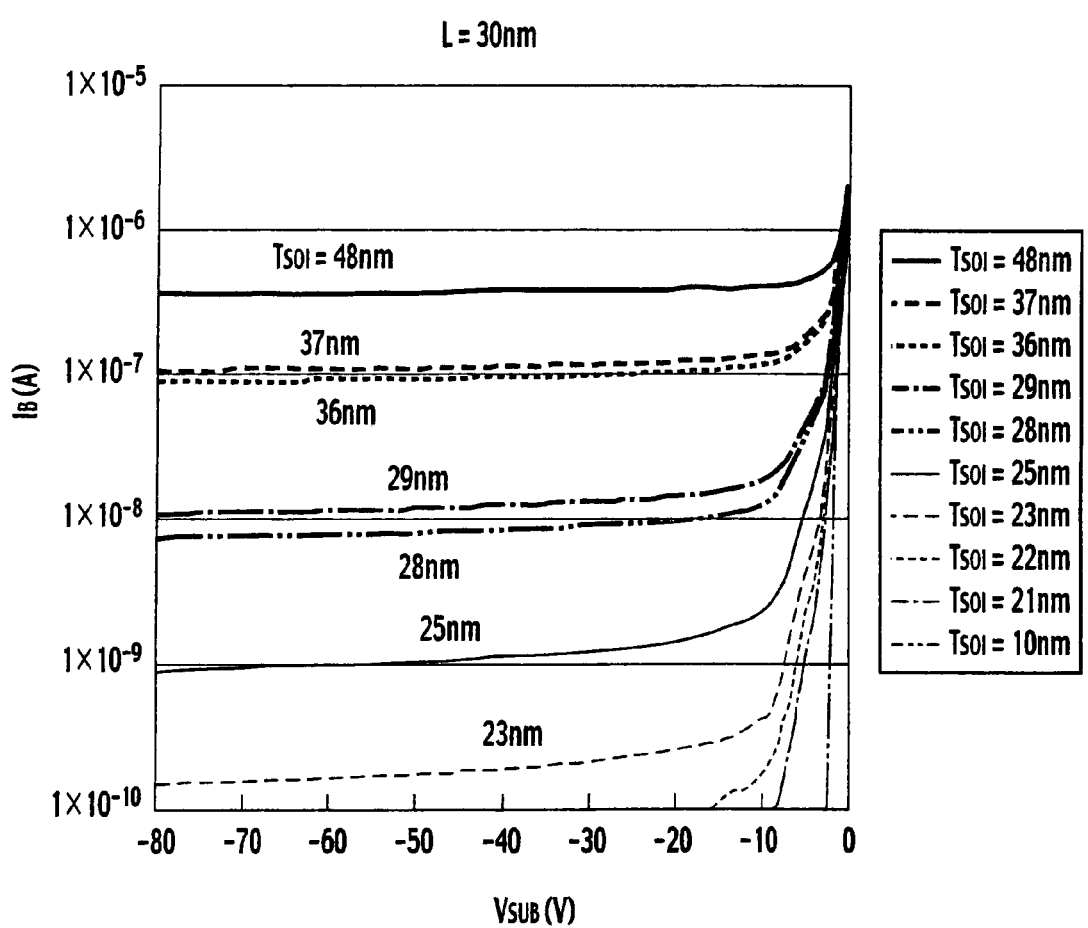
FIG. 10 is a graph showing a relationship between the substrate voltage and the bit line current of the non-volatile semiconductor memory according to the first embodiment of the present invention, when the gate length of the memory cell transistors is 30 nm.
Figure 11:
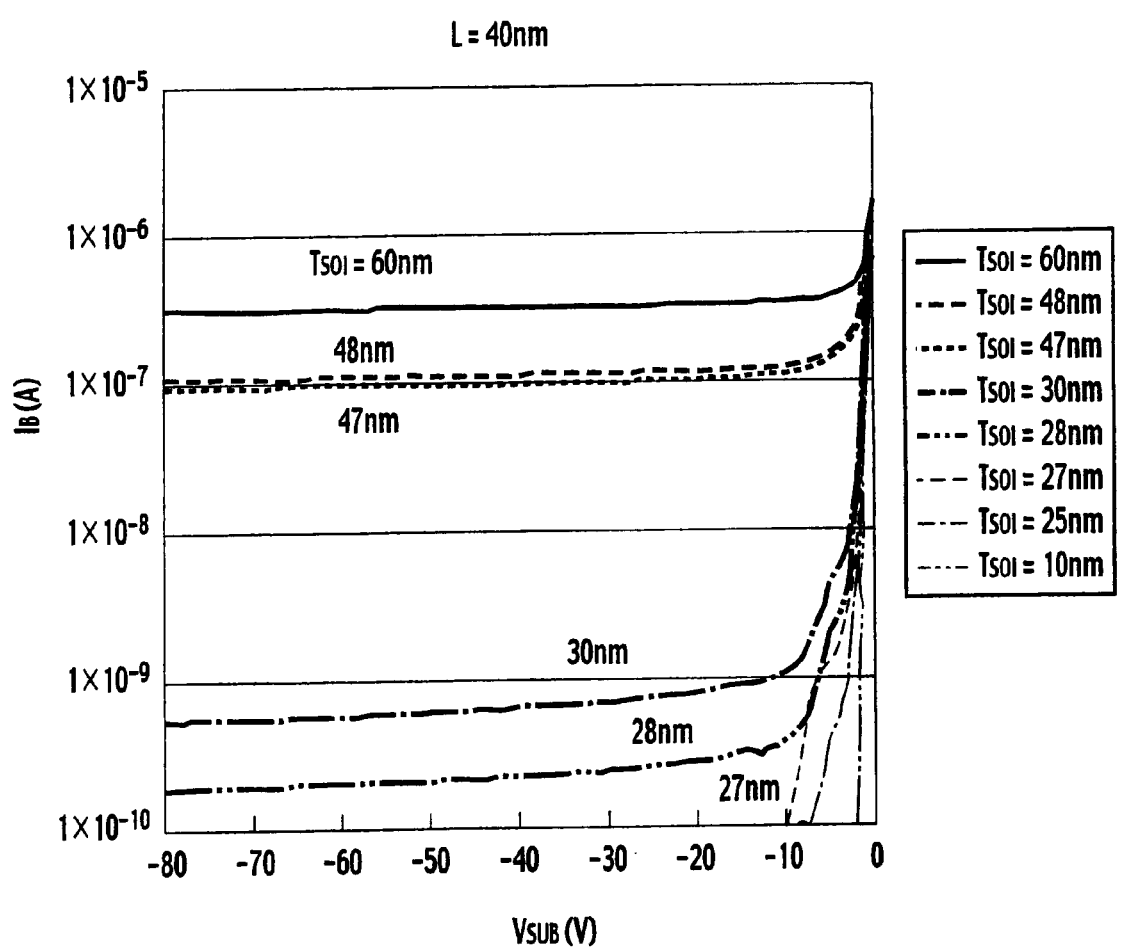
FIG. 11 is a graph showing a relationship between the substrate voltage and the bit line current of the non-volatile semiconductor memory according to the first embodiment of the present invention, when the gate length of the memory cell transistors is 40 nm.

FIGS. 8 to 11 show the measurement results. As shown in FIG. 8, in a case where the gate length L is ten nm, if the thickness $T_{SOI}$ of the SOI layer 3 is not more than 12 nm, a bit line current $I_B$ can be interrupted by applying a negative substrate voltage $V_{SUB}$. As shown in FIG. 9, in a case where the gate length L is 20 nm, if the thickness $T_{SOI}$ of the SOI layer 3 is not more than 17 nm, the bit line current $I_B$ can be interrupted by applying a negative substrate voltage $V_{SUB}$. As shown in FIG. 10, in a case where the gate length L is 30 nm, if the thickness $T_{SOI}$ of the SOI layer 3 is not more than 22 nm, a bit line current $I_B$ can be interrupted by applying a negative substrate voltage $V_{SUB}$. As shown in FIG. 11, in a case where the gate length L is 40 nm, if the thickness $T_{SOI}$ of the SOI layer 3 is not more than 27 nm, the bit line current $I_B$ can be interrupted by applying a negative substrate voltage $V_{SUB}$.

Figure 6:
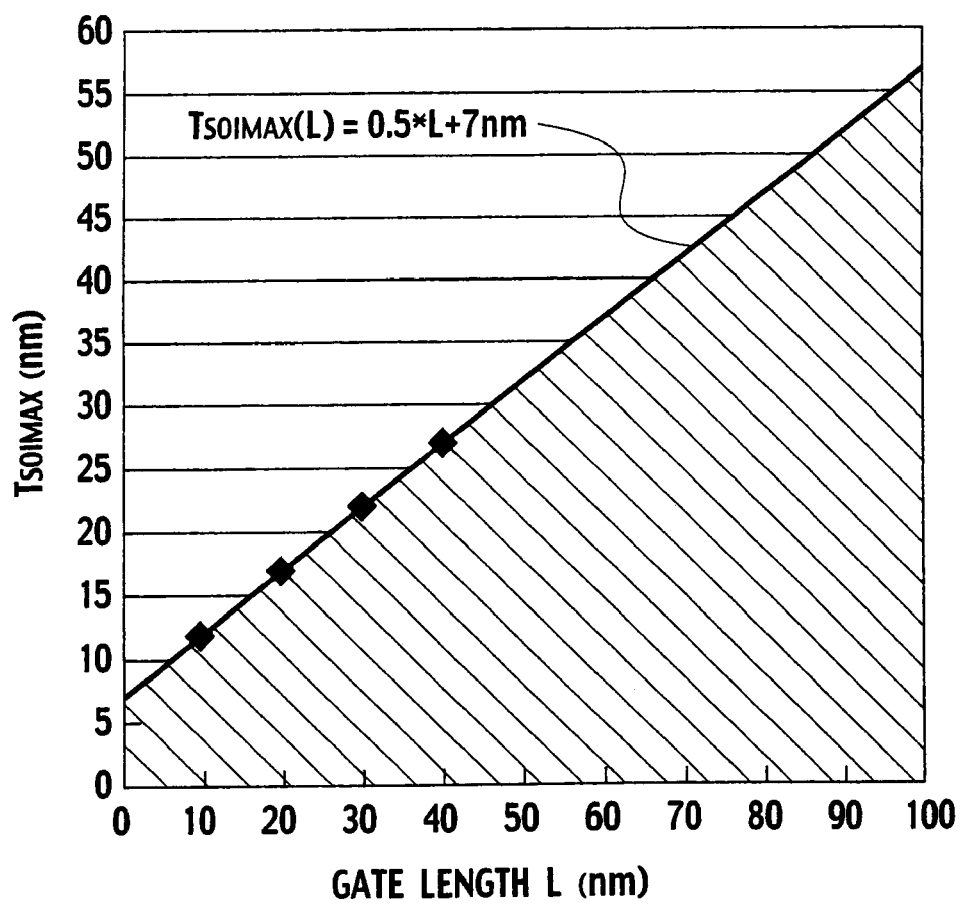
FIG. 6 is a graph showing a relationship between a gate length of a memory cell transistor and a maximum thickness of a SOI layer of the non-volatile semiconductor memory according to the first embodiment of the present invention.

The maximum film thickness $T_{SOIMAX}$ of the SOI layer 3 with respect to each of the gate lengths L, shown in FIGS. 8 to 11, varies linearly in proportion to the gate lengths L in accordance with Formula (1), as shown in FIG. 6. It is preferred to increase the thickness $T_{SOI}$ of the SOI layer 3 because the increased thickness makes the manufacture thereof easier and reduces resistance of the drain region 45 connected to the bit line $BL_1$ and the source region 43 connected to the source line SL. However, there is a trade-off relation in that the bit line current $I_B$ is increased. The maximum thickness $T_{SOIMAX}$ is most preferably the same as the thickness $T_{SOI}$ of the SOI layer 3. However, if the thickness $T_{SOI}$ is even slightly larger than the maximum thickness $T_{SOIMAX}$, there is a possibility that it is not possible to interrupt the bit line current $I_B$ by applying a substrate voltage $V_{SUB}$. Accordingly, in consideration of a thickness variation, the most frequently adopted practical value may be set smaller than the maximum thickness $T_{SOIMAX}$ so that an uppermost portion of the thickness variation does not exceed the maximum thickness $T_{SOIMAX}$.

Next, methods for controlling writing, reading and erasing operations will be described. First, an example of the method for controlling reading operations will be described.

Figure 12:
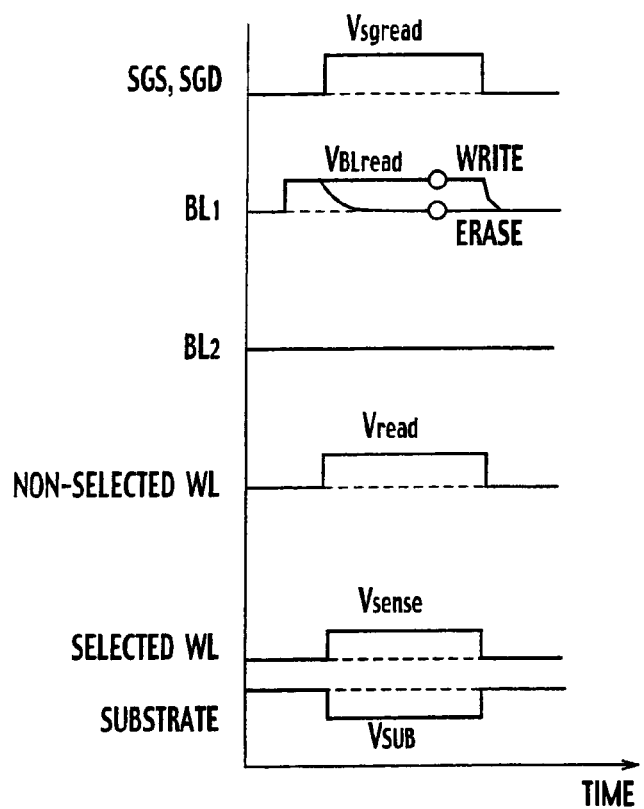
FIG. 12 is a timing chart for explaining an example of reading operations of the non-volatile semiconductor memory according to the first embodiment of the present invention.

When data of the memory cell transistor $MT_{11}$ is read, as shown in FIG. 12, a substrate voltage $V_{SUB}$ of less than 0 V (for example, −5 V) is applied to the substrate 1 and a pre-charge voltage $V_{BLread}$ (for example, 0.5 to 1.1 V) is applied to the selected bit line $BL_1$, whereby each of the memory cell transistors is in a floating state. Herein, in order to prevent interference between the adjacent bit lines (BL-BL), data reading on an odd-numbered bit line $BL_1$ and data reading on an even-numbered bit line $BL_2$ is performed alternately. For this reason, no pre-charge voltage $V_{BLread}$ is applied to the non-selected bit line $BL_2$ adjacent to the selected bit line $BL_1$ in some cases.

Next, a voltage $V_{sgread}$ (for example, 2.5V) is applied to the selected gate lines SGS and SGD; a voltage $V_{read}$ (for example 4.5 V) is applied to the non-selected word lines $WL_2$ to $WL_n$; and a determination voltage $V_{sense}$ (for example, 0 V) is applied to the selected word line $WL_1$, respectively. It is desirable that the time for applying reading potentials (TR) is set to in consideration of noise, such as a parasitic noise between adjacent bit lines and an increase in a base potential due to a cell current.

In the memory cell transistor $MT_{11}$, when electrons are not stored in the floating gate electrode 13, the selected memory cell transistor $MT_{11}$ is turned on and a cell current flows, so that the potential of the selected bit line $BL_1$ is decreased. On the other hand, when electrons are stored in the floating gate electrode 13, the selected memory cell transistor $MT_{11}$ is in an off-state and the cell current does not flow, so that the potential of the selected bit line $BL_1$ is maintained at the pre-charge voltage $V_{BLread}$.

After the application of the reading potentials, the potential of the selected bit line $BL_1$ and a determined standard potential are compared. If the potential of the selected bit line $BL_1$ is higher than the determined standard potential, it is determined that the selected memory cell transistor $MT_{11}$ is in a write state. On the other hand, if the potential of the bit line $BL_1$ is lower than the determined standard potential, it is determined that the selected memory cell transistor $MT_{11}$ is in an erase state.

According to the method for controlling the reading operations of the non-volatile semiconductor memory according to the first embodiment of the present invention, the application of a substrate voltage $V_{SUB}$ of less than 0 V (for example, −5 V) to the supporting substrate 1 decreases the bit line current $I_B$, so that appropriate reading operations can be performed.

Figure 13:
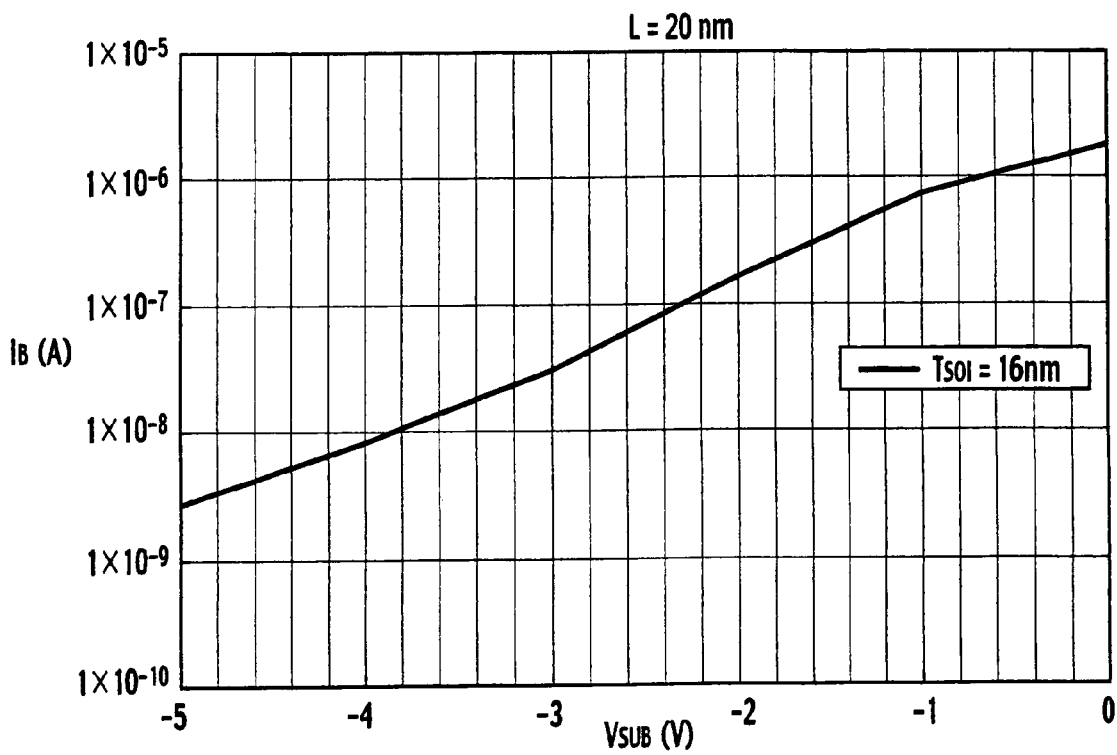
FIG. 13 is a graph showing a relationship between the substrate voltage and the bit line current of the non-volatile semiconductor memory according to the first embodiment of the present invention.

FIG. 13 shows a correlation between the substrate voltage $V_{SUB}$ and the bit line current $I_B$ when the operation voltages are applied in reading operations. The correlation is based on the condition that the gate length L is 20 nm and the thickness $T_{SOI}$ of the SOI layer 3 is 16 nm. Even if, for example, a substrate voltage $V_{SUB}$ of about −2.2 V of less than 0 V is applied to the supporting substrate 1, the bit line current $I_B$ will not be more than $1\times10^{-7}$ A, which is sufficiently small for practical use. Accordingly, it is possible to perform the reading operations.

Figure 14:
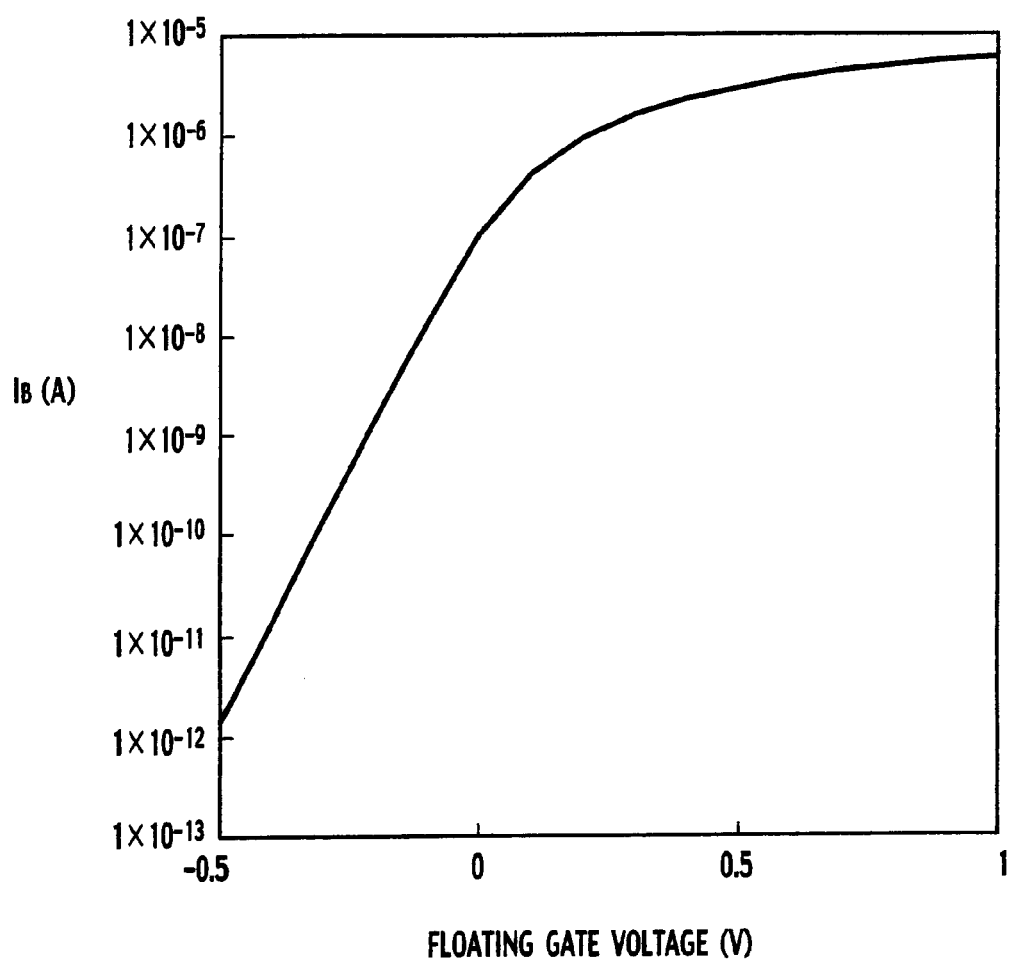
FIG. 14 is a graph showing a relationship between a floating gate voltage and the bit line current of the non-volatile semiconductor memory according to the first embodiment of the present invention.

FIG. 14 shows a correlation between a floating gate voltage $V_{FG}$ and a bit line current $I_B$ when the operation voltages are applied in the reading operations shown in FIG. 13. The correlation is based on the condition that the gate length L is 40 nm, the thickness $T_{SOI}$ of the SOI layer 3 is 27 nm, and the n-type impurity concentration of the SOI layer 3 is $1\times10^{17}$ $cm^{-3}$, as a voltage $V_D$, 1.1 V is applied to the bit line. It is understood that when the determination voltage $V_{sense}$, which is applied to the control gate electrode 15, is 0 V and the floating gate voltage $V_{FG}$ become a negative potential by storing electrons in the floating gate electrode 13, the bit line current $I_B$ can also be sufficientlly minimized. Accordingly, the reading operations can be performed properly.

Next, trimming operations of the substrate voltage $V_{SUB}$ applied to the supporting substrate 1 of the non-volatile semiconductor memory according to the first embodiment of the present invention will be described with reference to a flow-chart of FIG. 15. An optimum value of the substrate voltage $V_{SUB}$, such as about −2.2 V as shown in FIG. 12, varies among a plurality of chips because there are variations in shape and the like from one chip to another. Accordingly, in the trimming operations, an optimum value of the substrate voltage $V_{SUB}$ is set in each chip.

Figure 15:
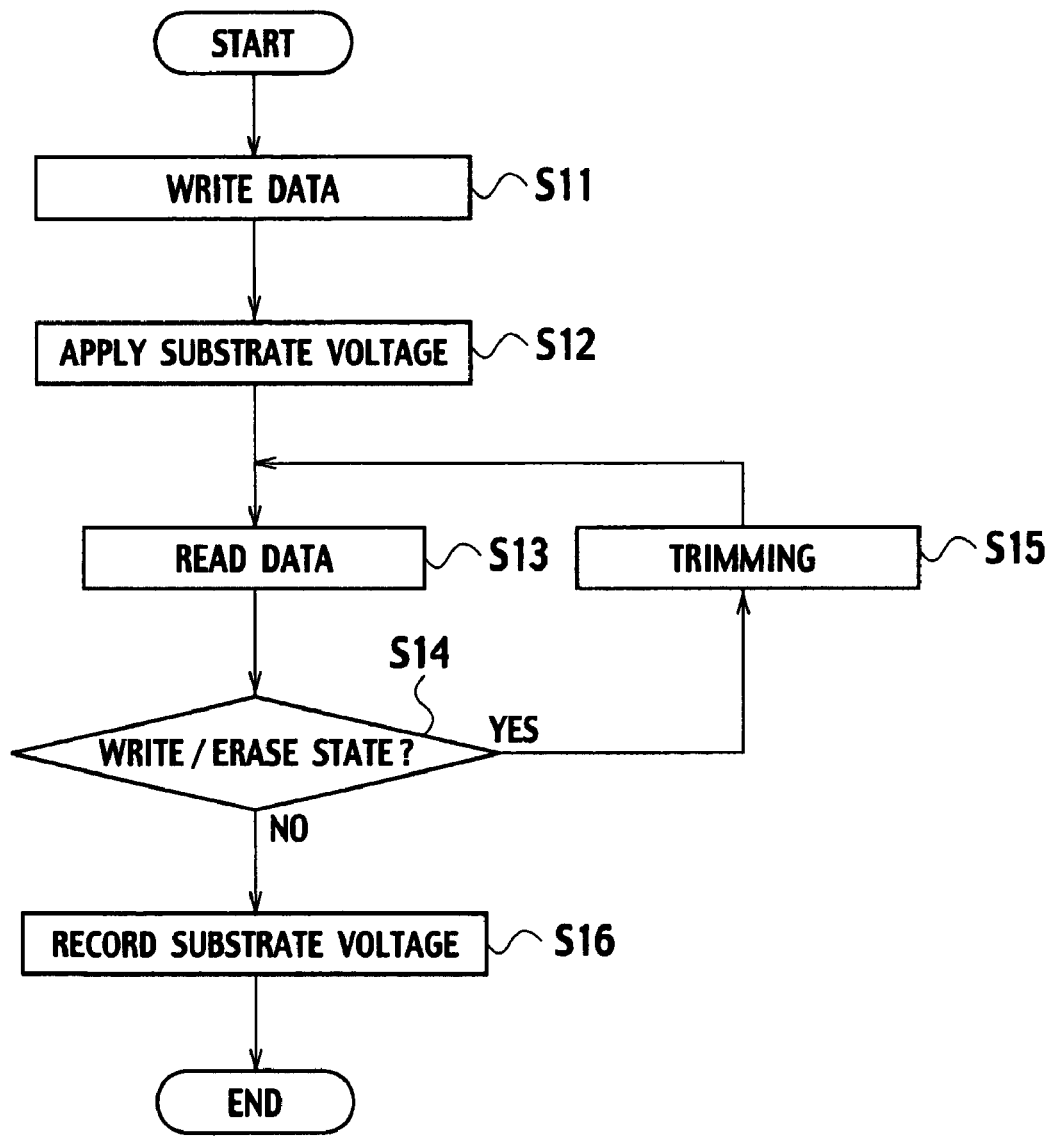
FIG. 15 is a flow chart for explaining an example of trimming operations of the non-volatile semiconductor memory according to the first embodiment of the present invention.

In Step S11 shown in FIG. 15, predetermined writing operations are performed. In Step S12, a substrate voltage $V_{SUB}$ less than 0 V (for example, −2.2 V) is applied to the supporting substrate 1. In Step S13, a voltage $V_{sgread}$ (for example, 2.5 V) is applied to each of the selected gate lines SGS and SGD; a trimming voltage $V_{trim}$ (for example, 0 V) is applied to the selected word line $WL_1$; and a voltage $V_{read}$ (for example, 4.5 V) is applied to each of the non-selected word lines $WL_2$ to $WL_n$, respectively. Accordingly, the data of the memory cell transistor $MT_{11}$ is read.

In Step S14, the state of the read data of the selected memory cell transistor $MT_{11}$ is determined. In other words, when the read data is in the erase state, the cell current is excessively larger than the desired value. Accordingly, the processing goes to Step S15 for trimming, and a voltage $(V_{SUB}-\Delta V_{SUB})$, less than the substrate voltage $V_{SUB}$ by $\Delta V_{SUB}$ (for example, 50 mV), is applied to the supporting substrate 1. Thereafter, the processing goes back to the procedure of Step S13 to read the data of the selected memory cell transistor $MT_{11}$.

On the other hand, if the read data is in the write state, the cell current is excessively smaller than the desired value. Accordingly, the processing goes to Step S15 for trimming, and a voltage $(V_{SUB}+\Delta V_{SUB})$, higher than the substrate voltage $V_{SUB}$ by $\Delta V_{SUB}$ (for example, 50 mV), is applied to the supporting substrate 1. Thereafter, the processing goes back to the procedure of Step S13 to read the data of the selected memory cell transistor $MT_{11}$.

The Steps S13 to S15 are repeated to obtain an exact substrate voltage $V_{SUB}$ with which the read data of the memory cell transistor $MT_{11}$ changes from the write state to an erase state. The obtained voltage is defined as an optimum substrate voltage $V_{SUB\_trim}$.

In Step S16, the optimum substrate voltage $V_{SUB\_trim}$ is recorded in various internal memories and is outputted to an output device. In the next reading operation, the optimum substrate voltage $V_{SUB\_trim}$, corresponding to a targeted tip for reading, is read from the memories and applied to the supporting substrate 1.

In consideration of variations in cell transistor characteristics, it is desirable that values of the applied voltages in the writing operations in Step S11 and the trimming voltage $V_{trim}$ in Step S13 be set to appropriate values so that desired operation margins can be obtained.

Additionally, it is also possible that the above-described trimming operations are performed automatically by an automatic trimming circuit which is built in a memory chip when a screening test for conforming chips is carried out.

Furthermore, as another example of the trimming operations, in place of performing the writing operations on the selected memory cell transistor $MT_{11}$, it is possible to perform the trimming operations in Steps S12 to S16 on a standard cell for trimming, in which a floating gate 13 and a control gate 15 are electrically connected.

According to the trimming operations of the non-volatile semiconductor memory according to the first embodiment of the present invention, it is possible to set the optimum value of the substrate voltage $V_{SUB}$ for each chip during the reading operations.

Next, an example of the method for controlling the writing operations of the non-volatile semiconductor memory according to the first embodiment of the present invention will be described. As shown in time $T_{11}$ to $T_{12}$ in FIG. 16, a voltage $V_{BLinhibit}$ (for example, 2.5 V) is applied to each of the selected gate lines SGS and SGD; a voltage $V_{BLpgm}$ (for example, 0 V) is applied to the selected bit line $BL_1$; a voltage $V_{pass}$ (for example, 10 V) is applied to each of the non-selected word lines $WL_2$ to $WL_n$; the voltage $V_{pgm}$ (for example, 18 V) is applied to the selected word line $WL_1$; and 0 V is applied to the supporting substrate 1.

In the memory cell transistor $MT_{11}$, a voltage $V_{pgm}$ (for example, 18 V) is applied to the control gate electrode 15 shown in FIG. 1. Accordingly, a strong electric field is applied between the floating gate electrode 13 and the channel region 411 directly under the floating gate electrode 13. Then, electrons are injected into the floating gate electrode 13 through the gate insulating film 12. Once the electrons are stored in the floating gate electrode 13, a threshold voltage of the selected memory cell transistor $MT_{11}$ is increased by $\Delta V$ from a negative threshold voltage, whereby a memory signal is written therein.

Figure 16:
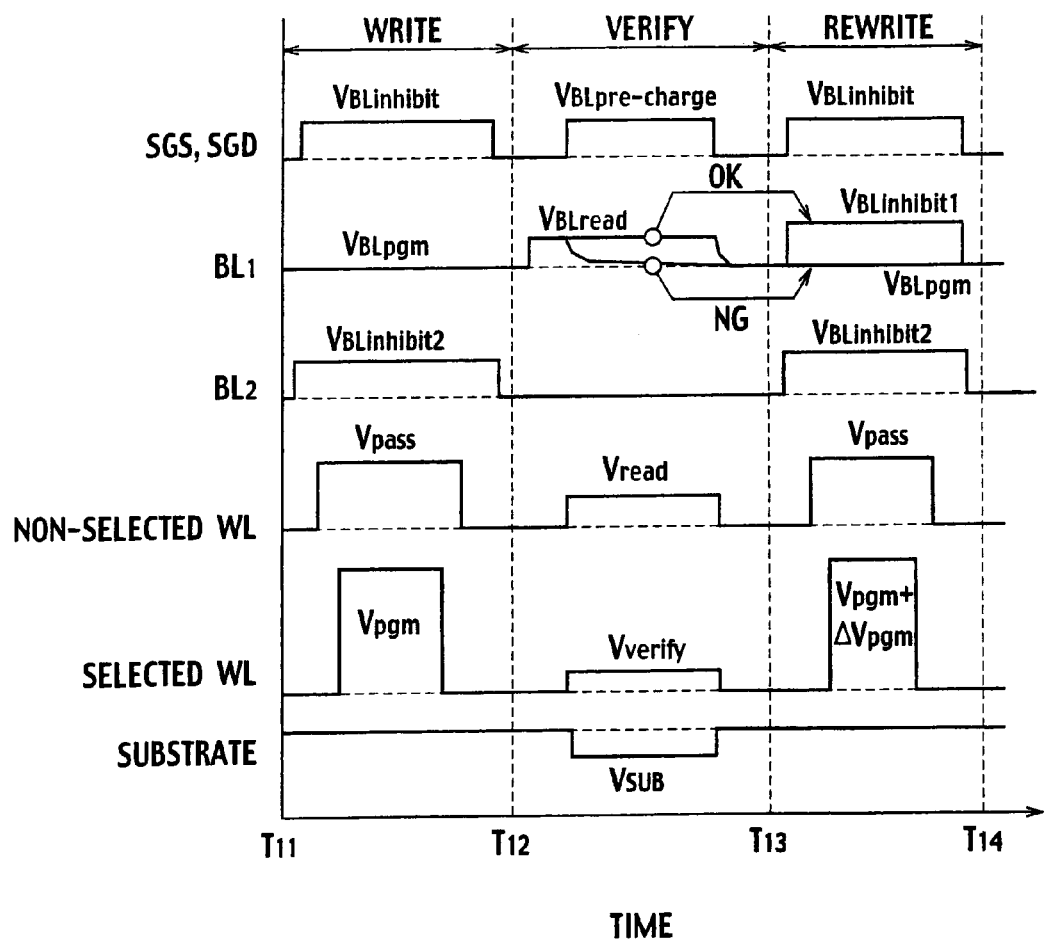
FIG. 16 is a timing chart for explaining an example of programming (writing) operations of the non-volatile semiconductor memory according to the first embodiment of the present invention.

Note that when verifying operations are performed after the writing operations, as shown in time $T_{12}$ to $T_{13}$ in FIG. 16, a pre-charge voltage $V_{BLpre-charge}$ (for example, three V) is applied to each of the selected gate lines SGS and SGD; a voltage $V_{read}$ (for example, 4.5 V) is applied to each of the non-selected word lines $WL_2$ to $WL_n$; a voltage $V_{verify}$ (for example, 0 V) is applied to the selected word line $WL_1$; and a substrate voltage $V_{SUB}$, less than 0 V (for example, −5 V), is applied to the supporting substrate 1, respectively. Accordingly, a bit line current $I_B$ is read.

Figure 17:
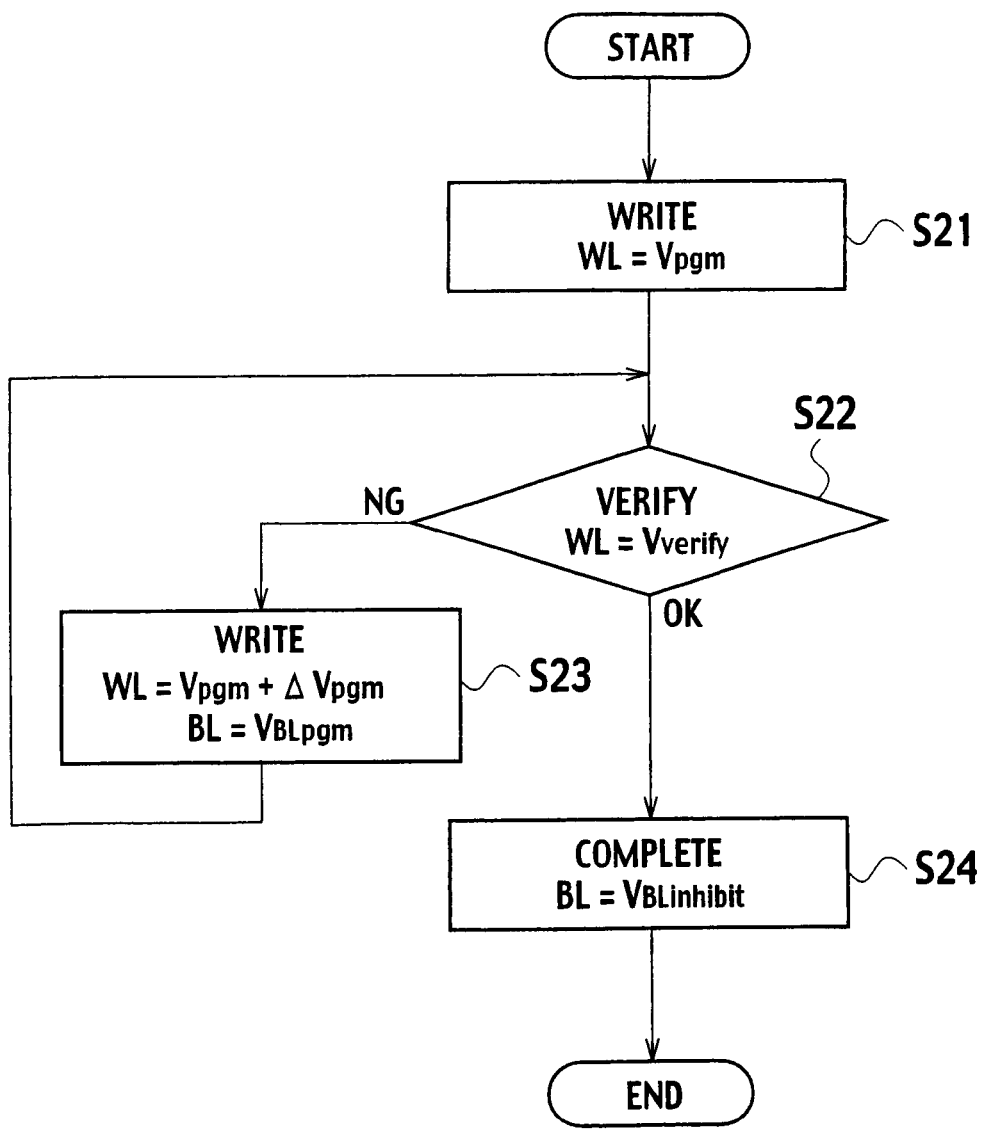
FIG. 17 is a flow chart for explaining an example of the writing operations of the non-volatile semiconductor memory according to the first embodiment of the present invention.

Next, an example of the method for controlling the writing and verifying operations in the non-volatile semiconductor memory according to the first embodiment of the present invention will be described with reference to a flowchart in FIG. 17.

In Step S21, the writing operations are performed by applying operation voltages shown in time $T_{11}$ to $T_{12}$ in FIG. 16. In Step S22, the verifying operations are performed. In the verifying operations, the operation voltages shown in time $T_{12}$ to $T_{13}$ in FIG. 16 are used to read the potential of the selected bit line $BL_1$. As a result, it is determined whether or not the writing has been properly performed. If it is determined that the writing has not been properly performed, the processing goes to Step 23. On the other hand, if it is determined that the writing has been properly performed, the processing goes to Step S24.

In Step S23, rewriting operations are performed on the memory cell transistor $MT_{11}$ in which the writing has not been properly performed. In the rewriting operations, as shown in time $T_{12}$ to $T_{13}$ in FIG. 16, the voltage $(V_{pgm}+\Delta V_{pgm})$, higher than the applied voltage $V_{pgm}$ by $\Delta V_{pgm}$ (for example, one V), is applied to the selected word line $WL_1$. Thereafter, the processing goes back to the procedure in Step S22. In Step S24, as shown in time $T_{13}$ to $T_{14}$ in FIG. 16, a voltage $V_{BLinhibit1}$ (for example, three V) is applied to the selected bit line $BL_1$, and a voltage $V_{BLinhibit2}$ (for example, 2.5 V) is applied to each of the non-selected bit lines $BL_2$ to $BL_n$, respectively, to inhibit writing. Thereafter, the writing is completed.

Figure 18:
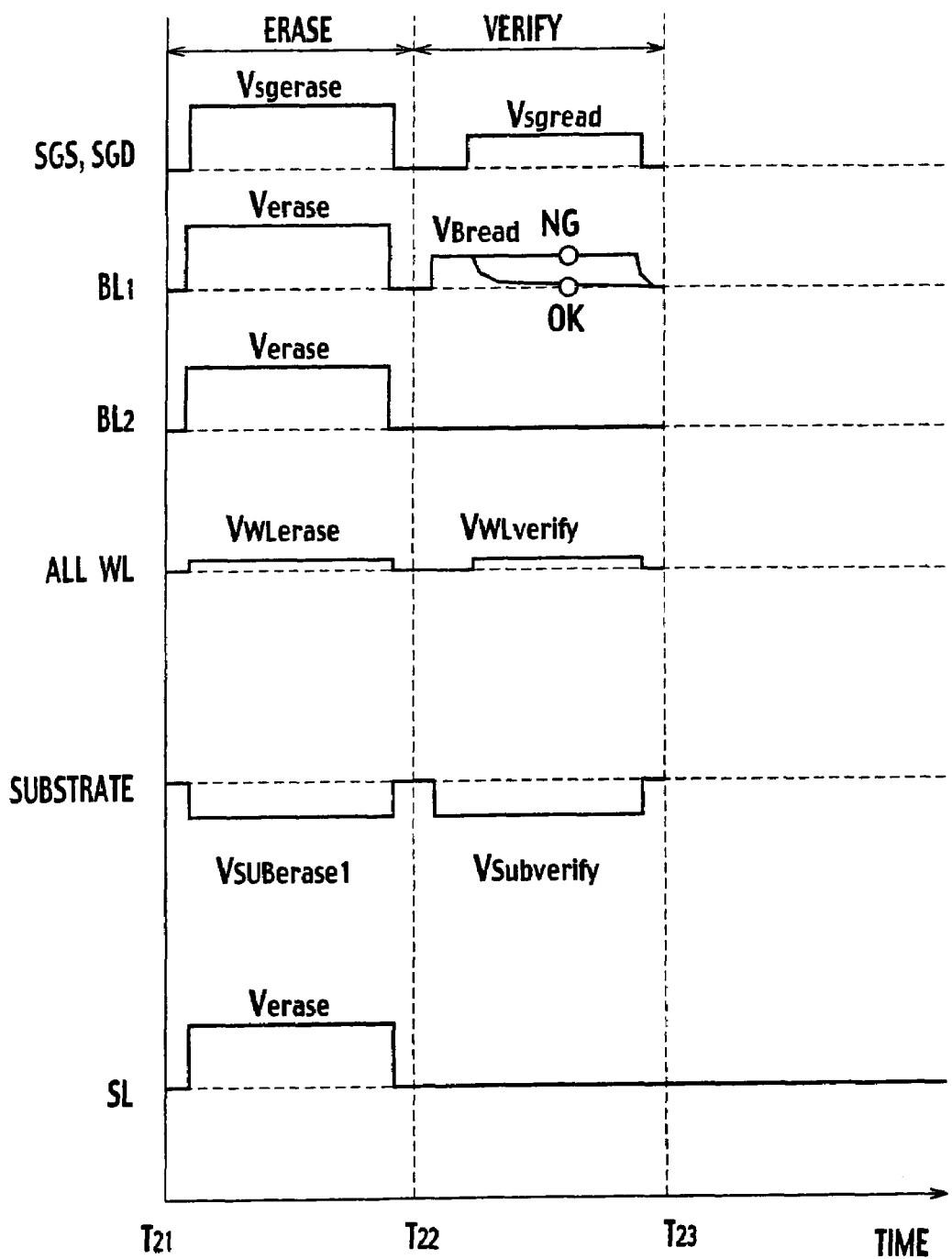
FIG. 18 is a timing chart for explaining an example of erasing operations of the non-volatile semiconductor memory according to the first embodiment of the present invention.
Figure 19:
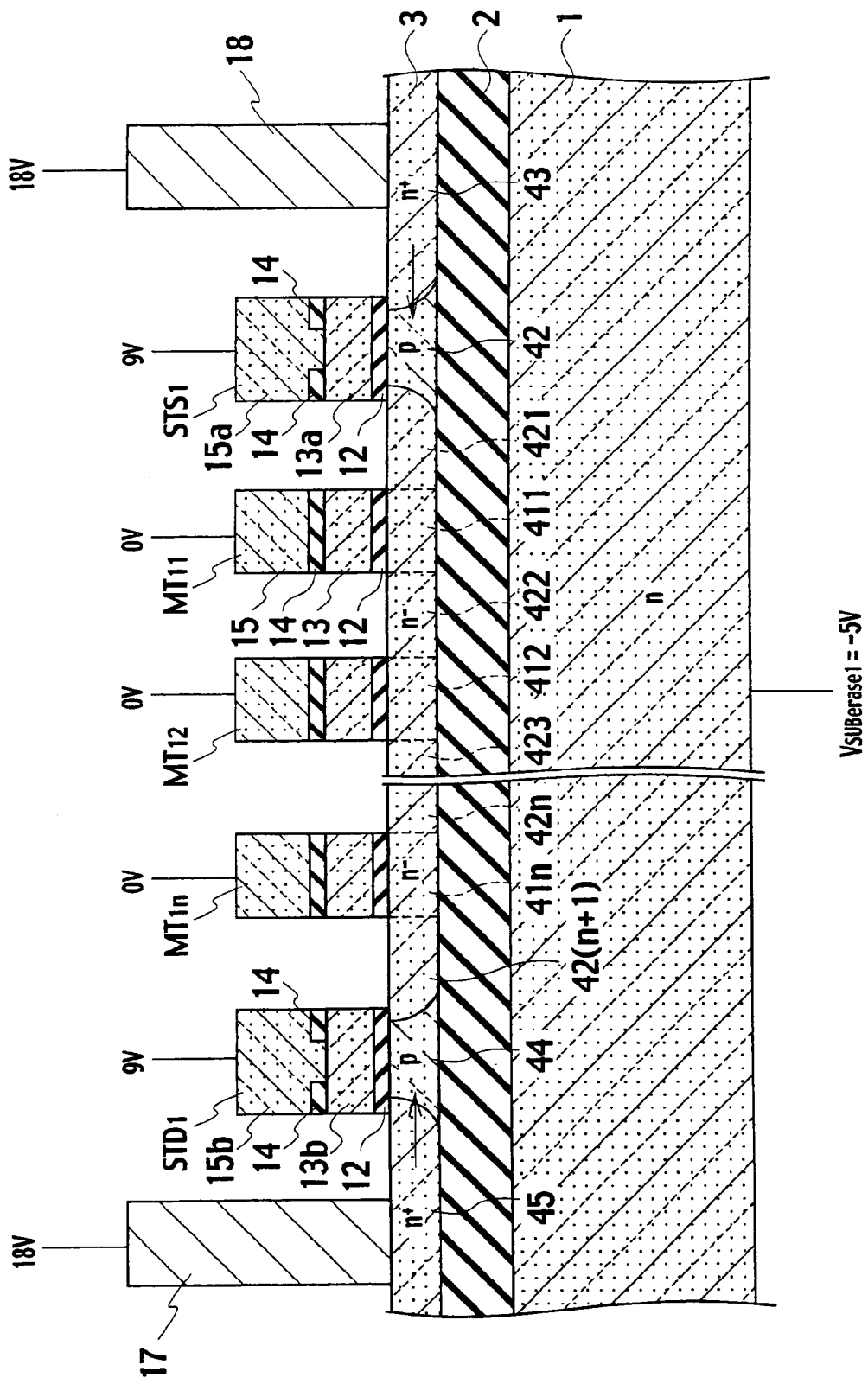
FIG. 19 is a cross-sectional view for explaining an example of the erasing operations of the non-volatile semiconductor memory according to the first embodiment of the present invention.

Next, an example of the erasing operations of the non-volatile semiconductor memory according to the first embodiment of the present invention will be described. In the erasing operations, as shown in FIGS. 18 and 19, a substrate voltage $V_{SUBerase1}$ (for example, −5 V) is applied to the supporting substrate 1. A voltage $V_{WLerase}$ (for example, 0 V) is applied to each of the word lines $WL_1$ to $WL_n$. A voltage $V_{sgerase}$ (for example, nine V), which is higher than the voltage $V_{WLerase}$ (for example, 0 V) applied to each of the word lines $WL_1$ to $WL_n$, is applied to each of the selected gate lines SGS and SGD. A voltage $V_{erase}$ (for example, 18 V), which is higher than the voltage $V_{sgerase}$ (for example, nine V) applied to each of the selected gate lines SGS and SGD, is applied to each of the bit lines $BL_1$ to $BL_m$ and the common source line SL, respectively.

As a result, as shown in FIG. 19, a current resulting from interband tunneling (an interband tunneling current) flows from the bit line contact plug 17 connected to the bit line $BL_1$ to the p-type channel region 44 of the select gate transistor $STD_1$. For this reason, the potential of the channel region 44 increases and a forward bias is applied to a pn junction between the channel region 44 and the drain region 42(n+1). Accordingly, the current flows into the drain region 42(n+1). On the other hand, an interband tunneling current flows from the source line contact plug 18 connected to the source line SL to the p-type channel region 42 of the select gate transistor $STS_1$. For this reason, the potential of the channel region 42 increases and a forward bias is applied to the pn junction between the channel region 42 and the source region 421. Accordingly, the current flows into the source region 421. For this reason, the voltages of the source and drain regions and the channel regions 411 to 41n of the memory cell transistors $MT_{11}$ to $MT_{1n}$ increase, and a voltage difference is generated between the voltage and 0V applied to each of the word lines, the difference being large enough for electrons to be extracted from the respective floating gate electrodes 13. Accordingly, a strong electric field is applied to the gate insulating film 12, and the erasing operations are performed.

Figure 20:
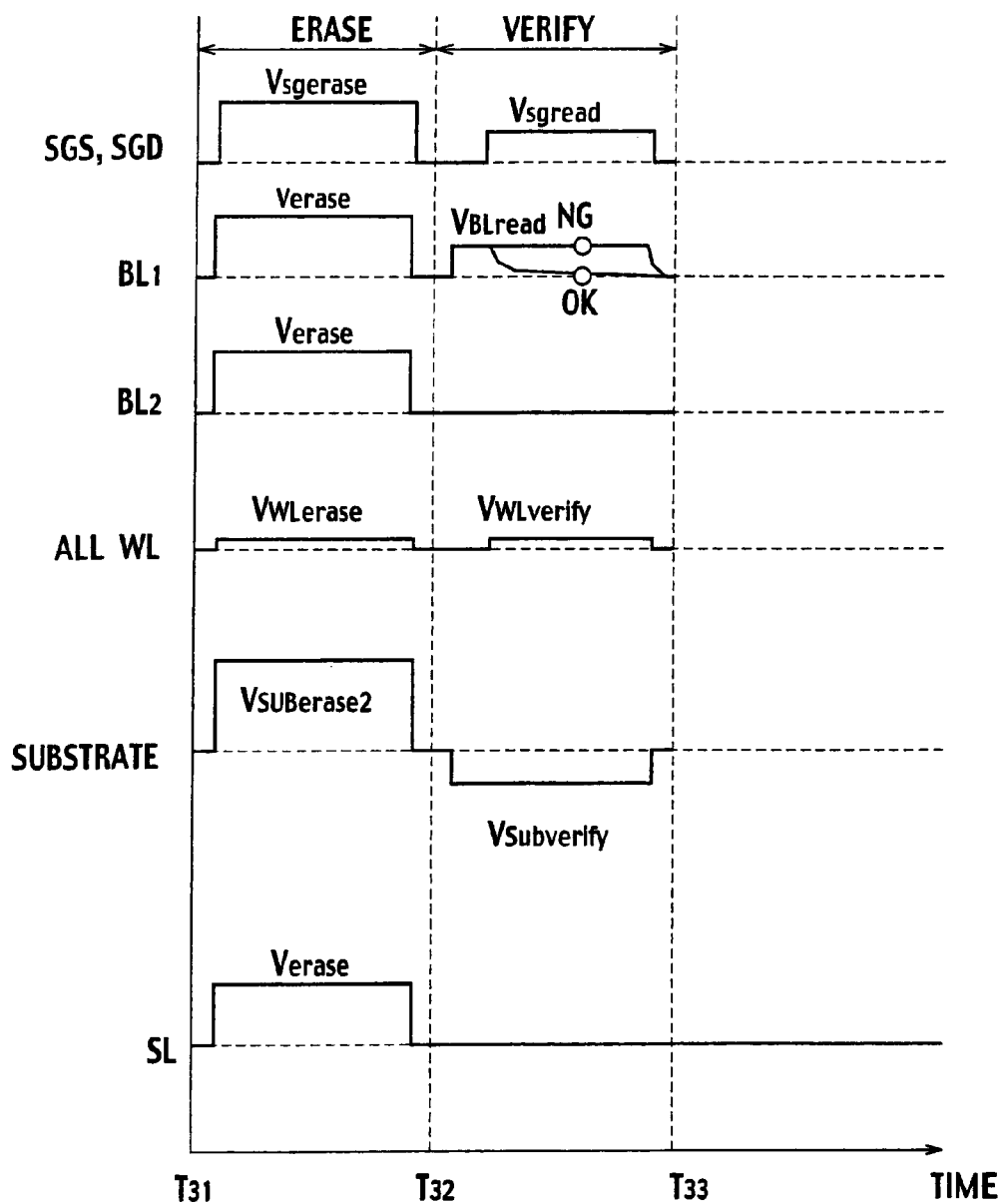
FIG. 20 is a timing chart for explaining another example of the erasing operation of the non-volatile semiconductor memory according to the first embodiment of the present invention.
Figure 21:
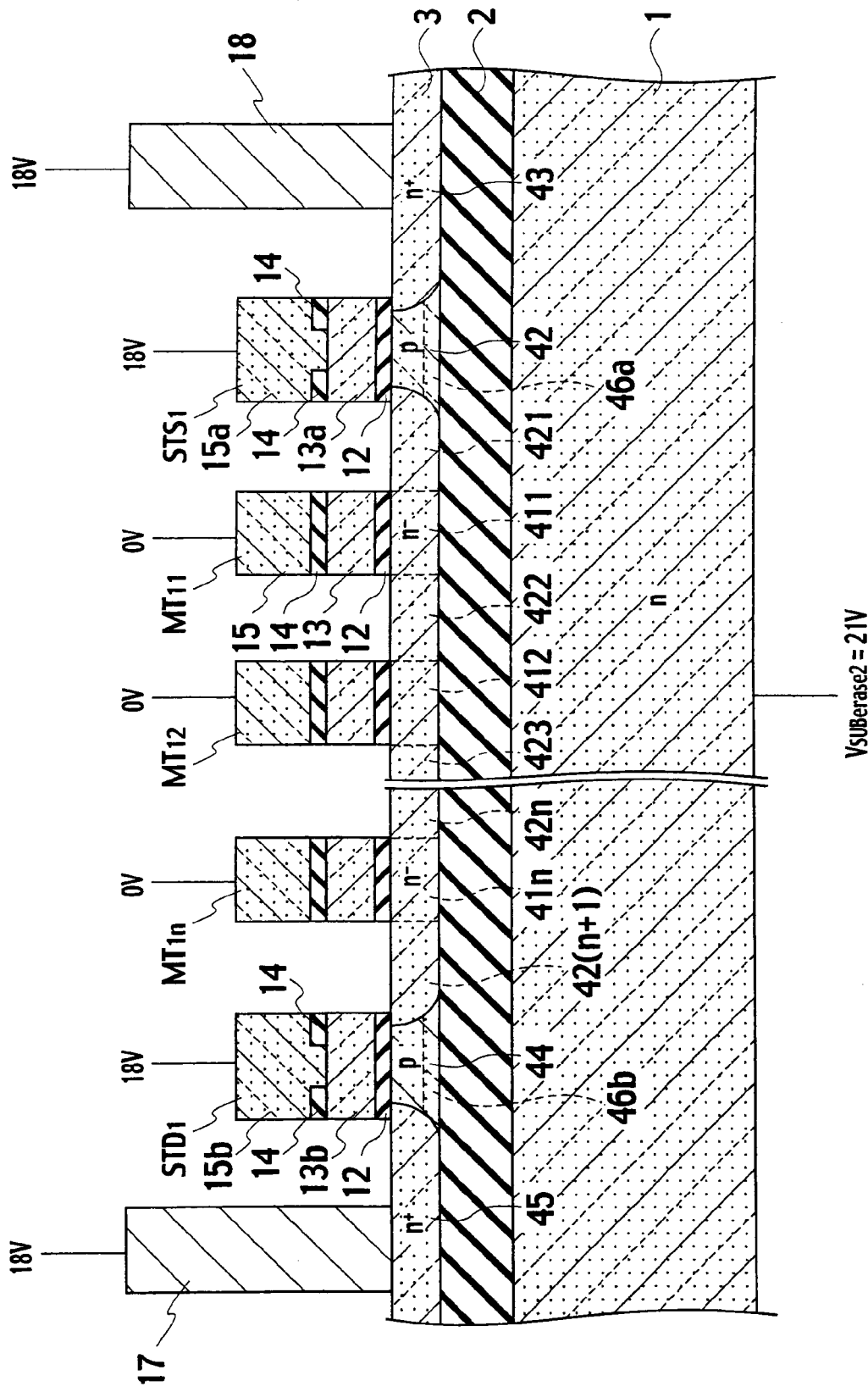
FIG. 21 is a cross-sectional view for explaining another example of the erasing operations of the non-volatile semiconductor memory according to the first embodiment of the present invention.

Next, another example of the erasing operations of the non-volatile semiconductor memory according to the first embodiment of the present invention will be described. A voltag $V_{WLerase}$ (for example, 0 V) is applied to each of the word lines $WL_1$ to $WL_n$. As shown in FIGS. 20 and 21, a voltage $V_{sgerase}$ (for example, 18 V) is applied to each of the selected gate lines SGS and SGD. A voltage $V_{erase}$ (for example, 18 V), which is higher than the voltage $V_{WLerase}$ (for example, 0 V) applied to each of the word lines $WL_1$ to $WL_n$, is applied to each of the bit lines $BL_1$ to $BL_m$ and the common source line SL, respectively. A positive substrate voltage $V_{SUBerase2}$ (for example, 21 V), which is higher than the voltage $V_{erase}$ (for example, 18 V) applied to each of the bit lines $BL_1$ to $BL_m$ and the common source line SL, is applied to the supporting substrate 1.

Since a sufficiently high positive substrate voltage $V_{SUBerase2}$ (for example, 21 V) is applied to the supporting substrate 1 as shown in FIG. 21, electrons are drawn to a surface of the buried insulating layer 2. Inversion layers 46a and 46b are respectively formed on undersurface sides of the channel regions 42 and 44 of the select gate transistors $STS_1$ and $STD_1$. Accordingly, a current flows into each of the source and drain regions 421 to 42n(n+1) of the memory cell transistors $MT_{11}$ to $MT_{1n}$. A current also flow into the channel regions 411 to 41n from the bit line contact plug 17 connected to the bit line $BL_1$ through the select gate transistor $STD_1$, or from the source line contact plug 18 connected to the source line SL through the select gate transistor $STS_1$. For this reason, the voltages of the source and drain regions 421 to 421n(n+1) and the channel regions 411 to 41n increase. As a result, this increased voltage generates a large enough voltage difference between the voltages and the voltage $V_{WLerase}$ applied to each of the control gate electrodes 15 connected to the word lines $WL_1$ to $WL_n$. Accordingly, a strong electric field is applied to the gate insulating films 12, and the erasing operations are performed.

Further, since there is the buried insulating layer 2 between the supporting substrate 1 and the SOI layer 3, capacitive coupling occurs between the supporting substrate 1 and the source and drain regions 421 to 42n(n+1) and the channel regions 411 and 41n of the memory cell transistors $MT_{11}$ to $MT_{1n}$. Accordingly, if a positive substrate voltage $V_{SUBerase2}$ (for example, 21 V) is applied to the supporting substrate 1, the potentials of the source and drain regions 421 to 421n(n+1) as well as the channel regions 411 to 41n of the memory cell transistors $MT_{11}$ to $MT_{1n}$ increase because of the capacitive coupling. From this reason, the voltages of the source and drain regions 421 to 42n(n+1) and the channel regions 411 to 41n also increase, so as to generate a large enough voltage difference between the voltage and the voltage $V_{WLerase}$ applied to each of the control gate electrodes 15 connected to the word lines $WL_1$ to $WL_n$. Accordingly, a strong electric field is applied to the gate insulating films 12, and the erasing operations are performed.

Note that in the example in which the erasing operations are performed using the inversion layers 46a and 46b as shown in FIG. 21, the thickness $T_{BOX}$ of the buried insulating layer 2 is preferably about one nm to one μm. If the thickness $T_{BOX}$ of the buried insulating layer 2 is not less than approximately one nm, it is possible to sufficiently reduce a leak current (a direct tunneling current) flowing through the buried insulating layer 2 when a voltage is applied to the buried insulating layer 2. On the other hand, if the thickness $T_{BOX}$ of the buried insulating layer 2 is not more than one μm, it is possible to draw enough electrons to the surface of the buried insulating layer 2 to form the inversion layers 46a and 46b, although it depends on the level of the voltage.

Figure 22:
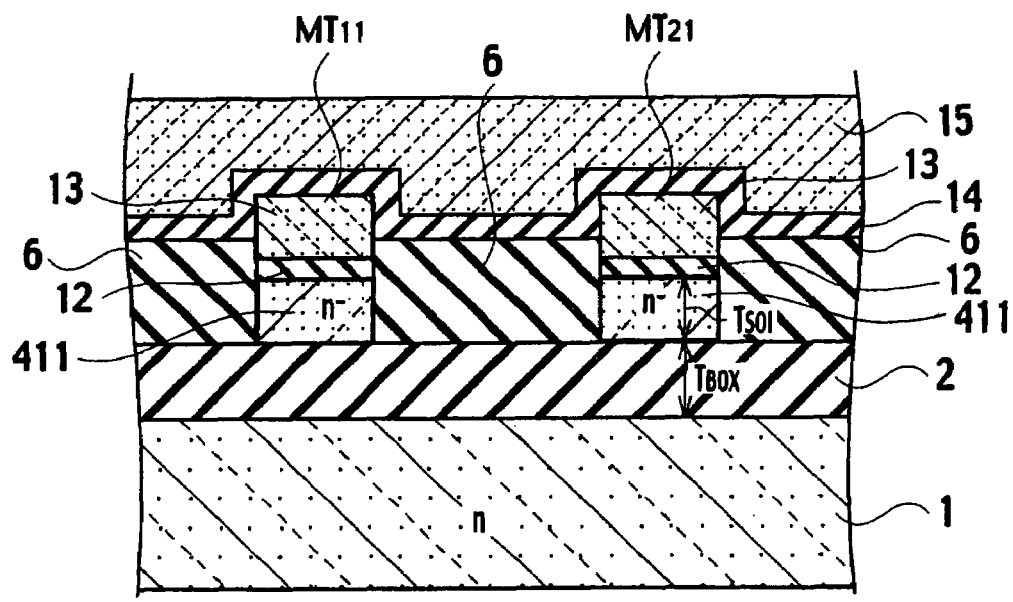
FIG. 22 is a cross-sectional view in the row direction showing another example of a cell array of a non-volatile semiconductor memory according to the first embodiment of the present invention.

According to the non-volatile semiconductor memory of the first embodiment of the present invention as well as the controlling method thereof, it is possible to properly perform the writing, reading and erasing operations of the memory cell transistors $MT_{11}$ to $MT_{1n}$ each having the SOI structure. Note that it does not matter that the device isolation insulating films 6 in the cell array region is thinner and the buried insulating layer 2 is continuous over the adjacent columns, as shown in FIG. 22, in place of the structure shown by the cross-sectional view in the row direction in FIG. 3.

Next, an example of a method for manufacturing the non-volatile semiconductor memory according to the first embodiment of the present invention will be described. Here, FIGS. 23A, 24A, . . . , to 35A show a cross-sectional process flow of the cell array shown in FIG. 2 in the column direction taken along the I-I line. In addition, FIGS. 23B, 24B, . . . , to 35B show a cross-sectional process flow of the cell array in the row direction taken along the II-II line.

Note that the method for manufacturing the non-volatile semiconductor memory shown in FIG. 23A to FIG. 35B is an example. It is possible to provide the non-volatile semiconductor memory by other various methods.

Figure 23A:
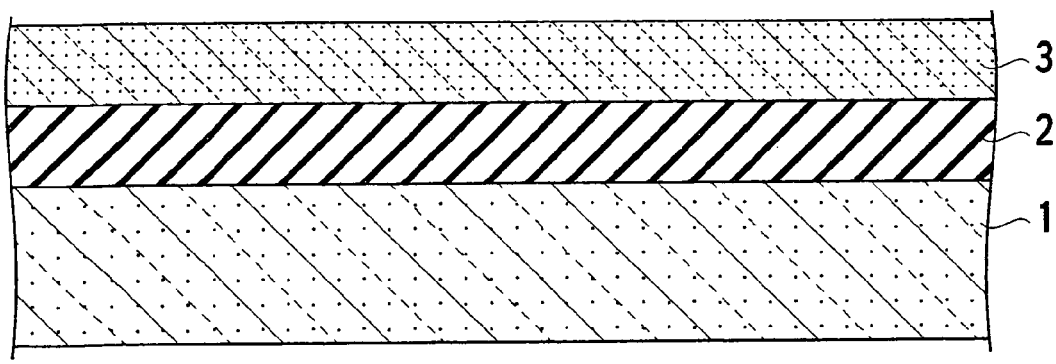
FIG. 23A is a cross-sectional view in the column direction (I-I direction of FIG. 2) showing an example of a method for manufacturing the non-volatile semiconductor memory according to the first embodiment of the present invention.
Figure 23B:
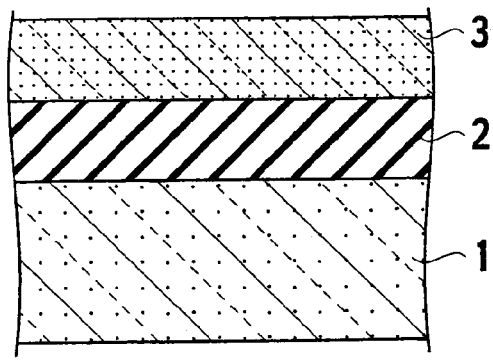
FIG. 23B a cross-sectional view in the row direction (II-II direction of FIG. 2) showing an example of the method for manufacturing the non-volatile semiconductor memory according to the first embodiment of the present invention.

First, a supporting substrate 1 of silicon (Si) or the like is prepared. As shown in FIGS. 23A and 23B, the SOI layer 3 on the buried insulating layer 2 is prepared. Using SIMOX technique, oxygen ions ($O^+$) are implanted into the supporting substrate 1 and then the supporting substrate 1 is thermally treated. Thereby, the buried insulating layer 2 is formed in the supporting substrate 1, and the SOI layer 3 is formed on the buried insulating layer 2.

Instead of the SIMOX technique, a wafer bonding technique may be used. According to the wafer bonding technique, the buried insulating layer 2 is formed on one of two wafers. Then, the two wafers are bonded, and are thermally treated. Subsequently, one of the two wafers is made into a thin film through planarization, thereby forming the SOI layer 3.

Figure 24A:
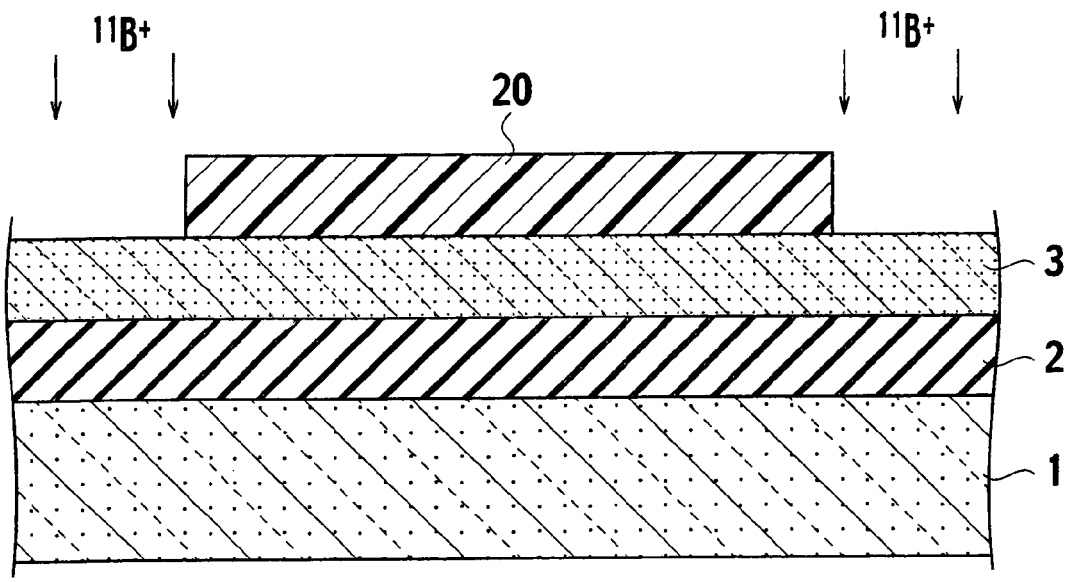
FIG. 24A is a cross-sectional view in the column direction after the process of FIG. 23A showing the method for manufacturing the non-volatile semiconductor memory according to the first embodiment of the present invention.
Figure 24B:
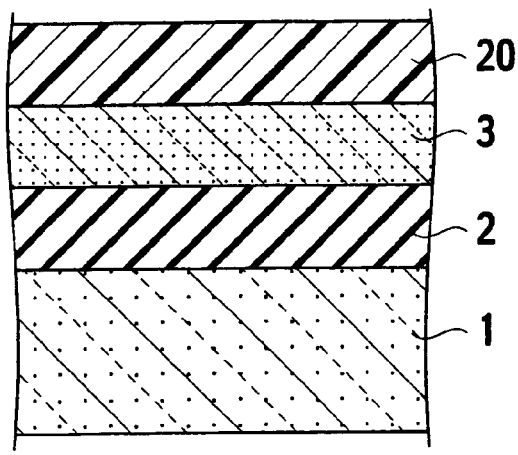
FIG. 24B is a cross-sectional view in the row direction after the process of FIG. 23B showing the method for manufacturing the non-volatile semiconductor memory according to the first embodiment of the present invention.

A resist film 20 is coated on the SOI layer 3, and the resist film 20 is patterned by lithography. As shown in FIGS. 24A and 24B, ions having a p-type impurity, such as boron ($^{11}B^+$), are implanted with the patterned resist film 20 used as a mask. Residual resist film 20 is removed by a resist remover or the like. Subsequently, the impurity ions implanted in the SOI layer 3 are activated by thermal treatment. Consequently, p$^-$-type impurity diffusion layers (semiconductor regions) 40a and 40b are formed in regions for forming select gate transistors.

Figure 25A:
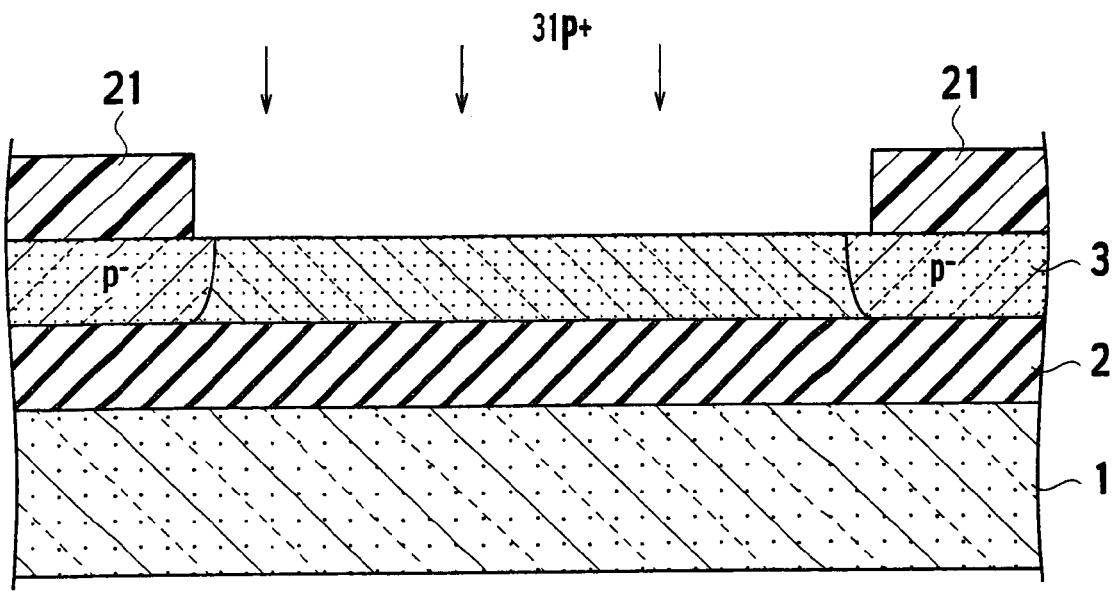
FIG. 25A is a cross-sectional view in the column direction after the process of FIG. 24A showing the method for manufacturing the non-volatile semiconductor memory according to the first embodiment of the present invention.
Figure 25B:
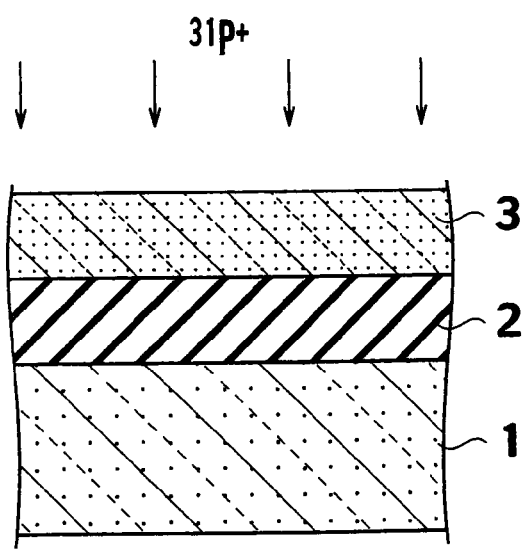
FIG. 25B is a cross-sectional view in the row direction after the process of FIG. 24B showing the method for manufacturing the non-volatile semiconductor memory according to the first embodiment of the present invention.

A resist film 21 is coated on the SOI layer 3, and then the resist film 21 is patterned with lithography. Subsequently, as shown in FIGS. 25A and 25B, ions having n-type impurity, such as phosphorus ($^{31}p^+$) and arsenic ($^{75}As^+$), are implanted with the patterned resist film 21 used as a mask.

Figure 26A:
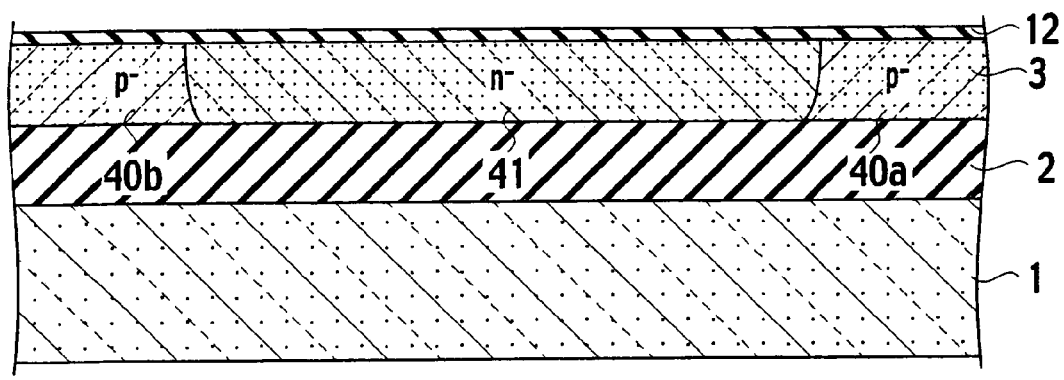
FIG. 26A is a cross-sectional view in the column direction after the process of FIG. 25A showing the method for manufacturing the non-volatile semiconductor memory according to the first embodiment of the present invention.
Figure 26B:
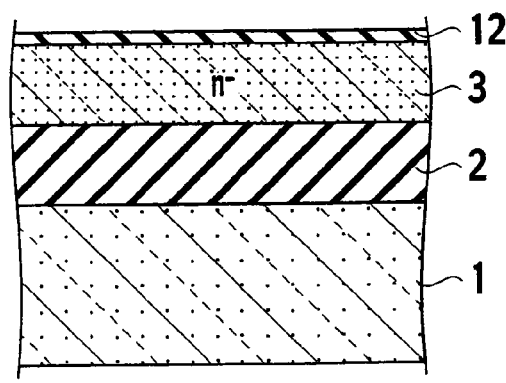
FIG. 26B is a cross-sectional view in the row direction after the process of FIG. 25B showing the method for manufacturing the non-volatile semiconductor memory according to the first embodiment of the present invention.
Figure 27A:
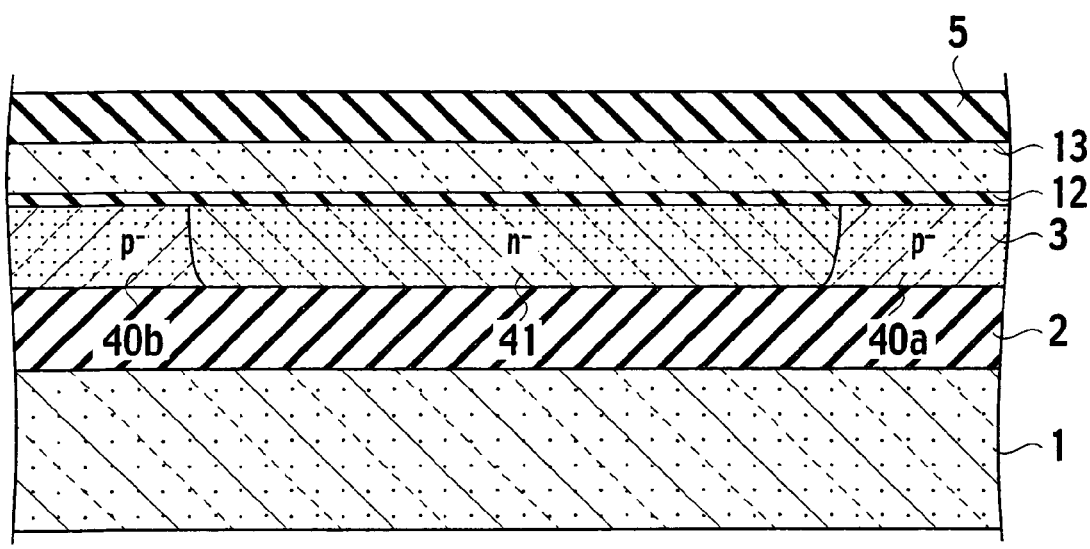
FIG. 27A is a cross-sectional view in the column direction after the process of FIG. 26A showing the method for manufacturing the non-volatile semiconductor memory according to the first embodiment of the present invention.
Figure 27B:
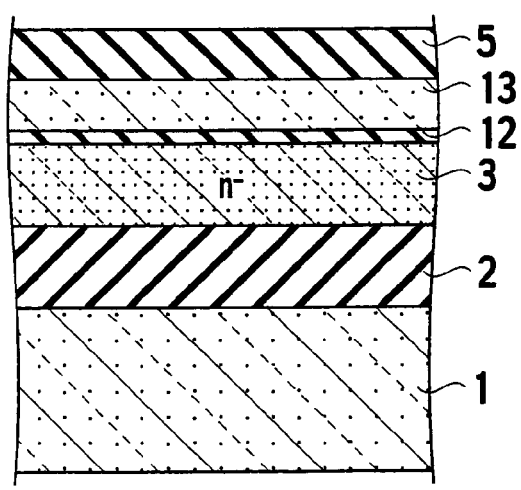
FIG. 27B is a cross-sectional view in the row direction after the process of FIG. 26B showing the method for manufacturing the non-volatile semiconductor memory according to the first embodiment of the present invention.

As shown in FIGS. 26A and 26B, a gate insulating film (tunnel oxidation film) 12, such as a $SiO_2$ film, is formed by thermal oxidation so that the thickness of the gate insulating film 12 is in a range of approximately one nm to 15 nm. Here, a n$^-$type impurity diffusion layer (semiconductor region) 41 is formed in a region for forming memory cell transistors by activating the impurity ions implanted in the SOI layer 3.

A P-doped first polysilicon layer (floating gate electrode) 13, which will become a floating gate electrode, is deposited on the gate insulating film 12 by reduced pressurized CVD (RPCVD) so that the thickness of the first polysilicon layer 13 may be in a range of about ten nm to about 200 nm. Subsequently, a mask film 5, such as a $Si_3N_4$ film of the like, is deposited on the first polysilicon layer 13 by CVD so that the thickness of the mask film 5 may be approximately 50 nm to 200 nm.

Figure 28A:
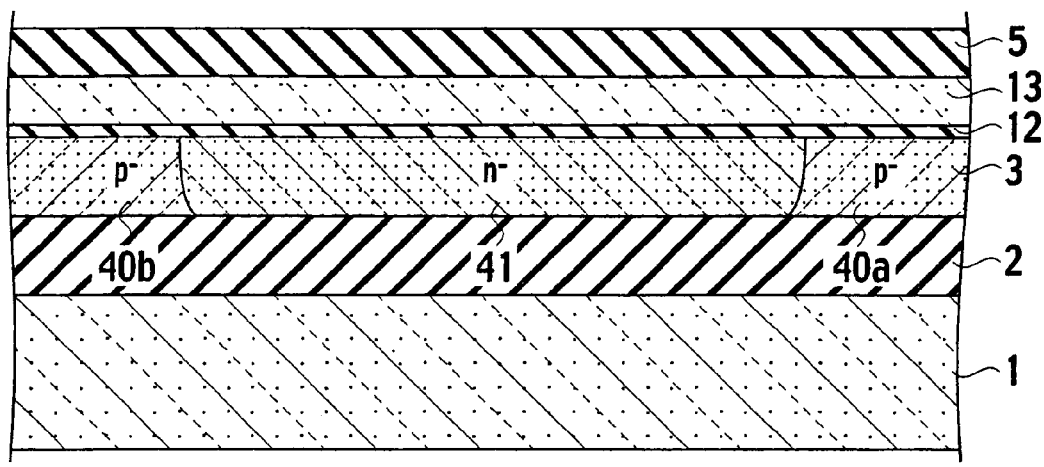
FIG. 28A is a cross-sectional view in the column direction after the process of FIG. 27A showing the method for manufacturing the non-volatile semiconductor memory according to the first embodiment of the present invention.
Figure 28B:
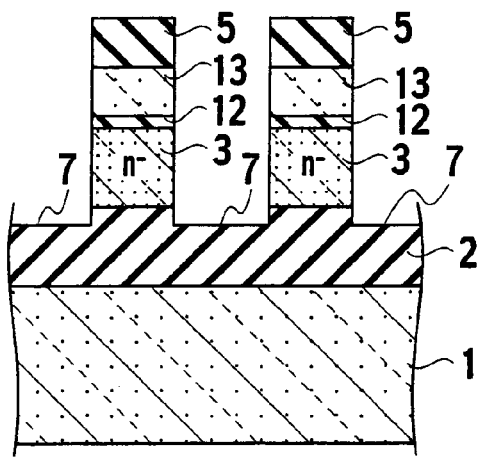
FIG. 28B is a cross-sectional view in the row direction after the process of FIG. 27B showing the method for manufacturing the non-volatile semiconductor memory according to the first embodiment of the present invention.

A resist film is spin-coated on the mask film 5, and an etching mask of the resist film is formed by lithography. Parts of the mask film 5 are removed in a selective manner by reactive ion etching (RIE) in which an etching mask is used. After etching, the resist film is removed. With the mask film 5 used as a mask, parts of the first polysilicon layer 13, the gate insulating film 12 and the SOI layer 3 are selectively removed in the column direction until the buried insulating layer 2 underneath is exposed. As a result, groove portions 7 are formed which penetrate through the first polysilicon layer 13, the gate insulating film 12 and the SOI layer 3, as shown in FIGS. 28A and 28B. Although FIG. 28B shows that parts of the buried insulating layer 2 are removed, a planar buried insulating layer 2 may remain.

Figure 29A:
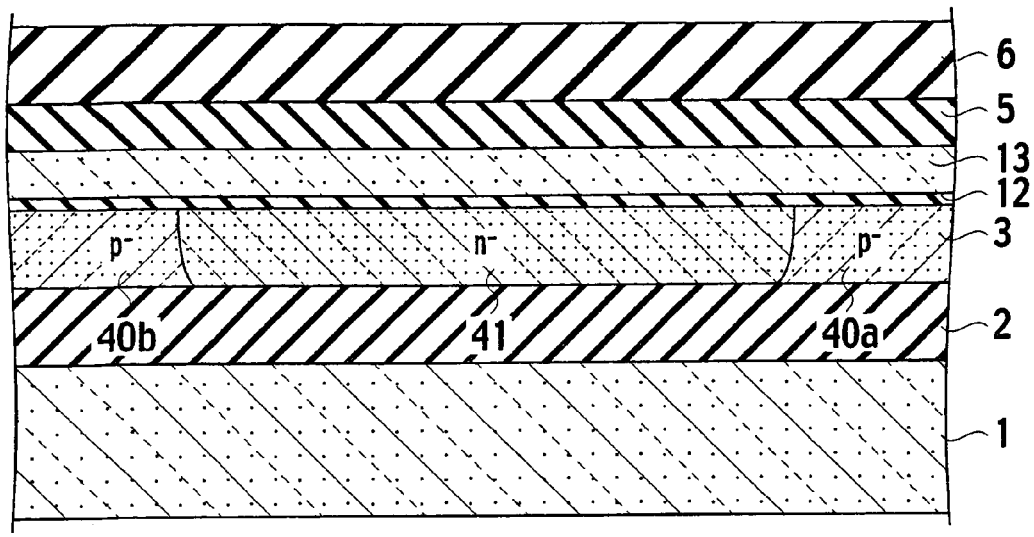
FIG. 29A is a cross-sectional view in the column direction after the process of FIG. 28A showing the method for manufacturing the non-volatile semiconductor memory according to the first embodiment of the present invention.
Figure 29B:
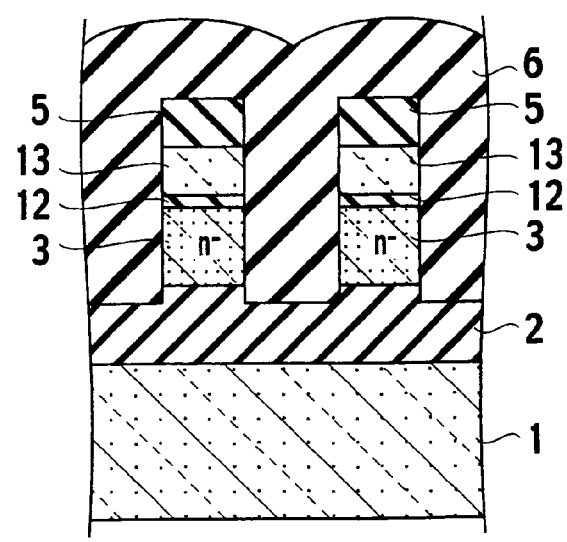
FIG. 29B is a cross-sectional view in the row direction after the process of FIG. 28B showing the method for manufacturing the non-volatile semiconductor memory according to the first embodiment of the present invention.
Figure 30A:
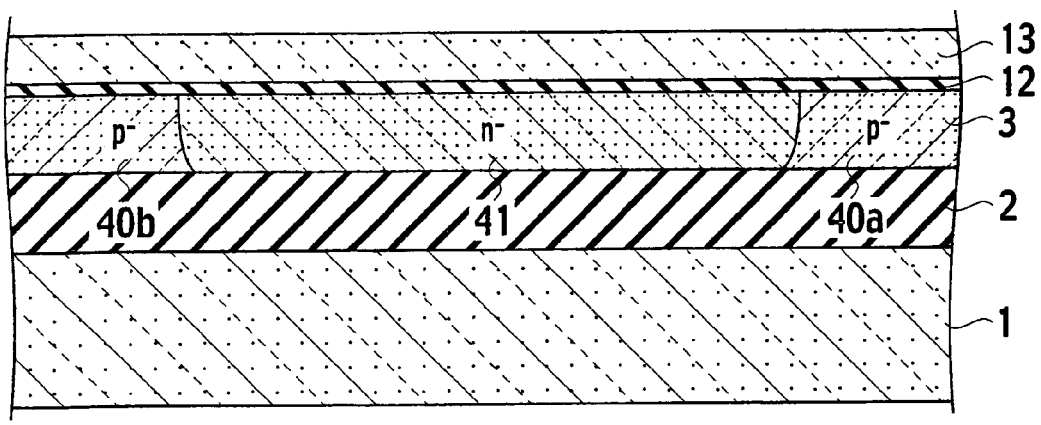
FIG. 30A is a cross-sectional view in the column direction after the process of FIG. 29A showing the method for manufacturing the non-volatile semiconductor memory according to the first embodiment of the present invention.
Figure 30B:
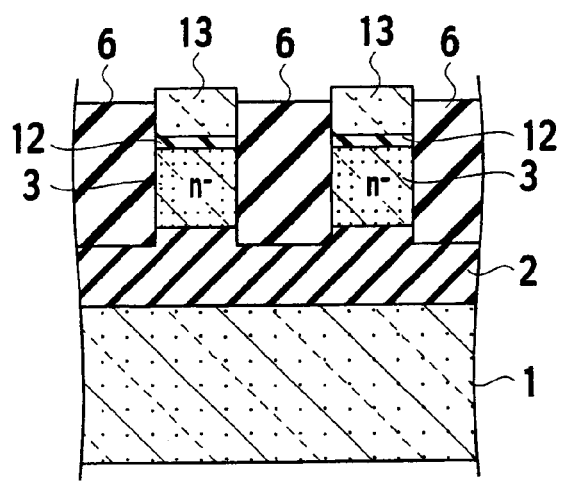
FIG. 30B is a cross-sectional view in the row direction after the process of FIG. 29B showing the method for manufacturing the non-volatile semiconductor memory according to the first embodiment of the present invention.

As shown in FIGS. 29A and 29B, an element isolation insulating film 6 is buried in the groove portions 7 by CVD or the like so that the thickness of the element isolation insulating film 6 is approximately 200 nm to 1,500 nm. As shown in FIGS. 30A and 30B, the element isolation insulating film 6 is planarized by chemical-mechanical polishing (CMP). The upper surfaces of the element isolation insulating film 6 are situated in positions higher than the upper surfaces of the gate insulating films 12. As a result, the elements of the memory cell transistors $MT_{11}$ to $MT_{21}$ in the row direction are completely isolated from one another.

Figure 31A:
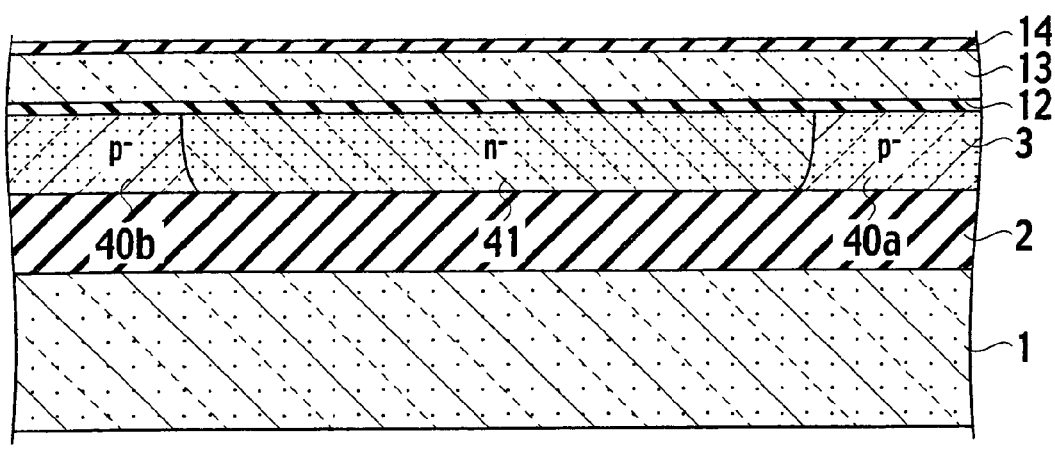
FIG. 31A is a cross-sectional view in the column direction after the process of FIG. 30A showing the method for manufacturing the non-volatile semiconductor memory according to the first embodiment of the present invention.
Figure 31B:
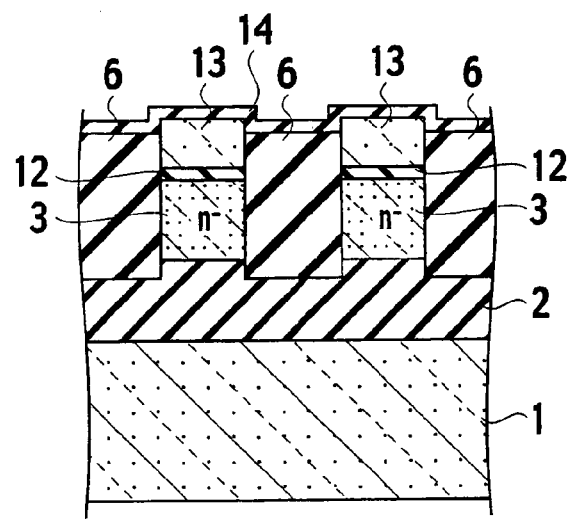
FIG. 31B is a cross-sectional view in the row direction after the process of FIG. 30B showing the method for manufacturing the non-volatile semiconductor memory according to the first embodiment of the present invention.
Figure 32A:
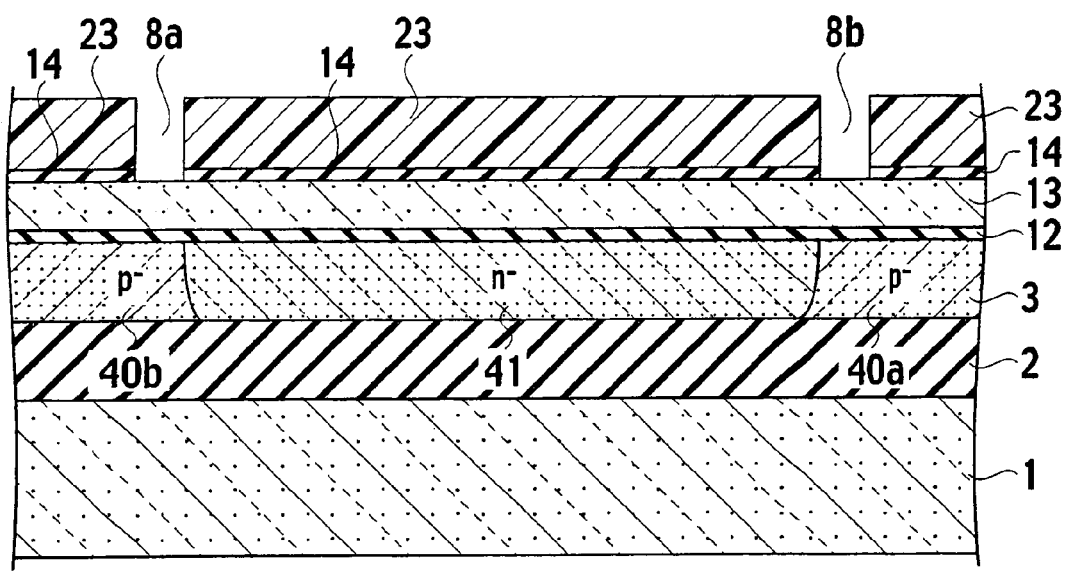
FIG. 32A is a cross-sectional view in the column direction after the process of FIG. 31A showing the method for manufacturing the non-volatile semiconductor memory according to the first embodiment of the present invention.
Figure 32B:
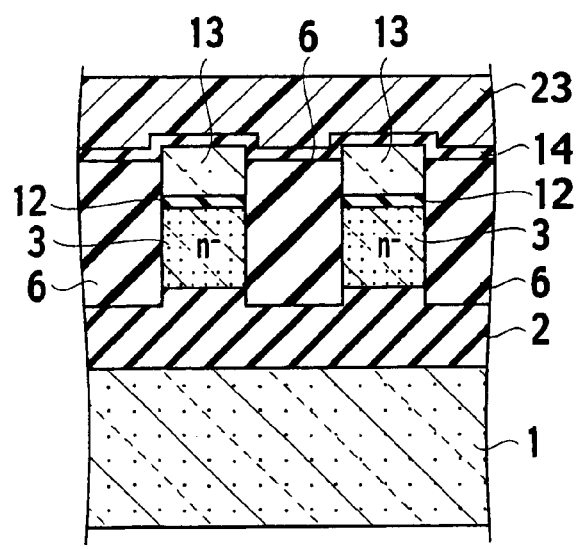
FIG. 32B is a cross-sectional view in the row direction after the process of FIG. 31B showing the method for manufacturing the non-volatile semiconductor memory according to the first embodiment of the present invention.
Figure 33A:
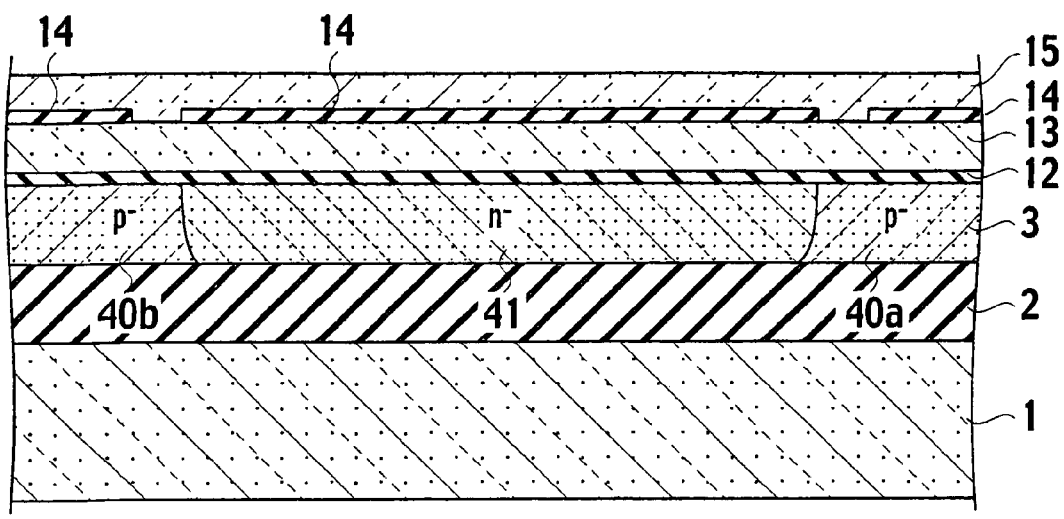
FIG. 33A is a cross-sectional view in the column direction after the process of FIG. 32A showing the method for manufacturing the non-volatile semiconductor memory according to the first embodiment of the present invention.
Figure 33B:
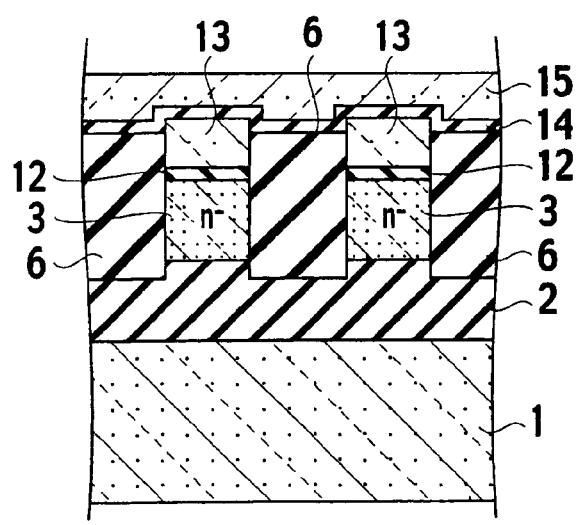
FIG. 33B is a cross-sectional view in the row direction after the process of FIG. 32B showing the method for manufacturing the non-volatile semiconductor memory according to the first embodiment of the present invention.

As shown in FIGS. 31A and 31B, an inter-electrode insulating film 14 is deposited on the tops of the first polysilicn layers 13 and the tops of the element isolation insulating film 6 by CVD or the like. A resist film 23 is coated on the inter-electrode insulating film 14, and the resist film 23 is patterned by lithography. As shown in FIGS. 32A and 32B, opening portions 8 are formed by RIE or the like in a part of the inter-electrode insulating film 14 with the patterned resist film 23 used as a mask. After removing the resist film 23, as shown in FIGS. 33A and 33B, a P-doped second polysilicon layer (control gate electrode) 15, which will be a control gate electrode, is deposited on the inter-electrode insulating film 14 by CVD so that the thickness of the second polysilicon layer 15 is approximately ten nm to 200 nm.

Figure 34A:
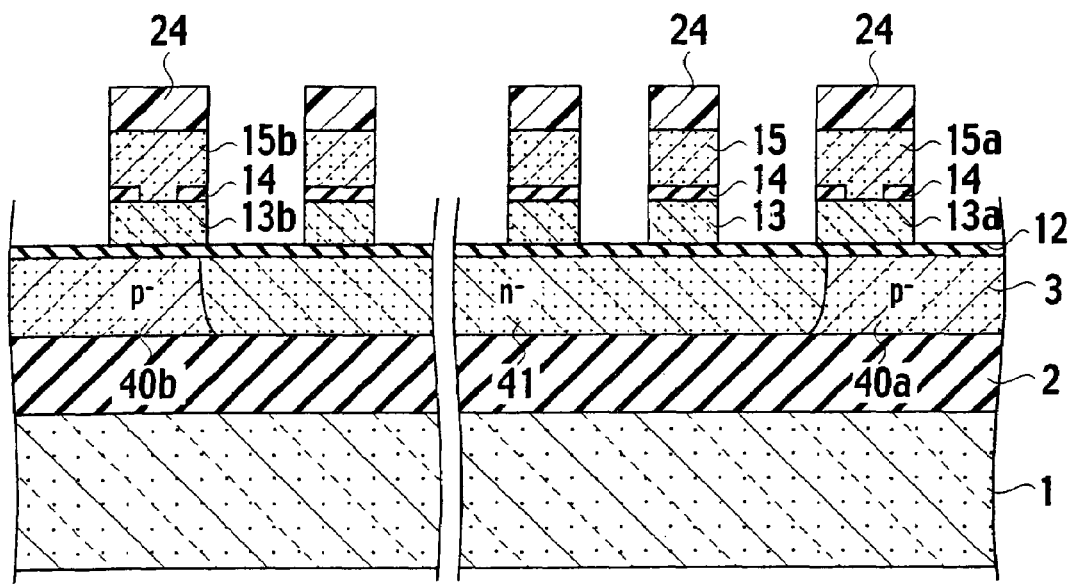
FIG. 34A is a cross-sectional view in the column direction after the process of FIG. 33A showing the method for manufacturing the non-volatile semiconductor memory according to the first embodiment of the present invention.
Figure 34B:
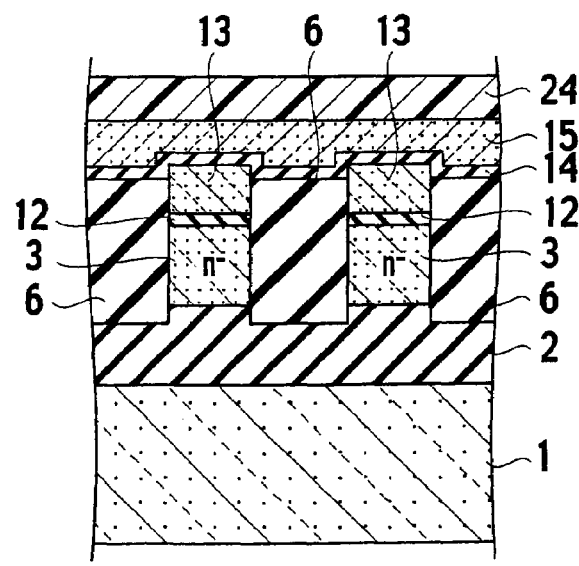
FIG. 34B is a cross-sectional view in the row direction after the process of FIG. 33B showing the method for manufacturing the non-volatile semiconductor memory according to the first embodiment of the present invention.
Figure 35A:
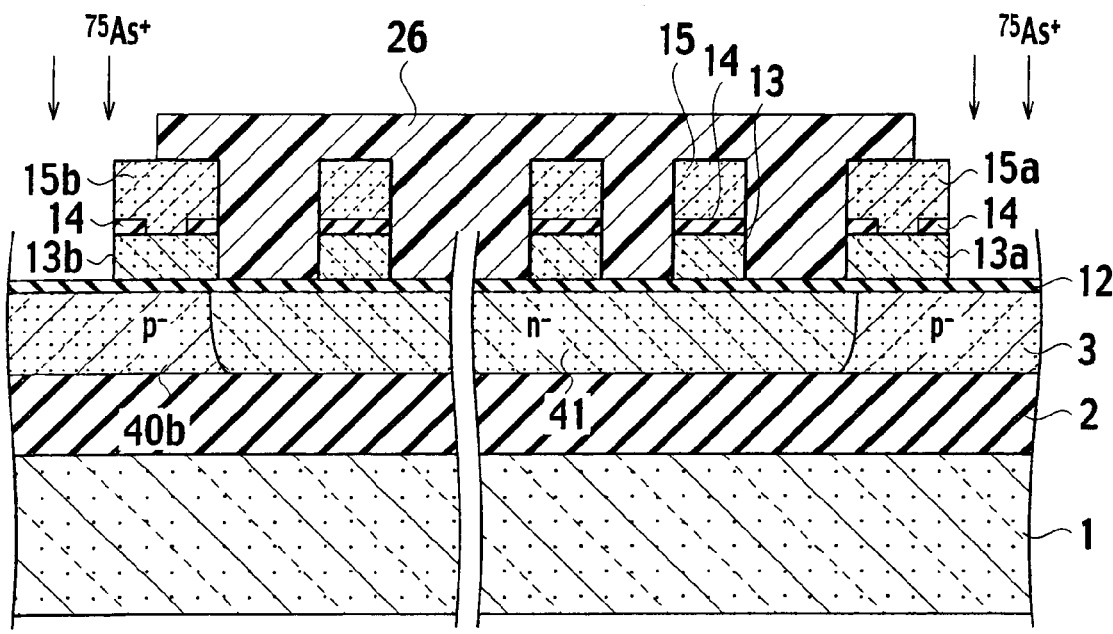
FIG. 35A is a cross-sectional view in the column direction after the process of FIG. 34A showing the method for manufacturing the non-volatile semiconductor memory according to the first embodiment of the present invention.
Figure 35B:
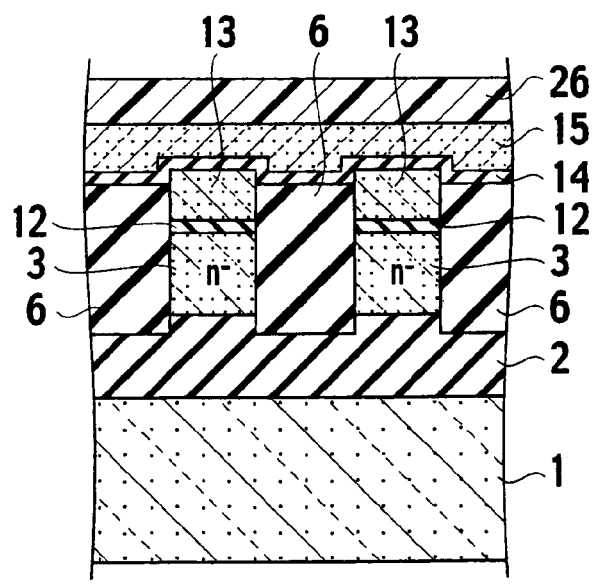
FIG. 35B is a cross-sectional view in the row direction after the process of FIG. 34B showing the method for manufacturing the non-volatile semiconductor memory according to the first embodiment of the present invention.

A resist film 24 is coated on the second polysilicon layer 15, and the resist film 24 is patterned by lithography. As shown in FIGS. 34A and 34B, parts of the second polysilicon layer 15, the inter-electrode insulating layer 14, and the first polysilicon layer 13 are selectively removed by RIE in the row direction with the patterned resist film 24 used as a mask until the gate insulating film 12 underneath is exposed. As a result, grooves are formed which penetrate through the second polysislicon layer 15, the inter-electrode insulating film 14 and the first polysilicon layer 13. Thereby, stacked structures of polysilicon layer 15, the inter-electrode insulating layer 14, and the first polysilicon layer 13 are formed. Consequently, channel regions 411 to 41n are formed in a part of the n$^-$-type impurity diffusion layer 41 underneath the floating gate electrodes 13. Source and drain regions 421 to 42(n+1) are formed in another part of the n$^-$-type impurity diffusion layer 41 positioned between the channel regions 411 to 41n. Consequently, the depletion mode memory cell transistors $MT_{11}$ to $MT_{1n}$ are formed. Here, the memory cell transistors, illustration omitted, are crossed in the column direction and in the row direction and the memory cell transistors are formed in a matrix. Simultaneously, the select gate electrodes 13a, 15a, 13b and 15b are formed. The resist film 24 is removed by a resist remover and the like.

A resist film 26 is coated thereon, and then the resist film 26 is patterned by lithography so as to cover the n$^-$-type impurity diffusion layer 41. Subsequently, n-type impurity ions, such as $^{75}As^+$, are selectively implanted to the p$^-$-type impurity diffusion layers 40a and 40b with the patterned resist film 26 used as a mask. The resist film 26 is removed by a resist remover and the like. Subsequently, p-type impurity ions and n-type impurity ions in the SOI layer 3 are activated by thermal treatment.

A p-type impurity diffusion layer (channel region) 42 and an n$^+$-type impurity diffusion layer (source region) 43 are formed in the SOI layer 3. Thereby, an enhancement mode select gate transistor $STS_1$ is formed. On the other hand, the p-type impurity diffusion layer (channel region) 44 and the n$^+$-type impurity diffusion layer (drain region) 45 are formed in the SOI layer 3. Thereby, the enhancement mode select gate transistor $STD_1$ is also formed. Subsequently, predetermined interconnects and insulating films are formed or deposited.

In accordance with the method for manufacturing the non-volatile semiconductor memory according to the first embodiment of the present invention, the non-volatile semiconductor memory shown in FIG. 1 can be provided.

Second Embodiment

Figure 36:
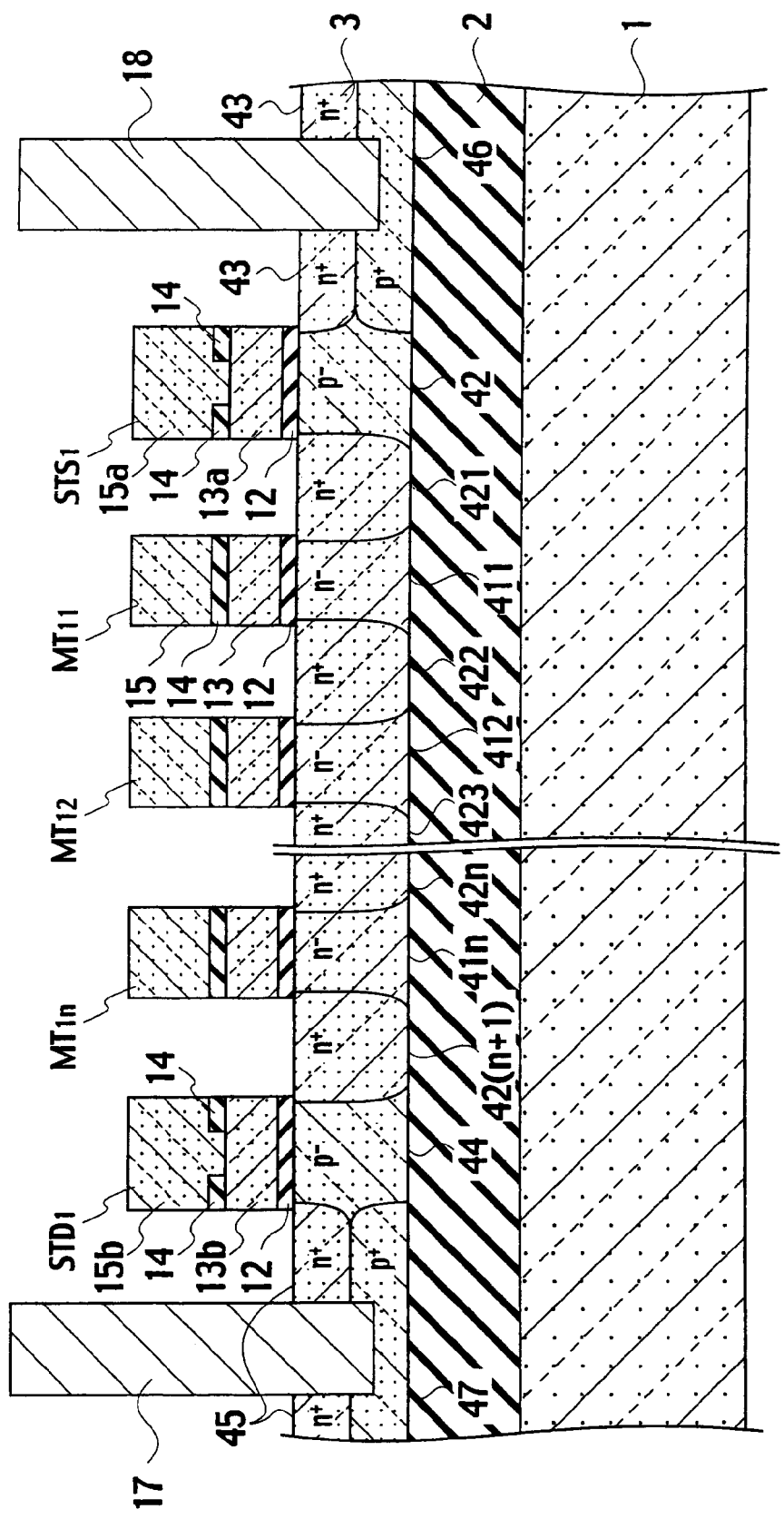
FIG. 36 is a cross-sectional view in a column direction showing an example of a cell array of a non-volatile semiconductor memory according to a second embodiment of the present invention.

A non-volatile semiconductor memory according to a second embodiment of the present invention is a NAND type flash memory. As shown in FIG. 36, the NAND flash memory includes a plurality of memory cell transistors $MT_{11}$t to $MT_{1n}$ provided with first conductivity type (n$^-$-type) channel regions 411 to 41n contacting a buried insulating layer (BOX layer) 2, and arranged in the column direction; a select gate transistor (a first select gate transistor) $STS_1$ is coupled with one end of a column of memory cell transistors $MT_{11}$ to $MT_{1n}$, and is provided with a second conductivity type (p$^-$-type) channel region 42 contacting the buried insulating layer 2; a second conductivity type (p$^+$-type) source line contact region 46 is electrically connected to the second conductivity type (p$^-$-type) channel region 42, and has an impurity concentration higher than that of the channel region 42; a source line contact plug 18 is electrically connected to a first conductivity type (n$^+$-type) source region 43 of the select gate transistor STS$_1$, and is electrically connected to the source line contact region 46; a select gate transistor (a second select gate transistor) STD$_1$ is coupled with the other end of the column of the memory cell transistors MT$_{11}$ to MT$_{1n}$, and is provided with a second conductivity type (p$^-$-type) channel region 44; a second conductivity type (p$^+$-type) bit line contact region 47 is electrically connected to the channel region 44 of the select gate transistor STD$_1$, and has an impurity concentration higher than that of the channel region 44; and a bit line contact plug 17 is electrically connected to a first conductivity type (n$^+$-type) drain region 45 of the select gate transistor STD$_1$, and is electrically connected to the bit line contact region 47.

Herein, the source line contact region 46 is disposed between the source region 43 of the select gate transistor STS$_1$ and the buried insulating layer 2. The source line contact region 46 is electrically connected to the channel region 42, and the source line contact plug 18 is electrically connected to the source line contact region 46 through the source region 43.

Concurrently, the bit line contact region 47 is disposed between the drain region 45 of the select gate transistor STD$_1$ and the buried insulating layer 2. The bit line contact region 47 is electrically connected to the channel region 44, and the bit line contact plug 17 is electrically connected to the bit line contact region 47 through the drain region 45.

The p-type impurity concentration of each of the source contact region 46 and the bit line contact region 47 is, for example, approximately $1 \times 10^{19}$ cm$^{-3}$ to $1 \times 10^{20}$ cm$^{-3}$. The p-type impurity concentration of each of the channel regions 42 and 44 of the select gate transistors STS$_1$ and STD1 is, for example, approximately $1 \times 10^{17}$ cm$^{-3}$ to $1 \times 10^{18}$ cm$^{-3}$. The n-type impurity concentration of each of the source region 43 of the select gate transistor STS$_1$ and the drain region 45 of the select gate transistor STD$_1$ is approximately $1 \times 10^{19}$ cm$^{-3}$ to $1 \times 10^{20}$ cm$^{-3}$.

Next, a method for controlling an erasing operation in the non-volatile semiconductor memory according to the second embodiment of the present invention will be described. A description will be provided for an example of erasing data of the memory cell transistors MT$_{11}$ to MT$_{1n}$ shown in FIG. 36 as a method for controlling the erasing operations.

As to simultaneous erasing, as shown in time T$_{11}$ and T$_{12}$ in FIG. 18, a voltage V$_{Suberase}$, not more than 0 V (for example, 0 V), is applied to the supporting substrate 1. A voltage V$_{sgerase}$ (for example, 18 V) is applied to each of selected gate lines SGS and SGD, and a voltage V$_{erase}$ (for example, 18 V) is applied to each of the bit lines BL$_1$ to BL$_m$ and a common source line SL. A voltage V$_{WLerase}$ (for example, ten V) is applied to each of word lines WL$_1$ to WL$_n$.

Figure 37:
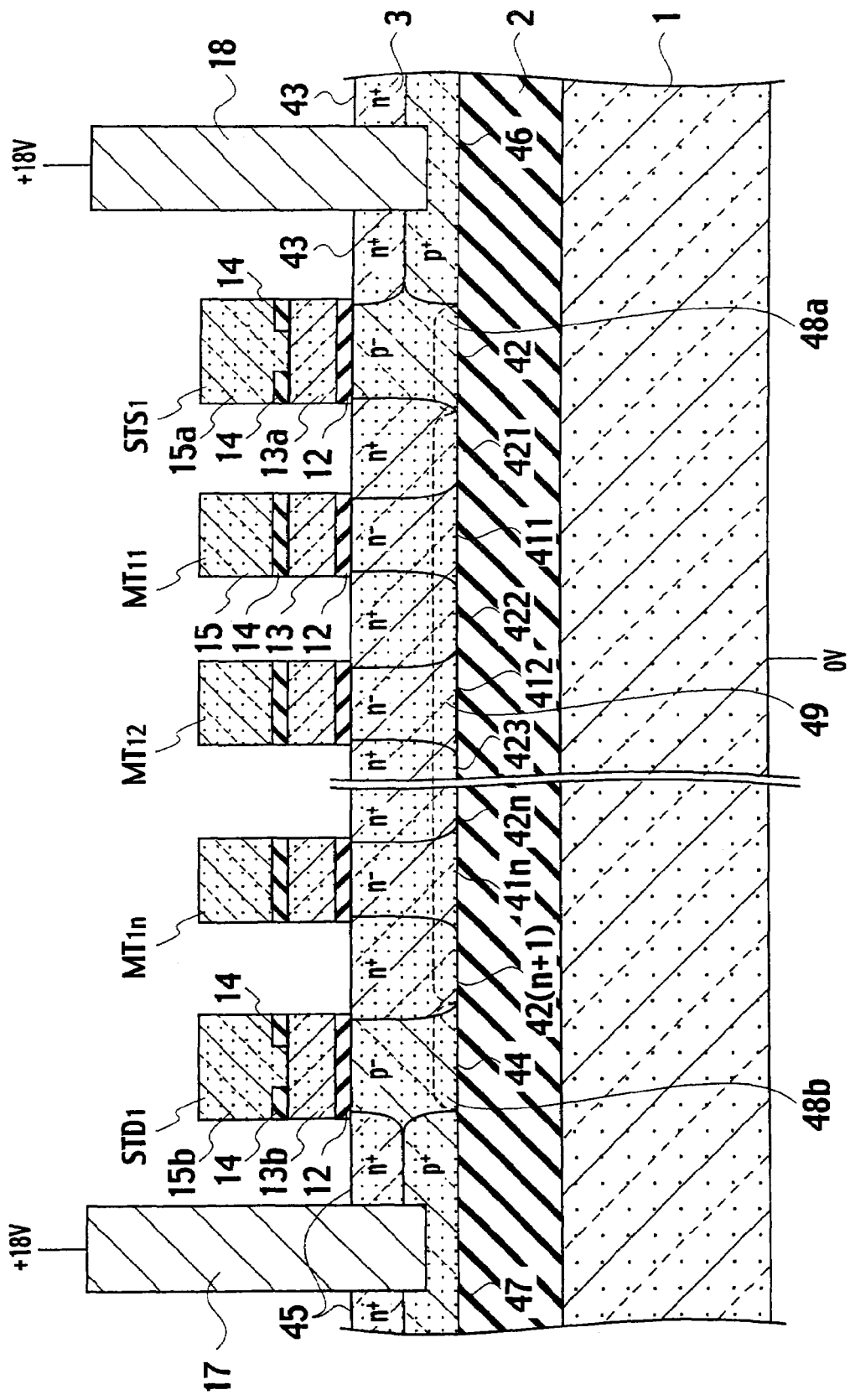
FIG. 37 is a cross-sectional view showing an example of the cell array with erasing operations of the non-volatile semiconductor memory according to the second embodiment of the present invention.

As shown in FIG. 37, the voltage V$_{erase}$ (for example, 18 V), transferred from the common source line SL, flows into the p$^-$-type channel region 42 of the select gate transistor STS$_1$ through the source contact region 46 via the source line contact plug 18. On the other hand, the voltage V$_{erase}$ (for example, 18 V), transferred from the bit line BL$_1$, flows into the p$^-$-type channel region 44 of the select gate transistor STD$_1$ through the bit line contact region 47 via the bit line contact plug 17. As a result, hole accumulation layers 48$a$ and 48$b$ are respectively formed in a boundary surface of the p-type channel regions 42 and 44 that include the buried insulating layer 2, and a hole inversion layer 49 is formed in a boundary surface of the source and drain regions 421 to 42(n+1) and the channel regions 411 to 41$n$ of the memory cell transistors MT$_{11}$ to MT$_{1n}$. Due to the hole inversion layer 49, the voltages V$_{erase}$ (for example, 18 V) from the bit line BL$_1$ and the common source line SL are transferred to the center of the column of the memory cell transistors MT$_{11}$ to MT$_{1n}$ through the boundary surface of the SOI layer 3 that includes the buried insulating layer 2. For this reason, electric fields are applied between each of the floating gate electrodes 13 and the SOI layer 3, and electrons in the floating gate electrodes 13 are extracted to the SOI layer 3. As a result, data of memory cell transistors MT$_{11}$ to MT$_{1n}$ are simultaneously erased.

FIG. 60 shows a comparative example of a non-volatile semiconductor memory including the SOI structure. As shown in FIG. 60, in a case where there are no source line contact region 46 and bit line contact region 47, as shown in FIG. 37, a reverse bias is applied to the pn junction between the n$^+$-type source region 43 connected to the common source line SL and the channel region 42 of the select gate transistor STS$_1$, and to the pn junction between the n$^+$-type drain region 45 connected to the bit line BL$_1$ and the p$^-$-type channel region 44 of the select gate transistor STD$_1$. For this reason, in some cases, the voltage V$_{erase}$ (for example, 18 V), applied to the bit line BL$_1$ or the common source line SL, does not flow to each of the channel regions 411 to 41$n$ of the memory cell transistors MT$_{11}$ to MT$_{1n}$. Accordingly, holes are required to be provided by generation of pairs of electrons and holes, or a leak current.

To the contrary, according to the second embodiment of the present invention, each of the source line contact region 46 and the bit line contact region 47, shown in FIG. 37, serve as a supply source for holes. For this reason, it is possible to instantly form the hole accumulation layers 48$a$ and 48$b$ as well as the hole inversion layer 49, without depending on the generation of pairs of electrons and holes or a leak current. Note that the applied voltage described herein is an example, and it is possible to arbitrarily set bias conditions for the simultaneous erasing as long as the hole inversion layer 49 is formed in the boundary surface of the SIO layer 3, which includes the buried insulating layer 2.

Figure 38:
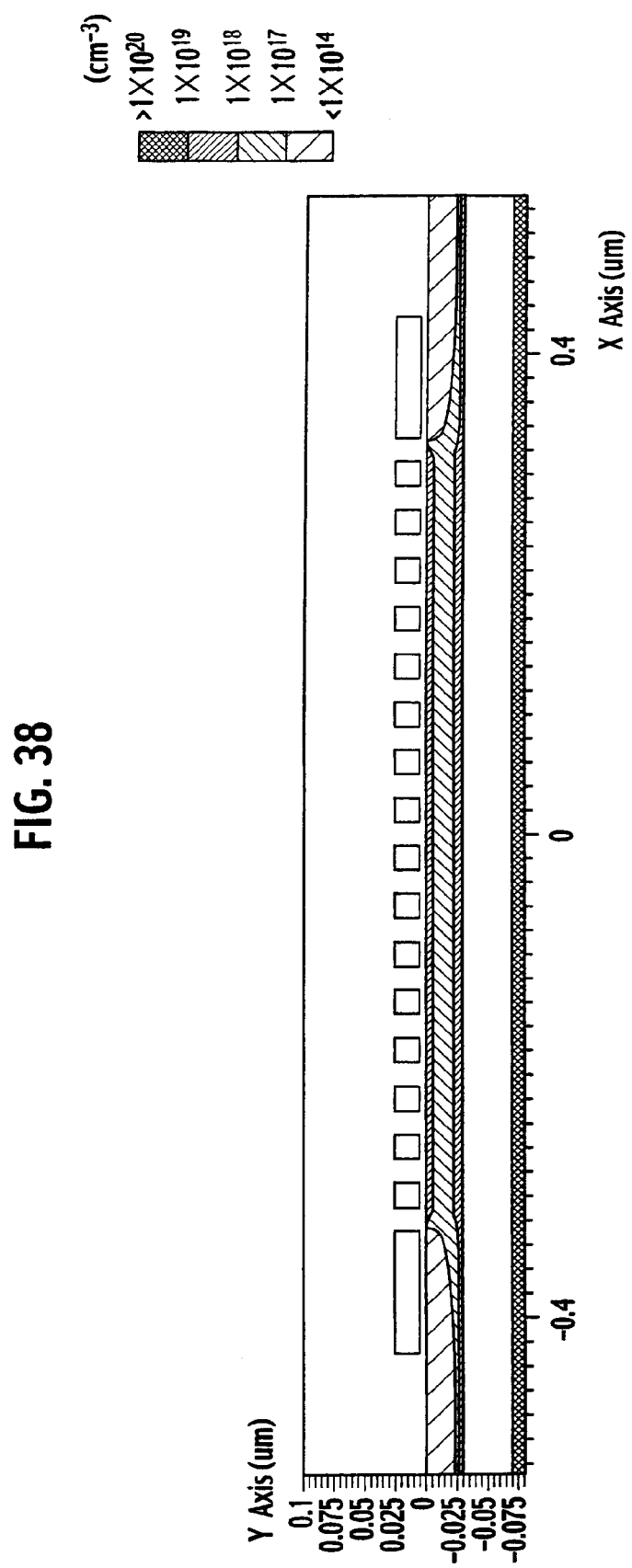
FIG. 38 is a graph showing a distribution of hole concentration of the non-volatile semiconductor memory according to the second embodiment of the present invention.
Figure 39:
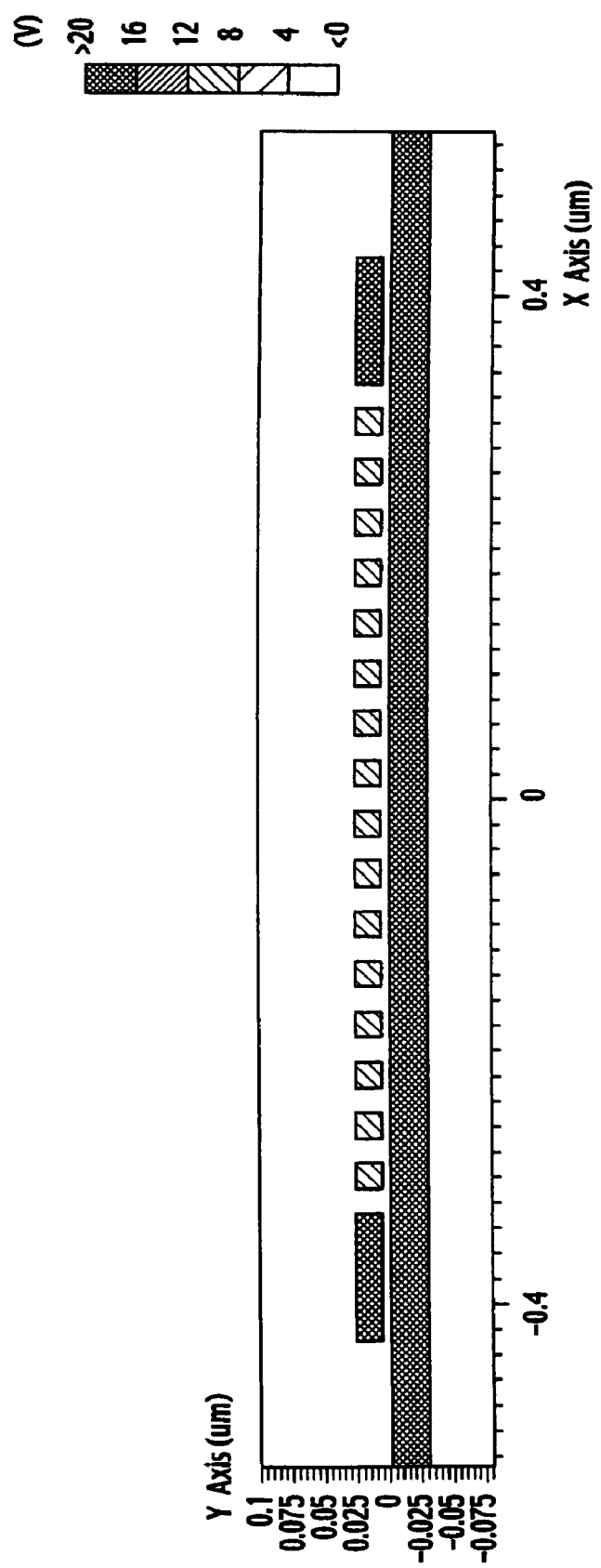
FIG. 39 is a graph showing a distribution of a potential of the non-volatile semiconductor memory according to the second embodiment of the present invention with erasing operations.

FIGS. 38 and 39 show examination results of the NAND flash memory operations by a simulator (a device simulator). FIG. 38 shows the result of hole concentration distribution one ms after applying 18 V to each of the bit lines, a source line and select gate transistors and applying ten V to word lines, and then applying 0 V to a supporting substrate. It is understood that the hole density is higher at the boundary surface of an SOI layer that includes a buried insulating layer in the select gate transistor regions, and at the boundary surface of the SOI layer that includes a buried insulating layer in a memory cell transistor region. It is also understood that hole accumulation layers are formed in the boundary surface of the SOI layer that includes a buried insulating layer in the select gate transistor regions and that a hole inversion layer is formed in the boundary surface of the SOI layer in the memory cell transistor region.

FIG. 39 shows potential distribution (quasi-Fermi level) of the memory cell transistor region in the same state as in the case of FIG. 38. Since the voltage (for example, 18 V), which is applied to each of the bit and source lines, flow to the a center of a NAND column, it is understood that the simultaneous erasing can be achieved.

According to the non-volatile semiconductor memory of the second embodiment of the present invention, although the memory has a SOI structure, erasing operations similar to the case of using a bulk substrate can be performed. In other words, as shown in FIG. 37, since the p$^+$-type source line contact region 46 and the bit line contact region 47 serve as the supply source of holes, the hole inversion layer 49 is instantly formed. As a result, it is possible to perform simultaneous erasing of the memory instantly.

When verifying operations are performed after the erasing operations, a voltage $V_{WLverify}$ (for example, two V) is applied to each of the word lines $WL_1$ to $WL_n$ and a voltage $V_{Subverify}$, less than 0 V (for example, 0 V), is applied to the supporting substrate 1 respectively. Thereby, potential of the bit line $BL_1$ is read as shown in time $T_{12}$ to $T_{13}$ in FIG. 18.

Respective methods for controlling the writing operation, verify operation and reading operation of the non-volatile semiconductor memory according to the second embodiment of the present invention are substantially similar to that of the first embodiment of the present invention.

Figure 40A:
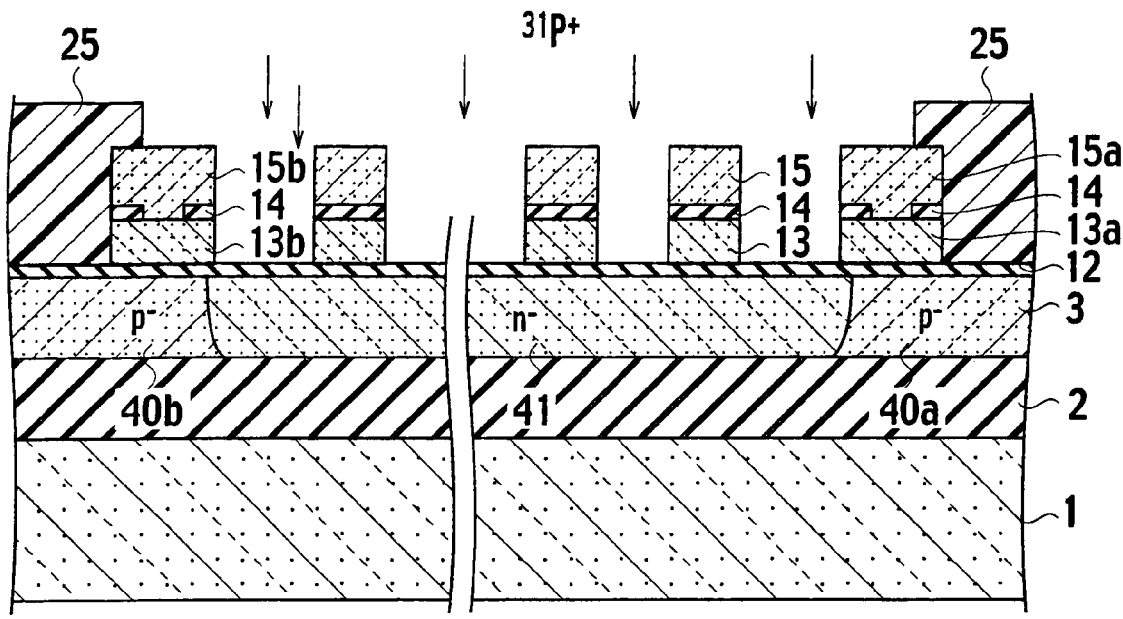
FIG. 40A is a cross-sectional view in the column direction showing an example of a method for manufacturing the non-volatile semiconductor memory according to the second embodiment of the present invention.
Figure 40B:
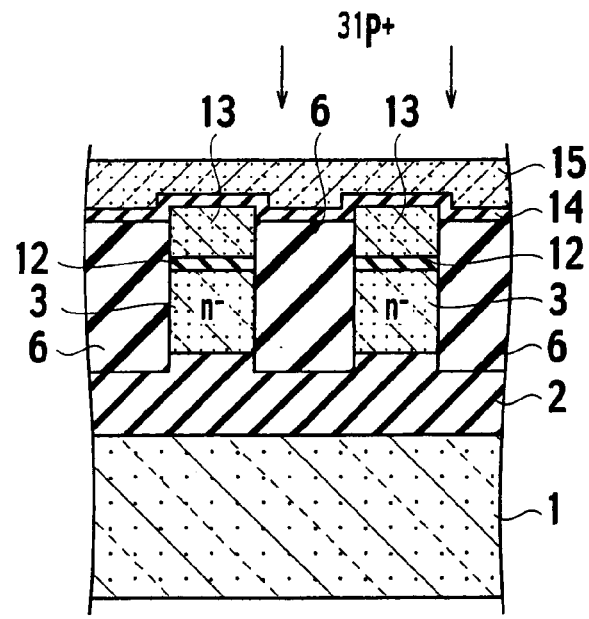
FIG. 40B is a cross-sectional view in a row direction showing an example of a method for manufacturing the non-volatile semiconductor memory according to the second embodiment of the present invention.
Figure 41A:
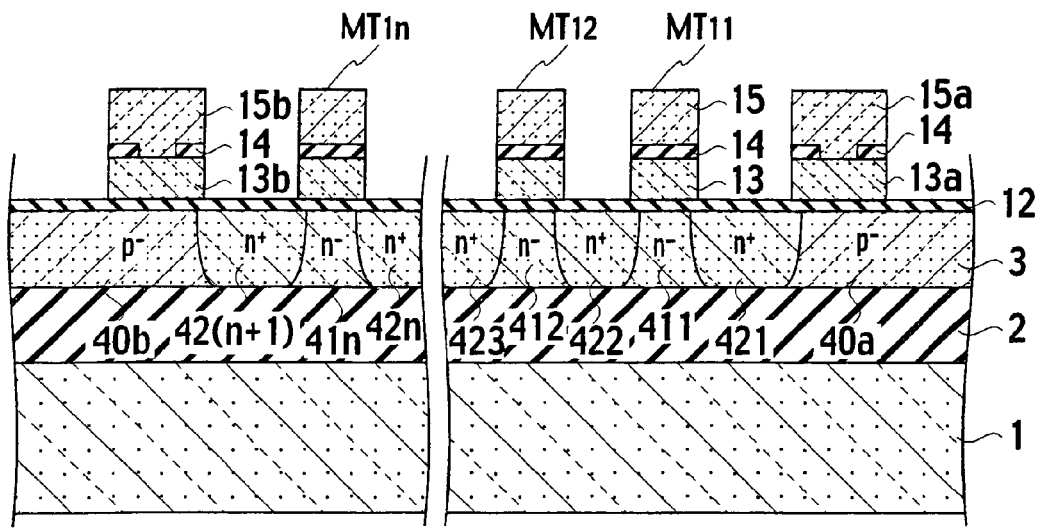
FIG. 41A is a cross-sectional view in the column direction after the process of FIG. 40A showing the method for manufacturing the non-volatile semiconductor memory according to the second embodiment of the present invention.
Figure 41B:
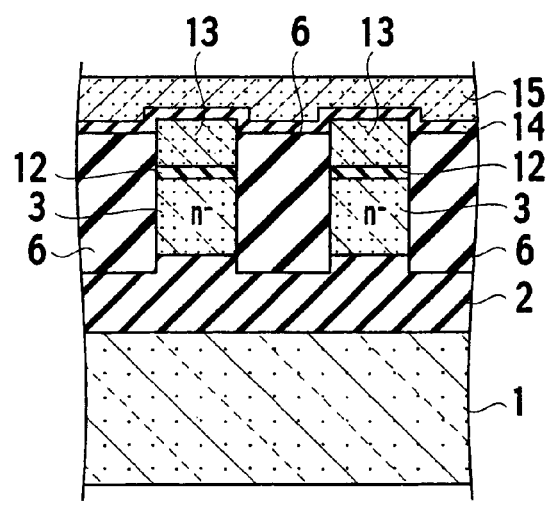
FIG. 41B is a cross-sectional view in the row direction after the process of FIG. 40B showing the method for manufacturing the non-volatile semiconductor memory according to the second embodiment of the present invention.

Next, a method for manufacturing the non-volatile semiconductor memory according to the second embodiment of the present invention will be described. A procedure shown in FIGS. 23A and 23B to 34A and 34B is similar to that in the first embodiment of the present invention. A resist film 25 is coated on gate electrodes 15, and is patterned by lithography technology to cover p⁻-type impurity diffusion layers (semiconductor regions) 40a and 40b, as shown in FIGS. 40A and 40B. By using a patterned resist film 25 and a pattern having a stacked structure of a control gate electrode 15, an inter-electrode insulating films 14, and floating gate electrodes 13, as a mask, n-type impurity ions such as $^{31}P^+$, $^{75}As^+$ or the like are implanted through the gate insulating film 12 into a n⁻type impurity diffusion layer 41 in a self-aligned manner. The residual resist film 25 is removed by a resist remover or the like. Thereafter, the n-type impurity ions are activated by thermal processing. Accordingly, as shown in FIGS. 41A and 41B, n⁺-type source and drain regions 421 to 42(n+1) are formed in a SOI layer 3, located under grooves, and n⁻-type channel regions 411 to 41n are formed in the SOI layer 3 directly under the floating gate electrode 13. In this manner, memory cell transistors $MT_{11}$ to $MT_{1n}$ of a depletion mode transistor are formed. In this manner, a plurality of the memory cell transistors, for which illustration is omitted, are formed in a matrix in which the memory cell transistors cross each other in the column and row directions.

Figure 42A:
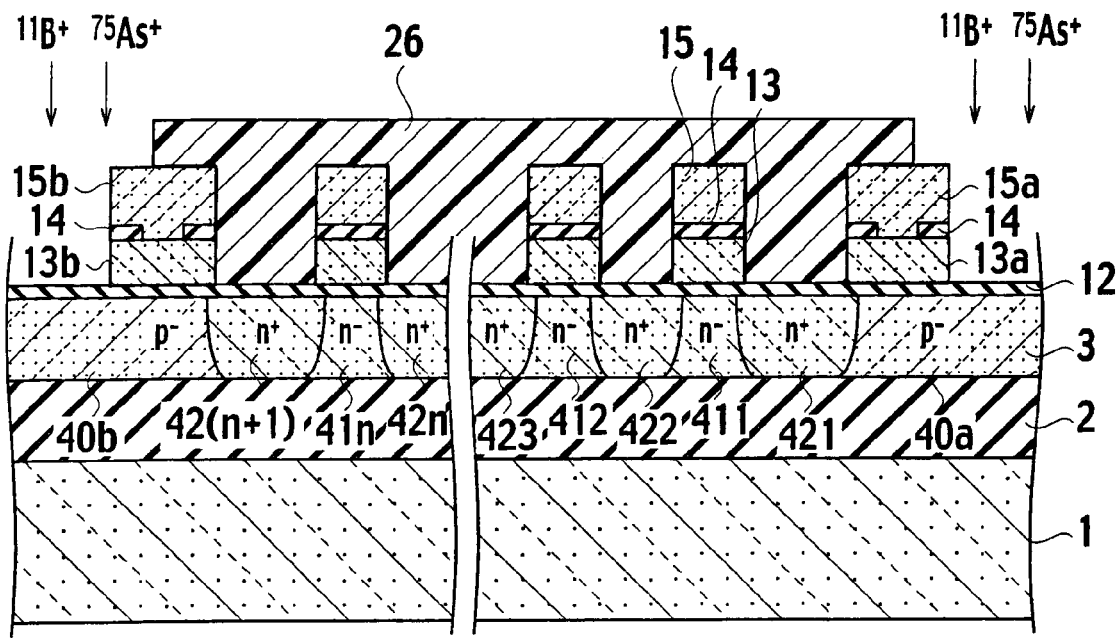
FIG. 42A is a cross-sectional view in the column direction after the process of FIG. 41A showing the method for manufacturing the non-volatile semiconductor memory according to the second embodiment of the present invention.
Figure 42B:
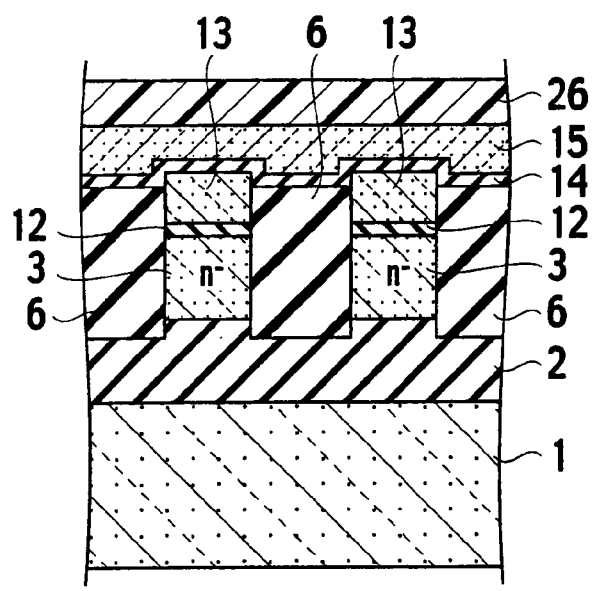
FIG. 42B is a cross-sectional view in the row direction after the process of FIG. 41B showing the method for manufacturing the non-volatile semiconductor memory according to the second embodiment of the present invention.
Figure 43A:
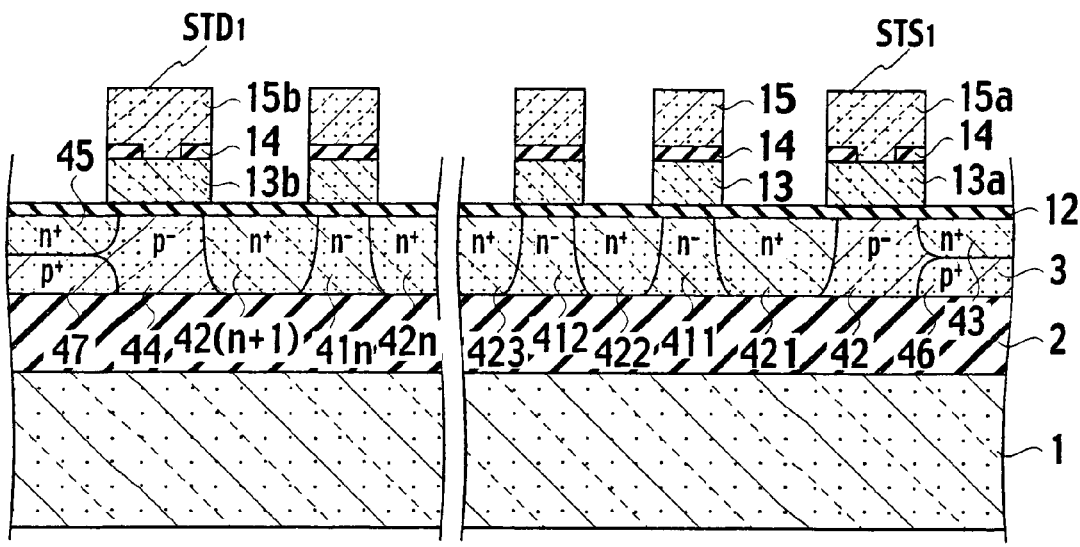
FIG. 43A is a cross-sectional view in the column direction after the process of FIG. 42A showing the method for manufacturing the non-volatile semiconductor memory according to the second embodiment of the present invention.
Figure 43B:
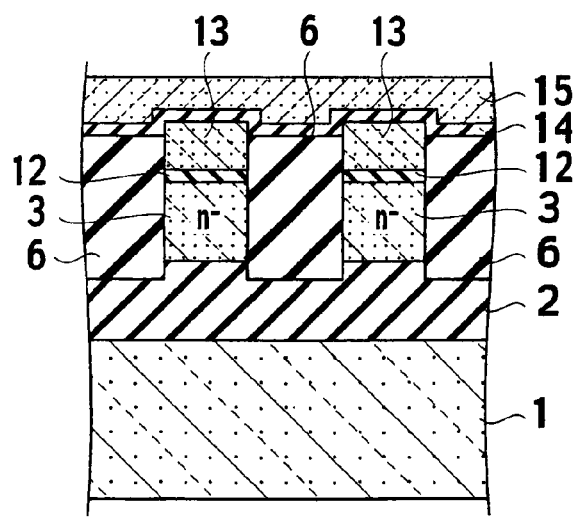
FIG. 43B is a cross-sectional view in the row direction after the process of FIG. 42B showing the method for manufacturing the non-volatile semiconductor memory according to the second embodiment of the present invention.

Subsequently, a resist film 26 is applied and patterned by lithography technology, so as to cover the n⁻-type impurity diffusion layer 41, as shown in FIGS. 42A and 42B. By use of the patterned resist film 26 as a mask, p-type impurity ions such as $^{11}B^+$ or the like are selectively implanted into p⁻-type impurity diffusion layers 40a and Further, n-type impurity ions such as $^{75}As^+$ or the like, are selectively implanted into the p⁻-type impurity diffusion layers 40a and 40b to a depth of, for example, approximately five keV and a density of $1 \times 10^{15}$ cm⁻², so as to implant to a region shallower than that where the p-type impurity ions have been implanted. The resist layer 26 is removed by a resist remover or the like. By thermal processing thereafter, the n-type and p-type impurity ions are activated in the SOI layer 3. Accordingly, as shown in FIGS. 43A and 43B, a p-type channel region 42 and an n⁺-type source region 43 are formed in the SOI layer 3, and then a select gate transistor $STS_1$ of an enhancement mode transistor is formed. Furthermore, a p⁺-type source line contact region 46, which is connected to the channel region 42 of the select gate transistor $STS_1$, is formed under the source region 43 of the select gate transistor $STS_1$. On the other hand, a p-type channel region 44 and an n⁺-type drain region 45 are formed in the SOI layer 3, and accordingly, a select gate transistor $STD_1$ of the enhancement mode is also formed. Still further, a p-type bit line contact region 47, which is connected to the channel region 44 of the select gate transistor $STD_1$, is formed under the drain region 45 of the select gate transistor $STD_1$.

Figure 44A:
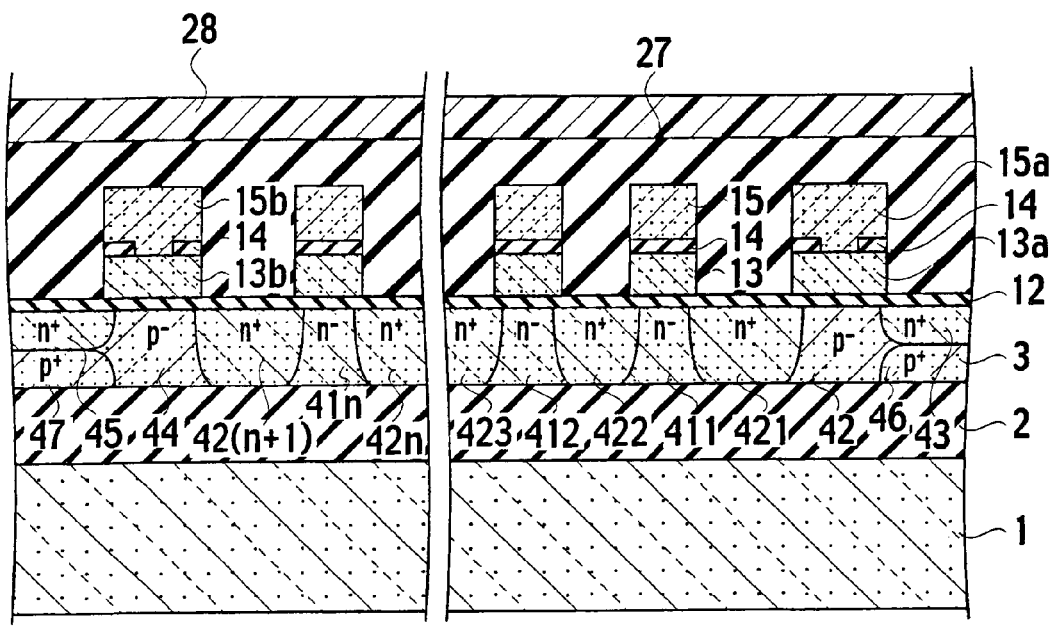
FIG. 44A is a cross-sectional view in the column direction after the process of FIG. 43A showing the method for manufacturing the non-volatile semiconductor memory according to the second embodiment of the present invention.
Figure 44B:
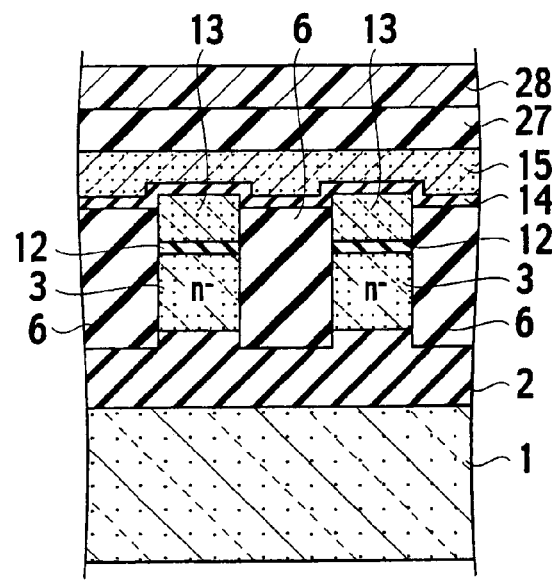
FIG. 44B is a cross-sectional view in the row direction after the process of FIG. 43B showing the method for manufacturing the non-volatile semiconductor memory according to the second embodiment of the present invention.
Figure 45A:
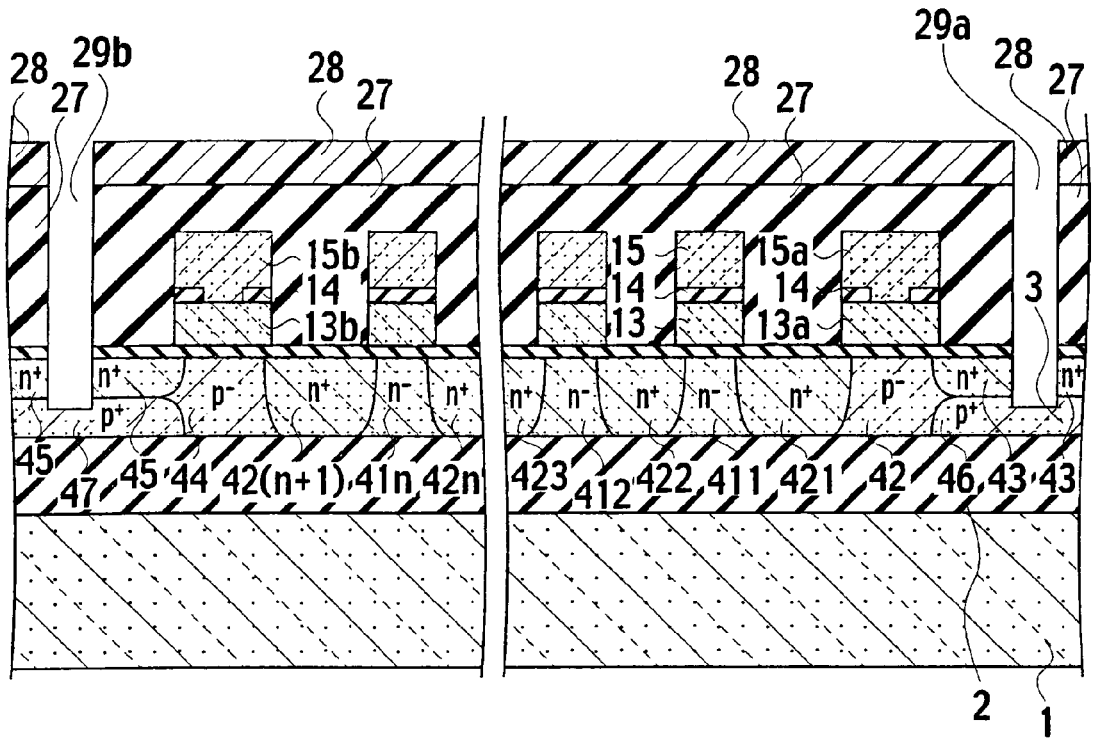
FIG. 45A is a cross-sectional view in the column direction after the process of FIG. 44A showing the method for manufacturing the non-volatile semiconductor memory according to the second embodiment of the present invention.
Figure 45B:
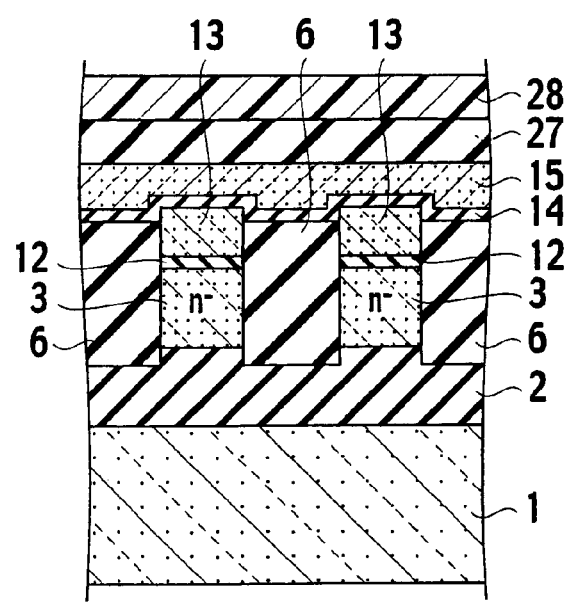
FIG. 45B is a cross-sectional view in the row direction after the process of FIG. 44B showing the method for manufacturing the non-volatile semiconductor memory according to the second embodiment of the present invention.

Subsequently, as shown in FIGS. 44A and 44B, an interlayer insulating film 27 is deposited by CVD or the like and a resist film 28 is coated on the interlayer insulating film 27. Thereafter, the resist film 28 is patterned by lithography technology. As shown in FIGS. 45A and 45B, openings (contact holes) 29a and 29b are formed by RIE and the like using the patterned resist film 28 as a mask. The openings 29a and 29b penetrate the interlayer insulating film 27 and the source region 43 or the drain region 45 and respectively extend to the source line contact region 46 and the bit line contact region 47. Thereafter, a metal film is buried in each of the openings 29a and 29b by CVD or the like to form the source line contact plug 18 and the bit line contact plug 17 so that the source line contact plug 18 and the bit line contact plug 17 are respectively connected to the source contact region 46 and the bit contact region 47. Finally, predetermined interconnects and insulating films are formed and deposited. Accordingly, the non-volatile semiconductor memory shown in FIG. 36 is fabricated.

In accordance with the method for manufacturing the non-volatile semiconductor memory according to the second embodiment of the present invention, the non-volatile semiconductor memory shown in FIG. 36 can be provided.

First Modification of Second Embodiment

Figure 46:
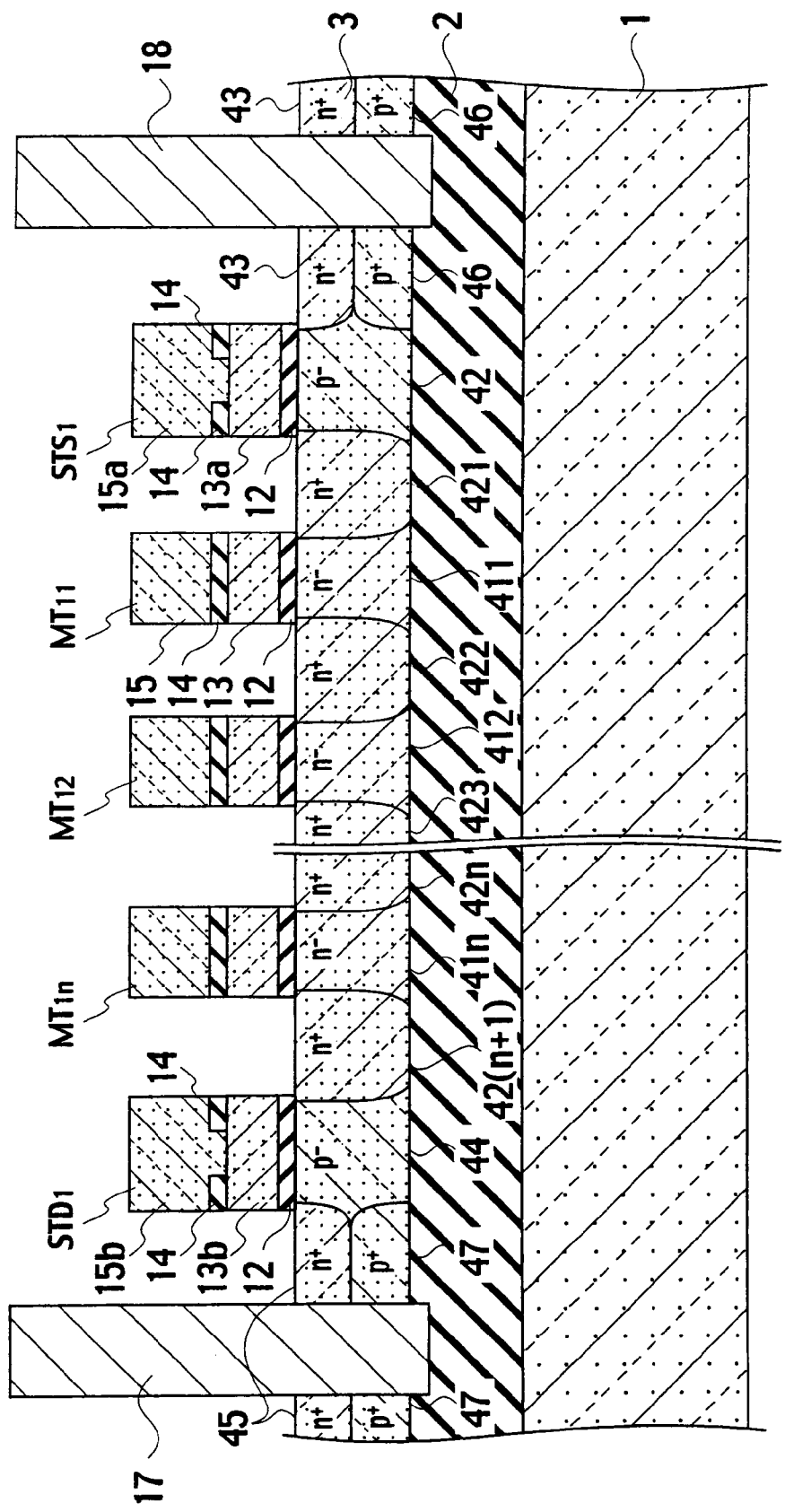
FIG. 46 is a cross-sectional view in a column direction showing an example of a cell array of a non-volatile semiconductor memory according to a first modification of the second embodiment of the present invention.

As shown in FIG. 46, a non-volatile semiconductor memory according to a first modification of the second embodiment of the present invention is different from the non-volatile semiconductor memory shown in FIG. 36. The difference is in an aspect relating to a source line contact plug 18 and a bit line contact plug 17, respectively extending to a buried insulating layer 2 through a source line contact region 46 and a bit line contact plug 47.

When manufacturing the non-volatile semiconductor memory shown in FIG. 46, it suffices that openings (contact holes) are formed in accordance with the procedure shown in FIGS. 45A and 45B so that the holes extend to the buried insulating layer 2 while respectively penetrating the source line contact region 46 and the bit line contact region 47. Thereafter, a source line contact plug 17 and a bit line contact plug 18 are buried in the holes. However, it is necessary that the openings (contact holes) do not extend to a supporting substrate 1 while penetrating the buried insulating layer 2.

Second Modification of Second Embodiment

Figure 47:
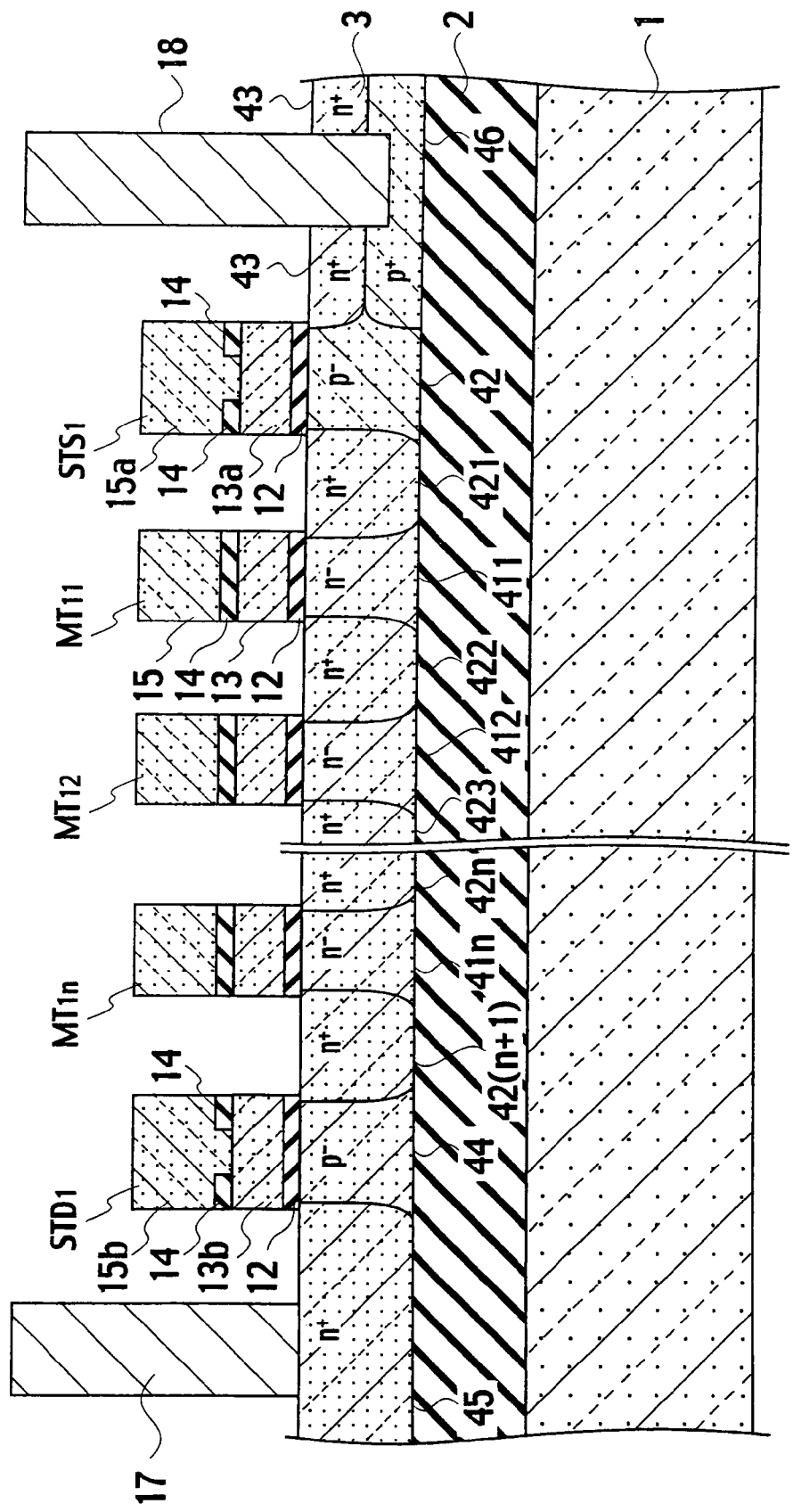
FIG. 47 is a cross-sectional view in a column direction showing an example of a cell array of a non-volatile semiconductor memory according to a second modification of the second embodiment of the present invention.

As shown in FIG. 47, a non-volatile semiconductor memory according to a second modification of the second embodiment of the present invention has a structure in which there is no bit line contact region 47 on a side of a select gate transistor STD, of the non-volatile semiconductor memory shown in FIG. 36. In this case, a source contact region 46 on a select gate transistor $STS_1$ side also serves as a hole supply source. As a result, the same effect as in the case of the non-volatile semiconductor memory shown in FIG. 36 can be obtained.

With respect to a method of manufacturing the non-volatile semiconductor memory shown in FIG. 47, for example, only n-type impurity ions are implanted in the procedure shown in FIGS. 42A and 42B. Thereafter, a resist film is applied and then patterned so that the resist film covers the n⁻-type impurity diffusion layer 41 and the p⁻-type impurity diffusion layer 40b. By using the patterned resist film as a mask, p-type impurity ions may be implanted into only the p⁻-type impurity diffusion layer 40a.

Third Modification of Second Embodiment

Figure 48:
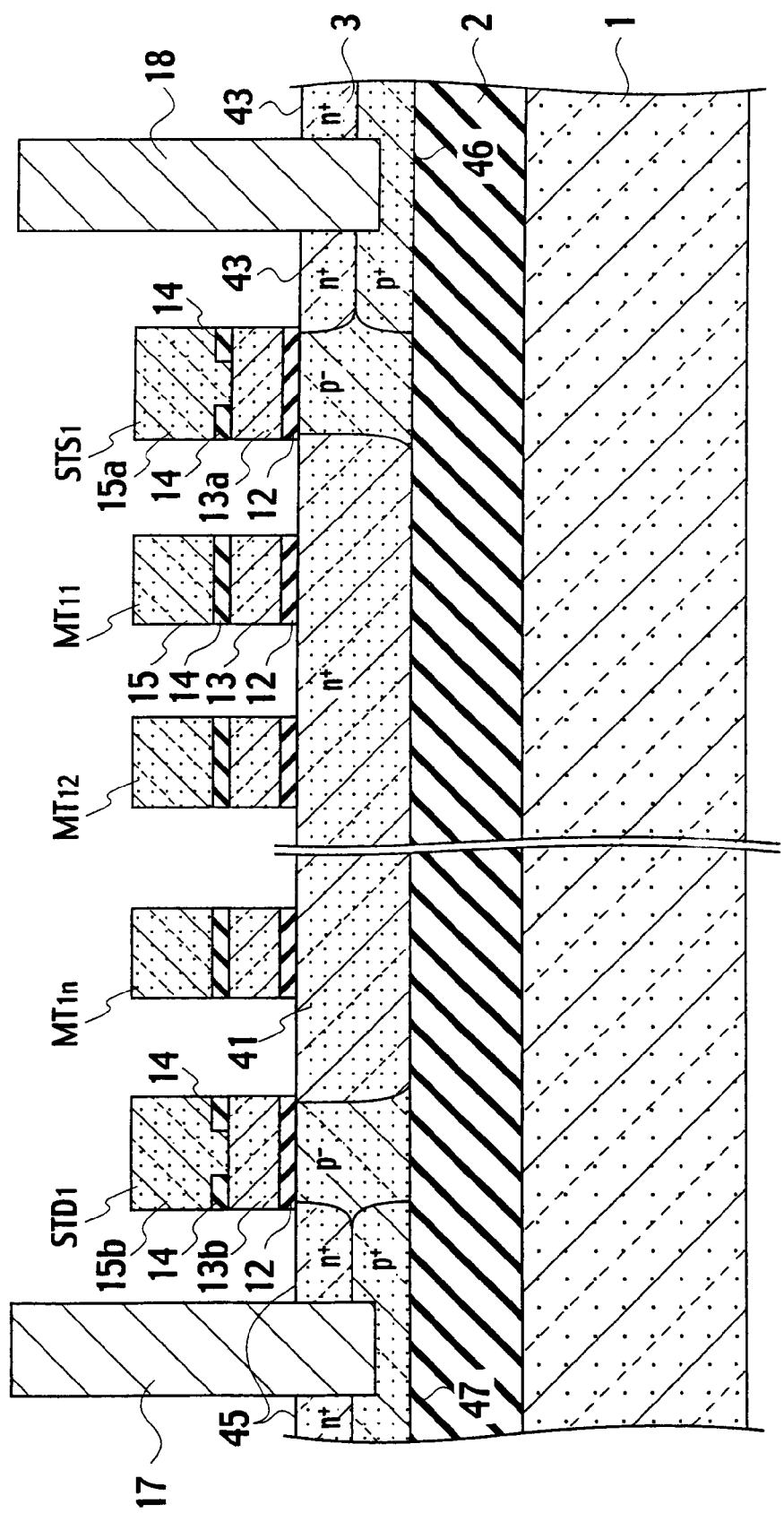
FIG. 48 is a cross-sectional view in a column direction showing an example of a cell array of a non-volatile semiconductor memory according to a third modification of the second embodiment of the present invention.

As shown in FIG. 48, a non-volatile semiconductor memory according to a third modification of the second embodiment of the present invention is different from the non-volatile semiconductor memory shown in FIG. 36. The difference is in that the non-volatile semiconductor memory is provided with n-type impurity diffusion layer 41 in which source, drain and channel regions of memory cell transistors $MT_{11}$ to $MT_{1n}$ are integrated. N-type impurity concentration of the source, drain and channel regions of memory cell transistors $MT_{11}$ to $MT_{1n}$ are substantially the same as each other.

With respect to a method of manufacturing the non-volatile semiconductor memory shown in FIG. 48, it suffices that the ion implantation process in FIGS. 40A and 40B and the thermal processing in FIGS. 41A and 41B are omitted. For this reason, compared with the non-volatile semiconductor memory shown in FIG. 36, the process can be simplified, and the method is suitable for fine processing.

Fourth Modification of Second Embodiment

Figure 49:
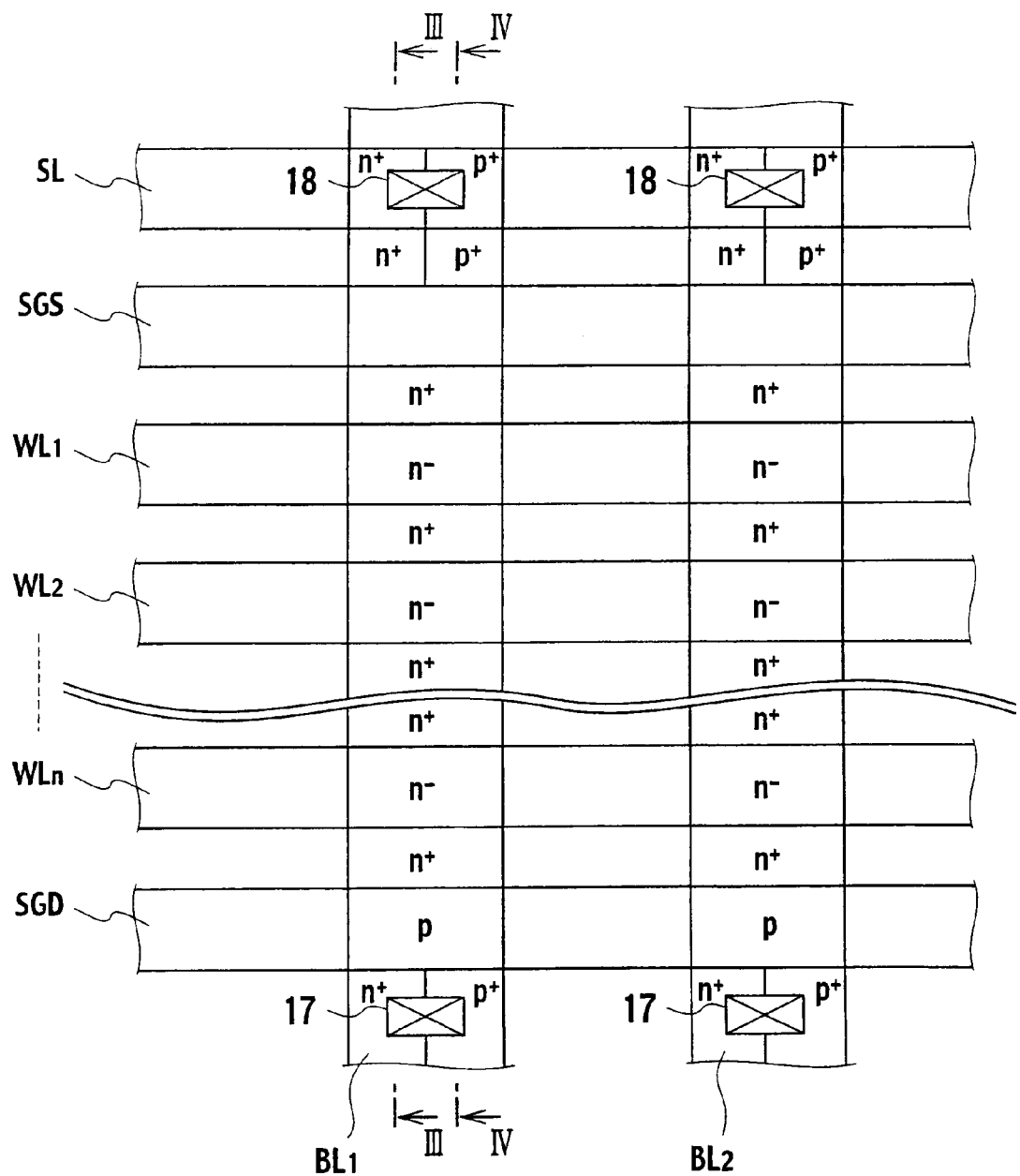
FIG. 49 is a plan view showing an example of a cell array of a non-volatile semiconductor memory according to a fourth modification of the second embodiment of the present invention.
Figure 50:
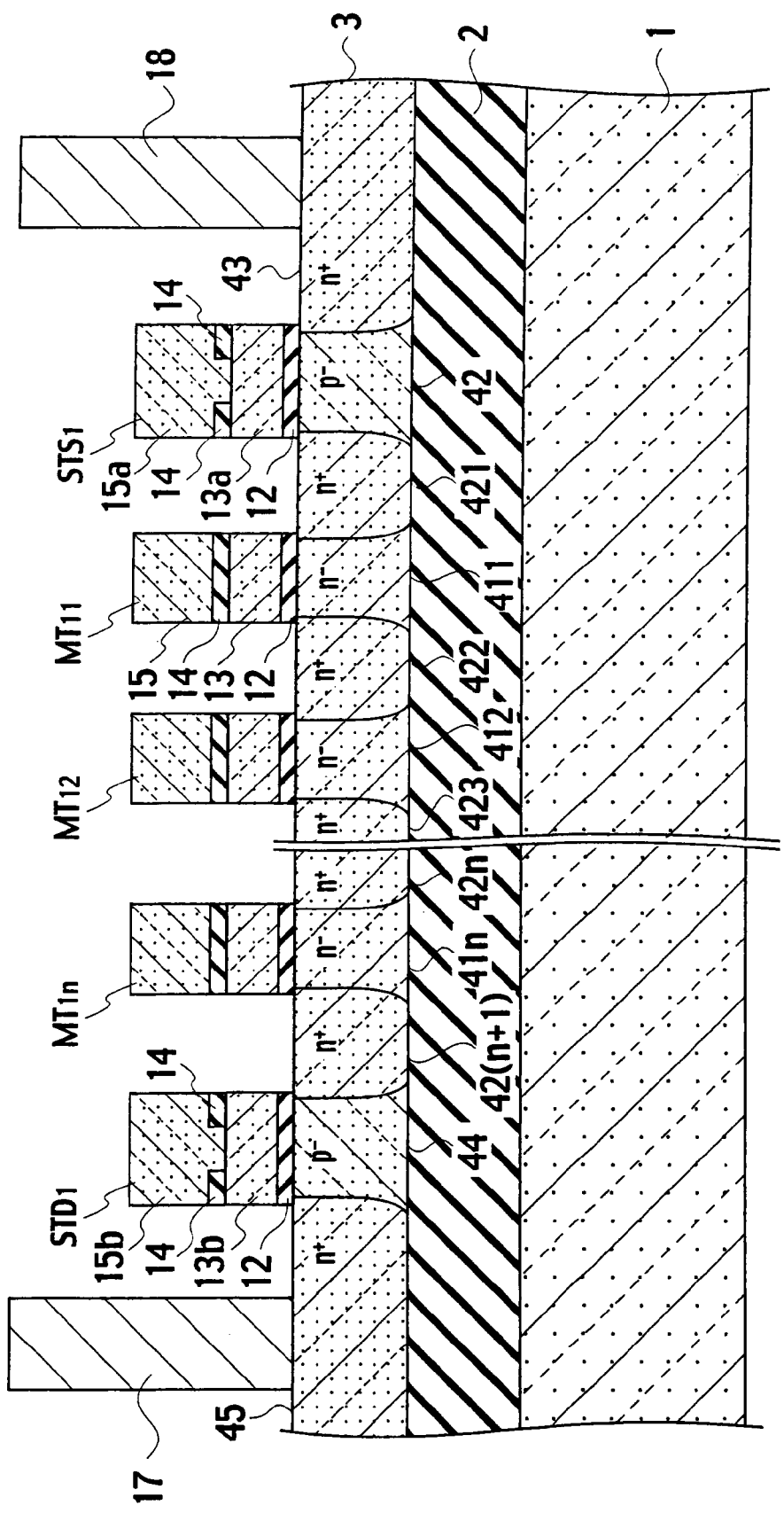
FIG. 50 is a cross-sectional view in a column direction (III-III direction of FIG. 49) showing an example of the cell array of the non-volatile semiconductor memory according to the fourth modification of the second embodiment of the present invention.
Figure 51:
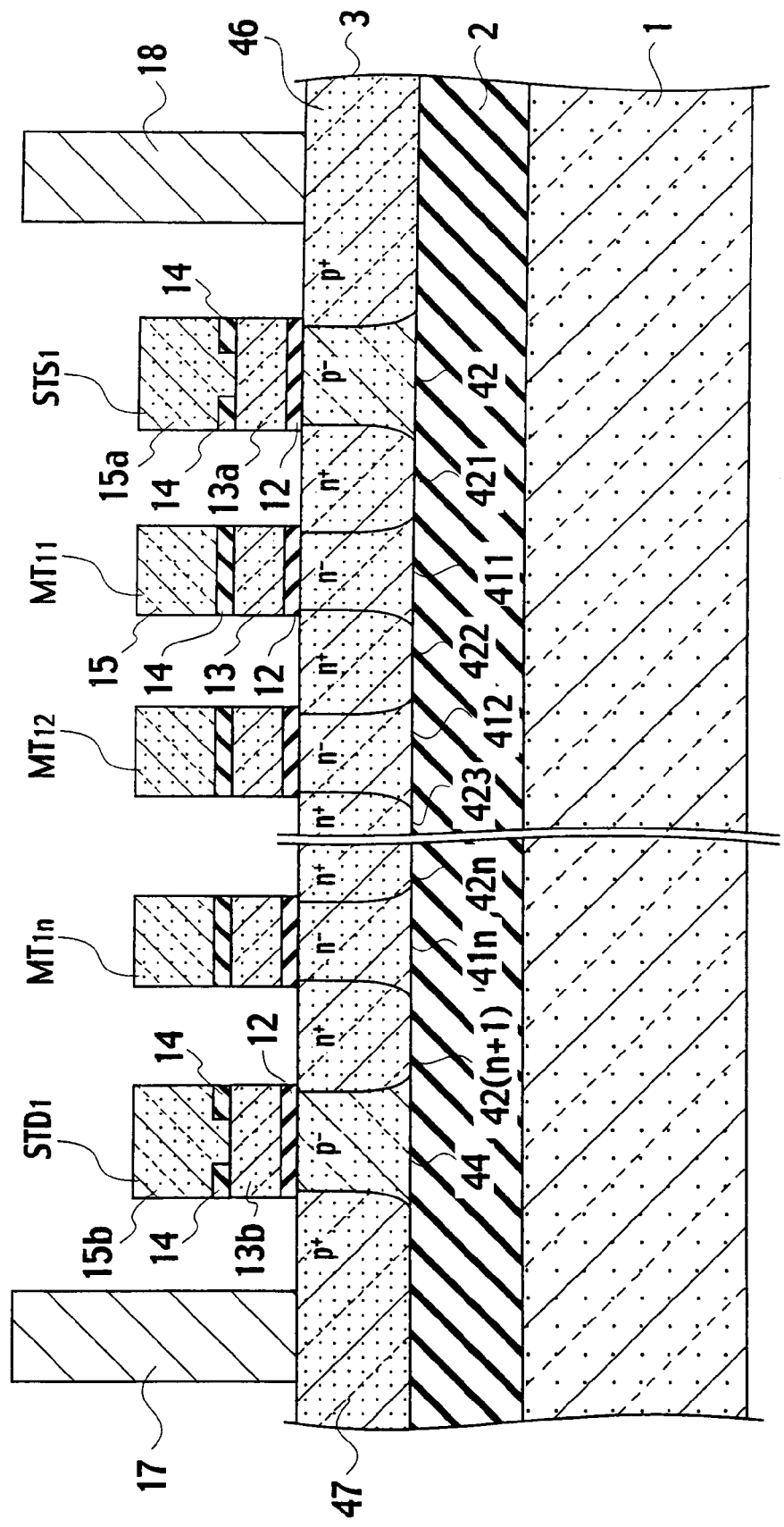
FIG. 51 is another cross-sectional view in the column direction (IV-IV direction of FIG. 49) of the non-volatile semiconductor memory according to the fourth modification of the second embodiment of the present invention.

With respect to a non-volatile semiconductor memory according to a fourth modification of the second embodiment of the present invention, as shown in a plan view in FIG. 49 and cross-sectional views in FIGS. 50 and 51, the cross sectional views are respectively taken along a line III-III and a line IV-IV in the plan view of FIG. 49. A $p^+$-type source line contact region 46 is disposed adjacent to an $n^+$-type source region 43 of the select gate transistor $STS_1$ in a gate width direction. In addition, a $p^+$-type bit line contact region 47 is disposed adjacent to an $n^+$-type drain region 45 of the select gate transistor $STD_1$ in a gate width direction. For this reason, a source line contact plug 18 is in contact with the source region 43 without penetrating and contacts a source line contact region 46. In addition, a bit line contact plug 17 is in contact the drain region 45 without penetrating and contacts the bit line contact region 47.

In a method for manufacturing the non-volatile semiconductor memory shown in FIGS. 49 to 51, in place of the procedure shown in FIGS. 42A and 42B, for example, a resist film is patterned by lithography technology so that the resist film covers a part of an n-type impurity diffusion layer 41 and $p^-$-type impurity diffusion layers 40a and 40b in the gate width direction. With the patterned resist film as a mask, p-type impurity ions, such as $^{11}B^+$, are selectively implanted into an exposed part of the $p^-$-type impurity diffusion layers 40a and 40b at, for example, a depth of approximately ten keV and a density of approximately $1\times10^{15}$ $cm^{-2}$. The resist film is removed by a resist remover or the like.

Further, the resist film is patterned by lithography technology so that the resist film covers a part of an n-type impurity diffusion layer 41 and $p^-$-type impurity diffusion layers 40a and 40b in the gate width direction. In this part, no p-type impurity ions have been implanted. Thereafter, n-type impurity ions, such as $^{75}As^+$ are selectively implanted into an exposed part of the $p^-$-type impurity diffusion layers 40a and 40b at, for example, approximately five keV and $1\times10^{15}$ $cm^{-2}$. The resist film is removed by a resist remover or the like. Subsequently, by thermal treatment, the $n^+$-type source region 43 and the drain region 45 can be formed adjacent to each other in the gate width direction, and the $p^+$-type source line contact region 46 and the bit line contact region 47 can be formed in the same manner.

Fifth Modification of Second Embodiment

A non-volatile semiconductor memory according to a fifth modification of the second embodiment of the present invention is different from the non-volatile semiconductor memory shown in FIG. 36. The difference is that, as shown in FIG. 52, a horizontal level of a surface of a source region 43 of a select gate transistor $STS_1$ is higher than that of a channel region 411 of a memory cell transistor $MT_{11}$.

Figure 52:
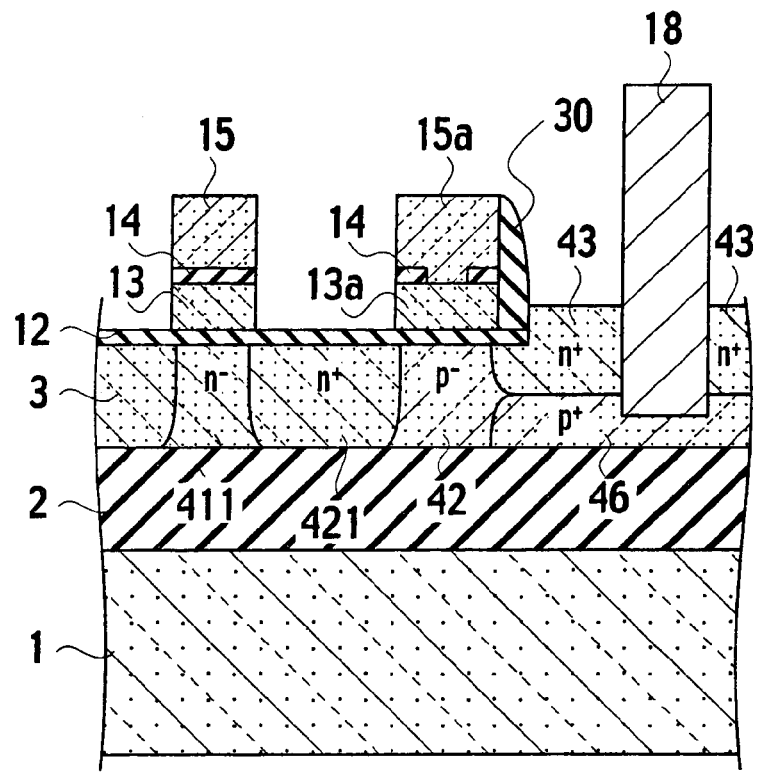
FIG. 52 is a cross-sectional view in a column direction showing an example of a cell array of a non-volatile semiconductor memory according to a fifth modification of the second embodiment of the present invention.

In a method for manufacturing the non-volatile semiconductor memory shown in FIG. 52, after a structure shown in FIGS. 34A and 34B is formed, a side wall 30 is formed on a side of a source line of the select gate transistor $STS_1$ by photolithography technology, CVD, and etching technology. Thereafter, only a gate insulating film 12 on the source region 43 of the select gate transistor $STS_1$ is removed.

Figure 53:
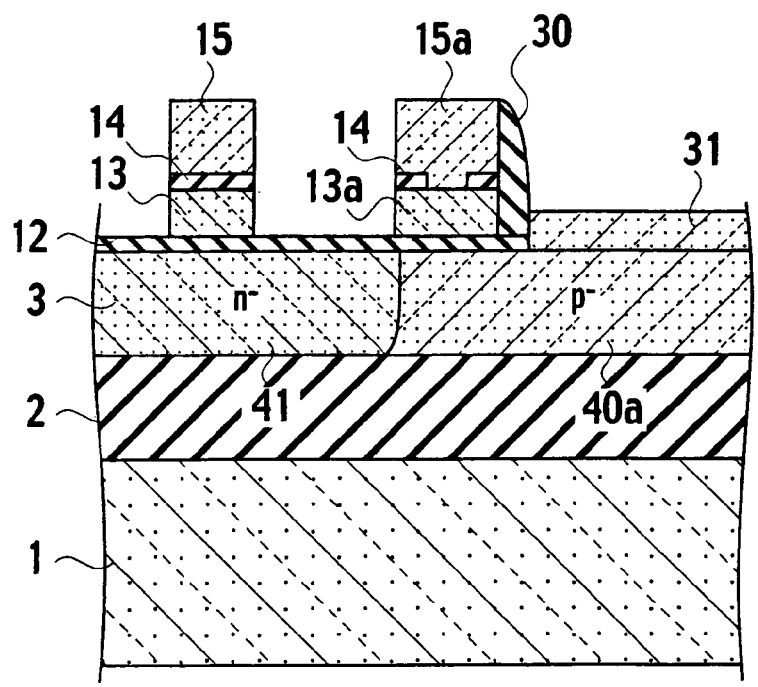
FIG. 53 is a cross-sectional view in the column direction showing an example of a method for manufacturing the non-volatile semiconductor memory according to the fifth modification of the second embodiment of the present invention.

Thereafter, Si is selectively epitaxially grown on an exposed SOI layer 3, to form a semiconductor layer (epitaxial growth layer) 31 having a thickness of, for example, approximately 20 nm, as shown in FIG. 53. Subsequently, by a procedure similar to the procedure shown in FIGS. 42A and 42B, ions of $^{11}B^+$ are implanted at ten keV and $1\times10^{15}$ $cm^{-2}$, and ions of $^{75}As^+$ are implanted at ten keV and $1\times10^{15}$ $cm^{-2}$. Since other steps in the procedure are substantially the same as those in FIGS. 42A and 42B, a redundant description thereof will be omitted. As a result of the procedure, a source region 43 of the select gate transistor $STS_1$ as shown in FIG. 52 is formed.

According to the fifth modification, even when the SOI layer is so thin that ion implantation is difficult, epitaxial growth of the SOI layer complements the thin film of the SOI layer 3. For this reason, a step of ion implantation for forming a source line contact region 46 and a bit line contact region 47 is easier.

Note that, although FIG. 52 shows the select gate transistor $STS_1$ side, it does not matter that a surface of a drain region 45 may also be at a higher elevation than that of a channel region 411 of the memory cell transistor $MT_{11}$ on the select gate transistor $STD_1$ side shown in FIG. 36.

Sixth Modification of Second Embodiment

Figure 54:
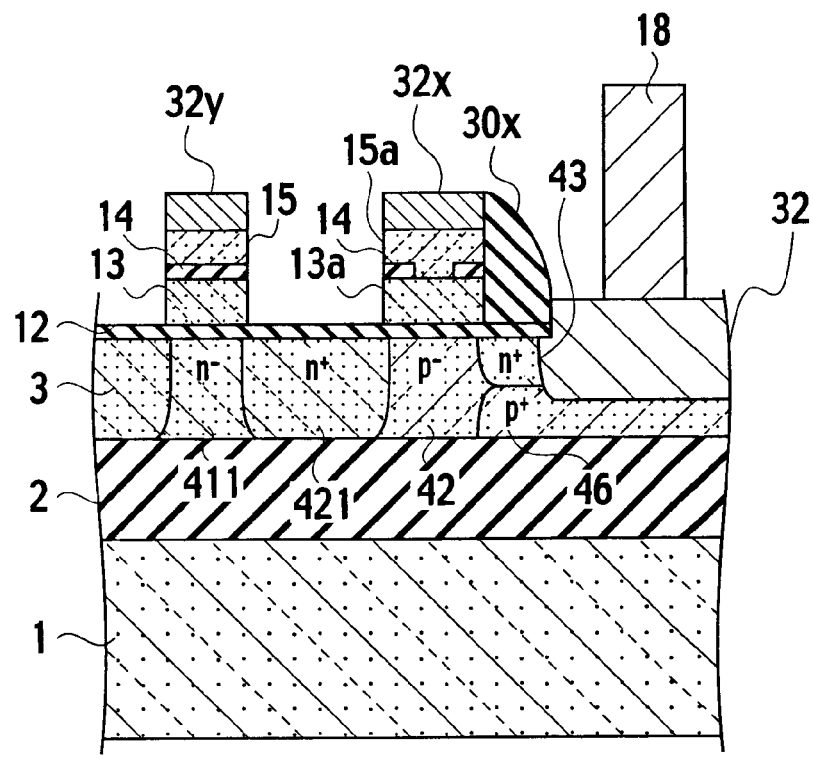
FIG. 54 is a cross-sectional view in a column direction showing an example of a cell array of a non-volatile semiconductor memory according to a sixth modification of the second embodiment of the present invention.

A non-volatile semiconductor memory according to a sixth modification of the second embodiment of the present invention is different from the non-volatile semiconductor memory shown in FIG. 36. The difference is that, as shown in FIG. 54, a source line contact plug 18 does not directly contact a source region 43 and a source line contact region 46 and is electrically connected to the source region 43 and the source line contact region 46 through a silicide region (a silicide electrode) 32. Silicide regions (silicide electrodes) 32x and 32y are provided on a select gate electrode 15a and a control gate electrode 15.

Figure 55:
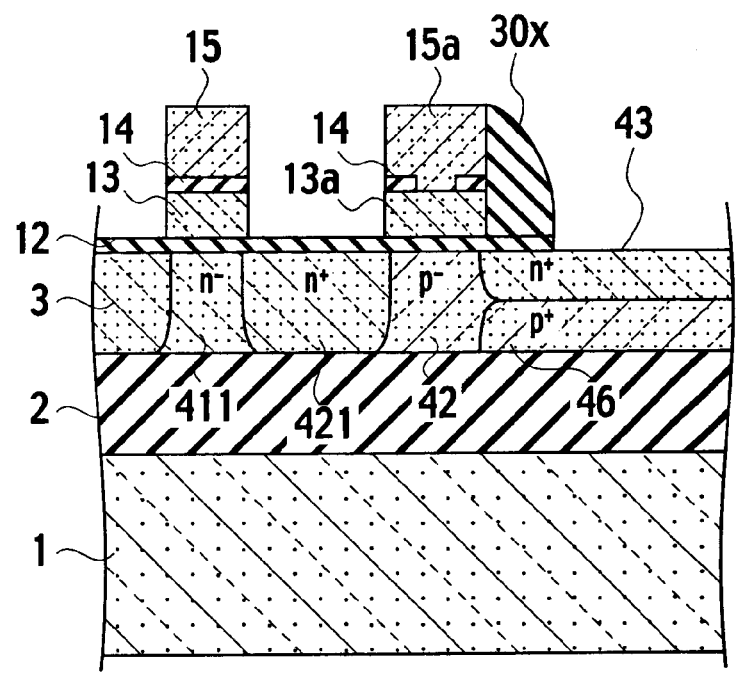
FIG. 55 is a cross-sectional view in the column direction showing an example of a method for manufacturing the non-volatile semiconductor memory according to the sixth modification of the second embodiment of the present invention.
Figure 56:
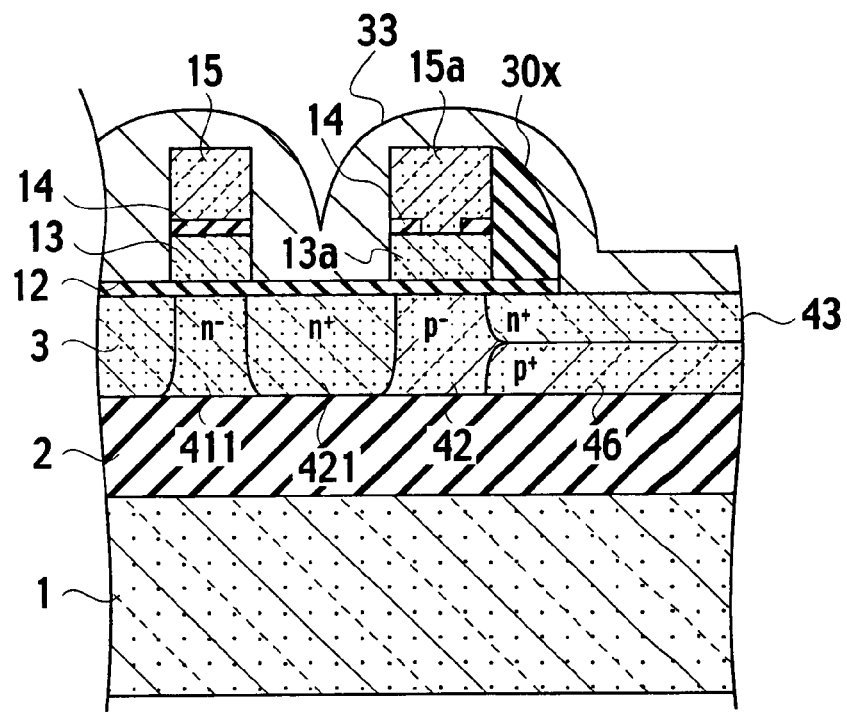
FIG. 56 is a cross-sectional view in the column direction after the process of FIG. 55 showing the method for manufacturing the non-volatile semiconductor memory according to the sixth modification of the sixth embodiment of the present invention.
Figure 57:
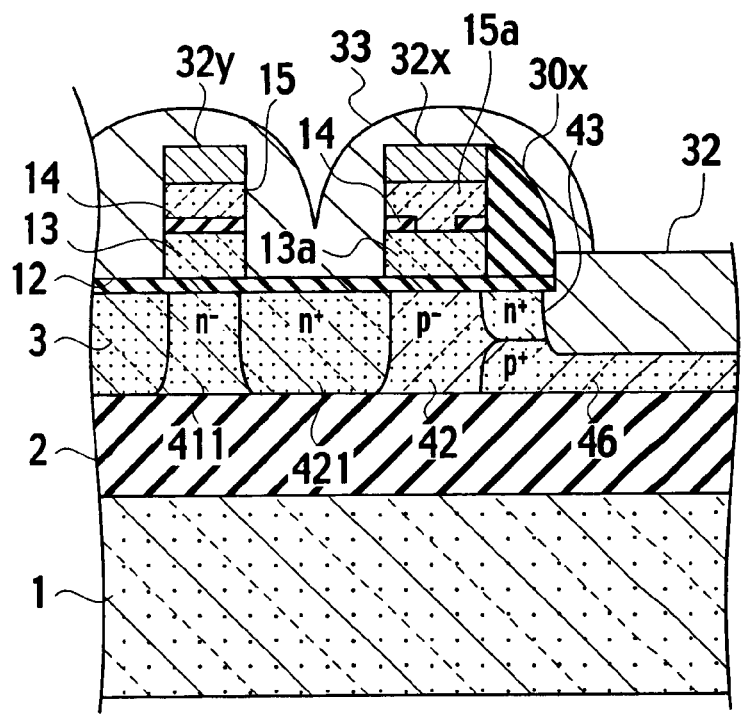
FIG. 57 is a cross-sectional view in the column direction after the process of FIG. 56 showing the method for manufacturing the non-volatile semiconductor memory according to the sixth modification of the sixth embodiment of the present invention.

In a method for manufacturing the non-volatile semiconductor memory shown in FIG. 54, as shown in FIG. 55, after a side wall 30x is formed on selected gate electrodes 13a and 15a of the source region 43 side, a part of a gate insulating film 12 is selectively removed. Subsequently, as shown in FIG. 56, a metal film 33, such as nickel (Ni), is deposited to a thickness of, for example, approximately 15 nm by vacuum vapor deposition or the like. Thereafter, in a salicide process, thermal processing at about 450° C. for about thirty seconds is performed. During the process, Si and Ni of the source region 43 react with each other to be NiSi, and thereby the slicide region (silicide electrode) 32 is formed as shown in FIG. 57. Furthermore, Si and Ni of each of the control gate electrode 15 and the select gate electrode 15a react with each other to be NiSi, and thereby the slicide regions (silicide electrodes) 32x and 32y are formed. Thereafter, only unreacted Ni is selectively removed and the source line contact plug 18 is formed on the silicide region 32. Accordingly, the non-volatile semiconductor memory shown in FIG. 54 is fabricated.

Figure 58:
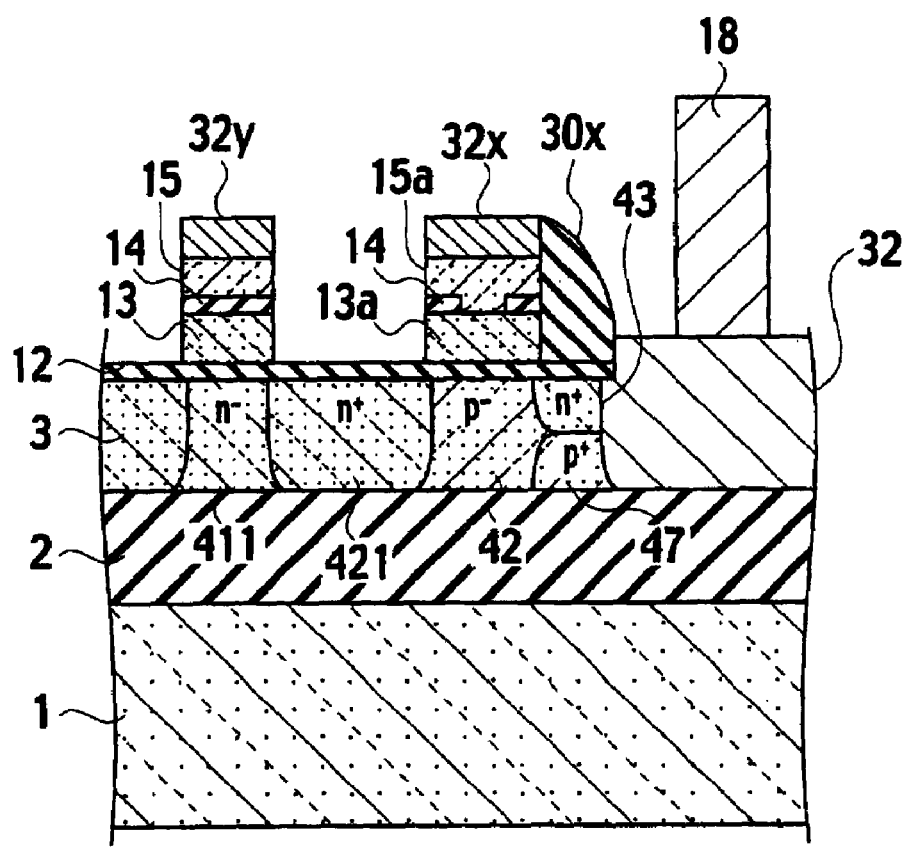
FIG. 58 is a cross-sectional view in the column direction showing another example of the method for manufacturing the non-volatile semiconductor memory according to the sixth modification of the sixth embodiment of the present invention.

Furthermore, as shown in FIG. 58, it does not matter that the silicide region (silicide electrode) 32 extends a buried semiconductor layer 2. In the method for manufacturing the non-volatile semiconductor memory shown in FIG. 58, when the SOI layer 3 has a thickness of 20 nm, for example, the SOI layer 3 becomes entirely silicide if the salicide process is performed by depositing the metal film 33, such as Ni, at a thickness of approximately 20 nm in the procedure shown in FIG. 56. As a result, the non-volatile semiconductor memory shown in FIG. 58 can be achieved.

Note that, although each of FIGS. 54 and 58 show the select gate transistor STS, side, it does not matter that on the select gate transistor $STD_1$ side. Similarly, a bit line contact plug 17 may not directly contact with a drain region 45 and a bit line contact region 47 and may be electrically connected to the drain region 45 and the bit line contact region 47 through a silicide region (a silicide electrode) 32.

Other Embodiments

In the first embodiment of the present invention, for example, an n-type supporting substrate is described. If a p-type supporting substrate is used, it suffices that a substrate voltage $V_{SUB}$, applied to the supporting substrate 1, is less than one V in a reading operation. Note that the operation voltages having been described in the reading, writing and erasing operations are examples, and operation voltages are not particularly limited to that described.

Figure 59:
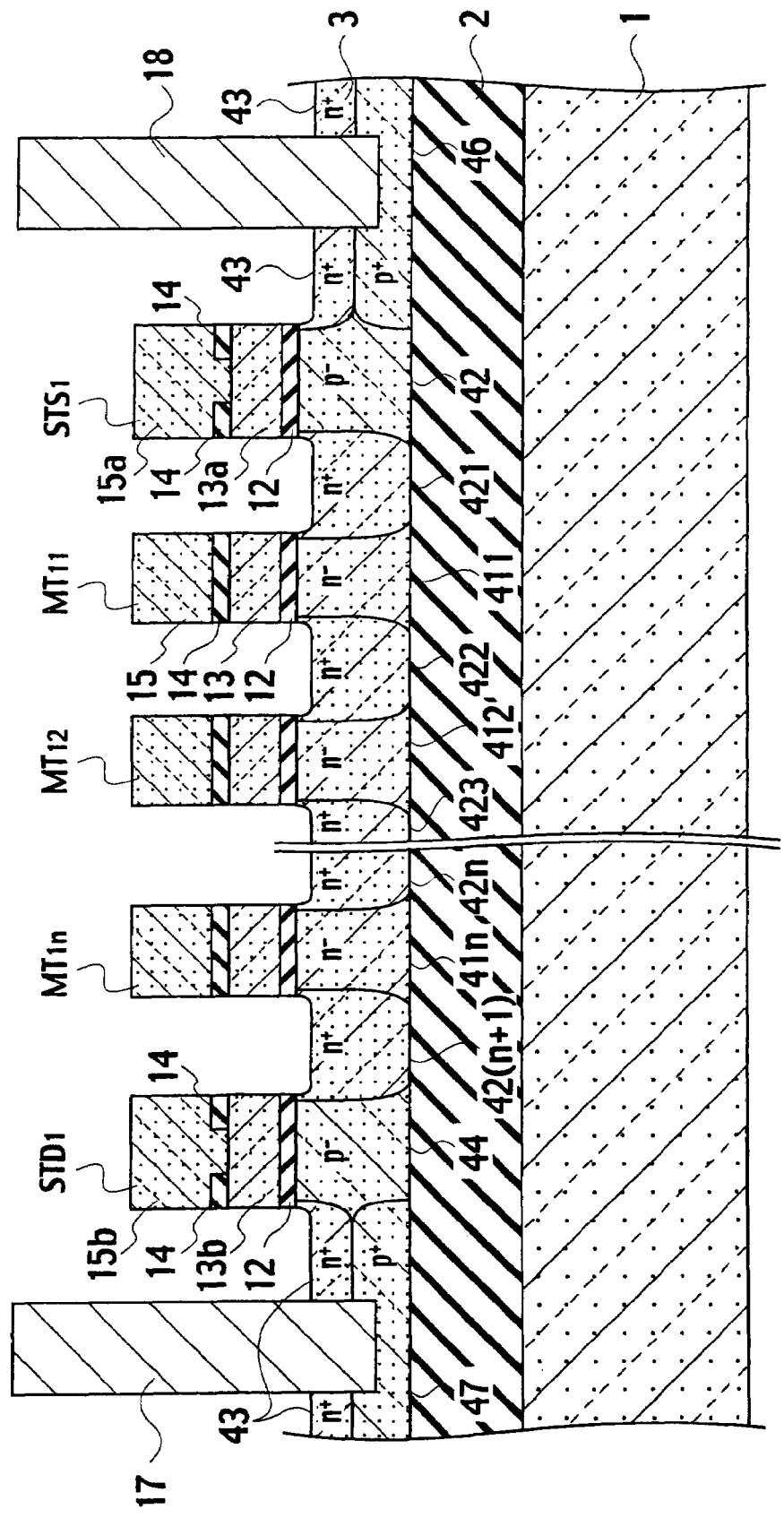
FIG. 59 is a cross-sectional view in a column direction showing an example of a cell array of a non-volatile semiconductor memory according to other embodiment of the present invention.

In addition, with respect to the second embodiment of the present invention, the hole accumulation layers 48a and 48b, as well as the hole inversion layer 49, are shown in FIG. 37. However, it is needless to say that in an opposite conductivity type, electron storage layers and an electron inversion layer are formed. Further, it does not matter that the surface of the SOI layer 3 is also decreased in thickness as shown in FIG. 59.

Furthermore, in the non-volatile semiconductor memory shown in FIG. 36, the impurity concentration of the channel region 44 of the select gate transistor $STD_1$ (for example, approximately $1 \times 10^{18}$ cm$^{-2}$) may be higher than that of the channel region 42 of the select gate transistor $STS_1$ (for example, approximately $1 \times 10^{17}$ cm$^{-3}$). In this case, in the procedure shown in FIGS. 24A and 24B, the memory cell transistor forming regions and the select gate transistors $STS_1$ and $STD_1$ on the SOI layer 3, are respectively masked, and then different ion dose amounts are implanted into the SOI layer 3.

Still further, in the first and second embodiments of the present invention, a description has been provided as an example. In the example, n-type polysilicon is used for the gate electrodes 13 and 15 of the memory cell transistors $MT_{11}$ to $MT_{1n}$ and for the gate electrodes 13a, 15a, 13b and 15b of the select gate transistors $STS_1$ and $STD_1$. Also, each of the memory cell transistors $MT_{11}$ to $MT_{1n}$ operate as a depletion mode FET, and each of the select gate transistors $STS_1$ and $STD_1$ operates as an enhancement mode FET. It is possible to change a material for the gate electrodes 13 and 15 of the memory cell transistors $MT_{11}$ to $MT_{1n}$ and for the gate electrodes 13a, 15a, 13b and 15b of the select gate transistors $STS_1$ and $STD_1$. It is also possible that each of the memory cell transistors $MT_{11}$ to $MT_{1n}$ operates as an FET in a mode other than a depletion mode and each of the select gate transistors $STS_1$ and $STD_1$ operates as an FET in a mode other than an enhancement mode by adjusting a work function of a material of the gate electrodes. In this case, in operations for writing, reading, and simultaneous erasing or the like of memory signals, it is possible to achieve operations similar to those in the example of the embodiments by changing conditions of biases applied to each electrode.

In the first and second embodiments, m×n memory cell transistors $MT_{11}$ to $MT_{1n}$, $MT_{21}$ to $MT_{2n}$, ..., $MT_{m1}$ to $MT_{mn}$ have been explained. However, actually a cell array may be comprised by a plurality of memory cell transistors, memort cells and blocks.

Furthermore, in the first and second embodiments, a binary NAND EEPROM is described. However, it is also possible to adapt a multi-level storage, for example, a three-level or more storage in the NAND EEPROM.

Various modifications will become possible for those skilled in the art after receiving the teachings of the present disclosure without departing from the scope thereof.

What is claimed is:

1. A method for controlling a non-volatile semiconductor memory comprising a plurality of cell columns arranged in a row direction, each of the cell columns comprising an arrangement of memory cell transistors, a first select gate transistor arranged adjacent to an end of the arrangement, and a second select gate transistor arranged adjacent to another end of the arrangement, each of memory cell transistors comprising: a source region in contact with a buried insulating layer on a supporting substrate; a drain region in contact with the buried insulating layer and having a conductivity type that is the same as the source region; and a channel region provided between the source region and the drain region so as to contact the buried insulating layer and having the conductivity type that is the same as the source region, the method comprising:

applying a precharge voltage to a selected bit line connected to a selected cell column in a reading operation;

applying a select voltage to a selected word line shared by each one of selected memory cell transistors of the cell columns in the reading operation;

applying a non-select voltage to a non-selected word line shared by non-selected memory cells of the cell columns in the reading operation; and if the channel region has n-type, applying a substrate voltage less than 0 V or, if the channel region has p-type, applying another substrate voltage more than 0V, to the supporting substrate of the first and second select gate transistors, the supporting substrate of the selected cell column during the reading operation.

2. The method of claim 1, further comprising:

trimming the substrate voltage applied to the supporting substrate so as to decrease the substrate voltage when the read data is in an erase state if the channel region has n-type, or so as to increase the substrate voltage when the read data is in a write state if the channel region has n-type; or trimming the substrate voltage applied to the supporting substrate so as to increase the substrate voltage when the read data is in the erase state if the channel region has p-type, or so as to decrease the substrate voltage when the read data is in the write state if the channel region has p-type.

3. The method of claim 2, further comprising:
rereading the data from the memory cell transistors by applying the decreased substrate voltage to the supporting substrate, when the read data is in the erase state, if the channel region has n-type; or
rereading the data from the memory cell transistors by applying the increased substrate voltage to the supporting substrate, when the read data is in the erase state, if the channel region has p-type.

4. The method of claim 2, further comprising:
rereading the data from the memory cell transistors by applying the increased substrate voltage to the supporting substrate, when the read data is in the write state, if the channel region has n-type; or
rereading the data from the memory cell transistors by applying the decreased substrate voltage to the supporting substrate, when the read data is in the write state, if the channel region has p-type.

5. A method for controlling a non-volatile semiconductor memory comprising a plurality of memory cell transistors and first and second select gate transistors coupled with both ends of an arrangement of the plurality of memory cell transistors, each of the plurality of memory cell transistors and first and second select gate transistors comprising a channel region in contact with a buried insulating layer provided on a supporting substrate, the method comprising:
applying a voltage to a plurality of select gate lines respectively connected to the first and second select gate transistors, that is higher than a voltage applied to a plurality of word lines respectively connected to the plurality of memory cell transistors and applying a voltage to a bit line and a source line respectively connected to the first and second select gate transistors, respectively, that is higher than the voltage applied to the select gate lines during an erasing operation, if the channel regions of the first and second select gate transistors have p-type; or
applying a voltage to the plurality of select gate lines that is lower than a voltage applied to the word lines and applying a voltage to the bit line and source line, respectively, that is lower than the voltage applied to the select gate lines during the erasing operation, if the channel regions of the first and second select gate transistors have n-type.

6. A method for controlling a non-volatile semiconductor memory comprising a plurality of memory cell transistors, each of the plurality of memory cell transistors comprising a channel region in contact with a buried insulating layer provided on a supporting substrate, the method comprising:
applying a voltage to a bit line and a source line electrically connected to the plurality of memory cell transistors, respectively, that is higher than a voltage applied to a plurality of word lines respectively connected to the plurality of memory cell transistors and applying a voltage to the supporting substrate that is higher than the voltage applied to the bit line and source line during an erasing operation, if the channel regions of the plurality of memory cell transistors have n-type; or
applying a voltage to the bit line and source line that is lower than a voltage applied to the word lines and applying a voltage to the supporting substrate that is lower than the voltage applied to the bit line and source line during the erasing operation, if the channel regions of the plurality of memory cell transistors have p-type.

* * * * *